(12) United States Patent
Lim et al.

(10) Patent No.: US 9,589,964 B1
(45) Date of Patent: Mar. 7, 2017

(54) METHODS OF FABRICATING SEMICONDUCTOR DEVICES

(71) Applicants: Seokhyun Lim, Seoul (KR); Hyun-Chul Yoon, Seongnam-si (KR); Younghan Kim, Seoul (KR); Jin Il Oh, Hwaseong-si (KR); Soonwon Hwang, Seoul (KR)

(72) Inventors: Seokhyun Lim, Seoul (KR); Hyun-Chul Yoon, Seongnam-si (KR); Younghan Kim, Seoul (KR); Jin Il Oh, Hwaseong-si (KR); Soonwon Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/748,593

(22) Filed: Jun. 24, 2015

(51) Int. Cl.
*H01L 27/108* (2006.01)

(52) U.S. Cl.
CPC .............. *H01L 27/10852* (2013.01)

(58) Field of Classification Search
None
See application file for complete search history.

(56) References Cited

U.S. PATENT DOCUMENTS

| | | | |
|---|---|---|---|
| 6,835,662 B1 * | 12/2004 | Erhardt | H01L 21/0337 257/E21.038 |
| 7,935,477 B2 | 5/2011 | Hsu et al. | |
| 8,334,211 B2 | 12/2012 | Kewley | |
| 8,598,632 B2 | 12/2013 | Tran et al. | |
| 2009/0117742 A1 | 5/2009 | Jung | |
| 2011/0065280 A1 | 3/2011 | Nakajima et al. | |
| 2012/0190206 A1 | 7/2012 | Yatsuda et al. | |
| 2013/0023120 A1 | 1/2013 | Yaegashi et al. | |
| 2014/0374809 A1 | 12/2014 | Park et al. | |

FOREIGN PATENT DOCUMENTS

| | | |
|---|---|---|
| KR | 1020100044030 | 4/2010 |
| KR | 1020100078716 | 7/2010 |
| KR | 1020130049510 | 5/2013 |

* cited by examiner

*Primary Examiner* — Angel Roman
*Assistant Examiner* — Kevin Quinto
(74) *Attorney, Agent, or Firm* — Myers Bigel, P.A.

(57) ABSTRACT

A method of fabricating a semiconductor device with conductive patterns comprises sequentially forming an etch-target layer and a middle mold layer on a substrate, forming a first upper mold pattern and a second upper mold pattern on the middle mold layer to have top surfaces at different levels, etching the middle mold layer using the first and second upper mold patterns as an etch mask to form first and second middle mold patterns, respectively, forming a third middle mold pattern between the first and second middle mold patterns, and etching the etch-target layer using the first to third middle mold patterns as an etch mask to form conductive patterns.

17 Claims, 48 Drawing Sheets

METHODS OF FABRICATING SEMICONDUCTOR DEVICES

BACKGROUND

As semiconductor devices become more highly integrated, there is an increased demand for capacitors that provide higher amounts of capacitance per unit area. The capacitance of a capacitor may be proportional to a surface area of an electrode thereof and to a dielectric constant of a dielectric film included in the capacitor, and may be inversely proportional to an equivalent oxide thickness of the dielectric film. Thus, the capacitance of a capacitor can be increased by, for example, forming a three dimensional electrode to increase a surface area thereof, decreasing an equivalent oxide thickness of the dielectric film of the capacitor, or using a dielectric film that has a high dielectric constant.

The electrode surface area can be increased by increasing a height of a bottom electrode (or a storage electrode) of the capacitor, by increasing an effective surface area of the bottom electrode (for example, using a hemi-spherical grain), or by forming a cylindrical bottom electrode that has inner and outer side surfaces that both contribute to the surface area of the electrode. A dielectric material having a high dielectric constant, such as metal oxides (e.g., $TiO_2$ and $Ta_2O_5$) or Perovskite ferroelectric materials (e.g., PZT (PbZrTiO_3$) or BST ($BaSrTiO_3$)), may be used as the dielectric film of the capacitor.

SUMMARY

Example embodiments of the inventive concepts provide methods of fabricating semiconductor devices that have dimensions that are smaller than a limitation of a photolithography or exposure process.

According to example embodiments of the inventive concepts, a method of fabricating a semiconductor device may include sequentially forming an etch-target layer and a middle mold layer on a substrate, forming a first upper mold pattern on the middle mold layer that has a top surface that is a first height above a bottom surface of the substrate, forming a second upper mold pattern on the middle mold layer that has a top surface that is a second height above the bottom surface of the substrate that is different from the first height, etching the middle mold layer using the first and second upper mold patterns as an etch mask to form respective first and second middle mold patterns, forming a third middle mold pattern between the first and second middle mold patterns, and etching the etch-target layer using the first to third middle mold patterns as an etch mask to form conductive patterns.

In example embodiments, the first and second middle mold patterns may have respective top surfaces that are at substantially the same height above the bottom surface of the substrate.

In example embodiments, forming the first upper mold pattern and the second upper mold pattern may include forming an upper mold layer on the middle mold layer, forming a first photoresist pattern on the upper mold layer, etching the upper mold layer using the first photoresist pattern as an etch mask to form the first upper mold pattern, forming an additional mold layer to cover the first upper mold pattern, forming a second photoresist pattern on the additional mold layer, etching the additional mold layer using the second photoresist pattern as an etch mask to form the second upper mold pattern.

In example embodiments, the first photoresist pattern may include a plurality of first photoresist patterns, the first upper mold pattern may be formed to include a plurality of first upper mold patterns, the second photoresist pattern may be formed to include a plurality of second photoresist patterns, the second upper mold pattern may be formed to include a plurality of second upper mold patterns, and when viewed in plan view, the plurality of first upper mold patterns are spaced apart from the plurality of second upper mold patterns.

In example embodiments, the first upper mold pattern may comprise a plurality of first upper mold patterns, and the second upper mold pattern may comprise a plurality of second upper mold patterns. the first and second upper mold patterns may be arranged in a first direction in first, second, and third rows so that the first and second upper mold patterns are alternatingly arranged in each of the first to third rows, the first to third rows of first and second upper mold patterns may be spaced apart from each other in a second direction that crosses the first direction, and he first upper mold patterns in the first and third rows define first columns that extend in the first direction and the second upper mold patterns in the first and third rows define second columns that extend in the first direction, and the first and second upper mold patterns in the second row are positioned between the first columns and the second columns.

In example embodiments, each of the first middle mold patterns may include a plurality of first middle mold patterns and each of the second middle mold patterns comprises a plurality of second middle mold patterns, and when viewed in plan view, the first and second middle mold patterns may be arranged to form a polygonal honeycomb structure, and the third middle mold pattern may be positioned at a center of the polygonal honeycomb structure, when viewed in plan view.

In example embodiments, the forming of the third middle mold pattern may include conformally forming a spacer layer on the first and second middle mold patterns that defines a recess region between the first and second middle mold patterns, and forming the third middle mold pattern in the recess region.

In example embodiments, forming the third middle mold pattern may further include removing the spacer layer other than a portion of the spacer layer that is covered by the third middle mold pattern.

In example embodiments, the method may further include forming a lower mold layer that is interposed between the etch-target layer and the middle mold layer. In such embodiments, forming the conductive patterns may include etching the lower mold layer using the first, second, and third middle mold patterns as an etch mask to form respective first, second, and third lower mold patterns, and then etching the etch-target layer using the first, second, and third lower mold patterns as an etch mask to form conductive patterns.

In example embodiments, before the forming of the etch-target layer, the method may further include forming a device isolation layer on the substrate to define an active region, forming a gate line on the substrate that crosses the active region, and forming a first doped region and a second doped region in the active region on opposite sides of the gate line.

In example embodiments, before forming the etch-target layer, the method may further comprise forming a device isolation layer on the substrate to define an active region, forming a pair of the gate lines that cross the active region, forming a first doped region in the active region between the pair of gate lines, and forming a pair of second doped regions in the active region on opposite sides of the pair of gate lines, where the first and second upper mold patterns overlap respective ones of the second doped regions when viewed in a plan view.

In example embodiments, the second doped region may include a pair of doped regions. The method further may include, before the forming of the etch-target layer: forming an interlayer insulating layer on the active region, and forming first and second buried contacts that are electrically connected to the respective ones of the pair of second doped region through the interlayer insulating layer. The conductive patterns may comprise first and second conductive patterns that are in contact with the respective first and second buried contacts. The method further may include after the forming of the conductive patterns: forming a dielectric layer on the conductive patterns; and forming a top electrode on the dielectric layer.

In example embodiments, before forming the etch-target layer, the method may further include forming an interlayer insulating layer on the active region, and forming a buried contact that is electrically connected to the second doped region through the interlayer insulating layer. At least one of the conductive patterns may be electrically connected to the buried contact, a dielectric layer may be provided on the conductive patterns, and a top electrode may be provided on the dielectric layer.

According to example embodiments of the inventive concepts, a method of fabricating a semiconductor device may include sequentially forming an etch-target layer and a middle mold layer on a substrate having a cell region and a peripheral circuit region, forming a first upper mold pattern and a second upper mold pattern on the middle mold layer in the cell region, and forming a peripheral upper mold pattern on the middle mold layer in the peripheral circuit region, the first, second, and peripheral upper mold patterns having top surfaces positioned at different heights above a bottom surface of the substrate, etching the middle mold layer using the first, second, and peripheral upper mold patterns as an etch mask to form a first middle mold pattern, a second middle mold pattern, and a peripheral middle mold pattern, forming a third middle mold pattern between the first and second middle mold patterns, and etching the etch-target layer using the first, second, third, and peripheral middle mold patterns as an etch mask to form conductive patterns.

In example embodiments, the first and second middle mold patterns may have top surfaces that are at substantially the same height above the bottom surface of the substrate as a top surface of the peripheral middle mold pattern.

In example embodiments, the first upper mold pattern may be adjacent the peripheral circuit region, the first and second upper mold patterns may be formed by respective first and second photolithography processes, and an additional mold pattern may be formed on the first upper mold pattern prior to formation of the second upper mold pattern.

In example embodiments, the additional mold pattern may be formed to have a thickness that allows the top surface of the first upper mold pattern to be positioned at a greater height above the bottom surface of the substrate than top surfaces of the second and peripheral upper mold patterns.

In example embodiments, forming the first upper mold pattern and the peripheral upper mold pattern may include forming an upper mold layer on the middle mold layer, forming first photoresist patterns on the upper mold layer, and etching the upper mold layer using the first photoresist patterns as an etch mask to form the first upper mold pattern and the peripheral upper mold pattern at the same time, and forming the second upper mold pattern may include forming an additional mold layer to cover the first upper mold pattern, forming a second photoresist pattern on the additional mold layer, etching the additional mold layer using the second photoresist pattern as an etch mask to form the second upper mold pattern.

In example embodiments, before the forming of the etch-target layer, the method may further include forming an interlayer insulating layer on the substrate, and forming a buried contact that is electrically connected to the substrate through the interlayer insulating layer. At least one of the conductive patterns may be in electrical contact with the buried contact.

In example embodiments, before forming the etch-target layer, the method may further include forming an interlayer insulating layer to cover the substrate, and forming a buried contact that is electrically connected to the substrate through the interlayer insulating layer. At least one of the conductive patterns may be electrically connected to the buried contact. The method further may include after the forming of the conductive patterns: forming a dielectric layer on the conductive patterns; and forming a top electrode on the dielectric layer.

According to example embodiments of the inventive concepts, a method of fabricating a semiconductor device includes forming a middle mold layer on a substrate, forming a plurality of first upper mold patterns on the middle mold layer, the first upper mold patterns each having a top surface that is a first height above a bottom surface of the substrate, and the first upper mold patterns extending in a zigzag pattern in a first direction that is parallel to the bottom surface of the substrate, forming a plurality of second upper mold patterns on the middle mold layer, the second upper mold patterns each having a top surface that is a second height above the bottom surface of the substrate, the second height being different from the first height, and the second upper mold patterns extending in a zigzag pattern in the first direction, and etching the middle mold layer using the first and second upper mold patterns as an etch mask to form respective first and second middle mold patterns.

In example embodiments, the method may further include forming a third middle mold pattern between the first and second middle mold patterns, and etching an etch-target layer using the first to third middle mold patterns as an etch mask to form conductive patterns.

In example embodiments, the first through third of the first upper mold patterns and the first through third of the second upper mold patterns may form a polygonal honeycomb structure when viewed in plan view.

In example embodiments, the third middle mold pattern may be positioned at a center of the polygonal honeycomb structure, when viewed in plan view.

In example embodiments, the first and second middle mold patterns may have top surfaces positioned at substantially the same height above the bottom surface of the substrate.

In example embodiments, forming the plurality of first upper mold patterns and the plurality of second upper mold patterns may comprise forming an upper mold layer on the middle mold layer, forming a plurality of first photoresist patterns on the upper mold layer, etching the upper mold layer using the first photoresist patterns as an etch mask to form the first upper mold patterns, forming an additional mold layer to cover the first upper mold patterns, forming a plurality of second photoresist patterns on the additional mold layer, and etching the additional mold layer using the second photoresist patterns as an etch mask to form the second upper mold patterns.

BRIEF DESCRIPTION OF THE DRAWINGS

Example embodiments will be more clearly understood from the following detailed description taken in conjunction with the accompanying drawings. The accompanying drawings represent non-limiting, example embodiments as described herein.

FIGS. 1A through 9A are plan views illustrating a method of fabricating a semiconductor device according to example embodiments of the inventive concepts.

FIGS. 1B through 9B are sectional views taken along lines I-I' of FIGS. 1A through 9A, respectively.

FIGS. 11A through 20A are plan views illustrating a method of fabricating a semiconductor device according to further example embodiments of the inventive concepts.

FIGS. 11B through 20B are sectional views taken along lines I-I' of FIGS. 11A through 20A, respectively.

FIGS. 21 and 22A through 24A are plan views illustrating a method of fabricating a semiconductor device according to still further example embodiments of the inventive concepts.

FIGS. 22B through 24B are sectional views taken along lines I-I' of FIGS. 22A through 24A, respectively.

Figure 1A:
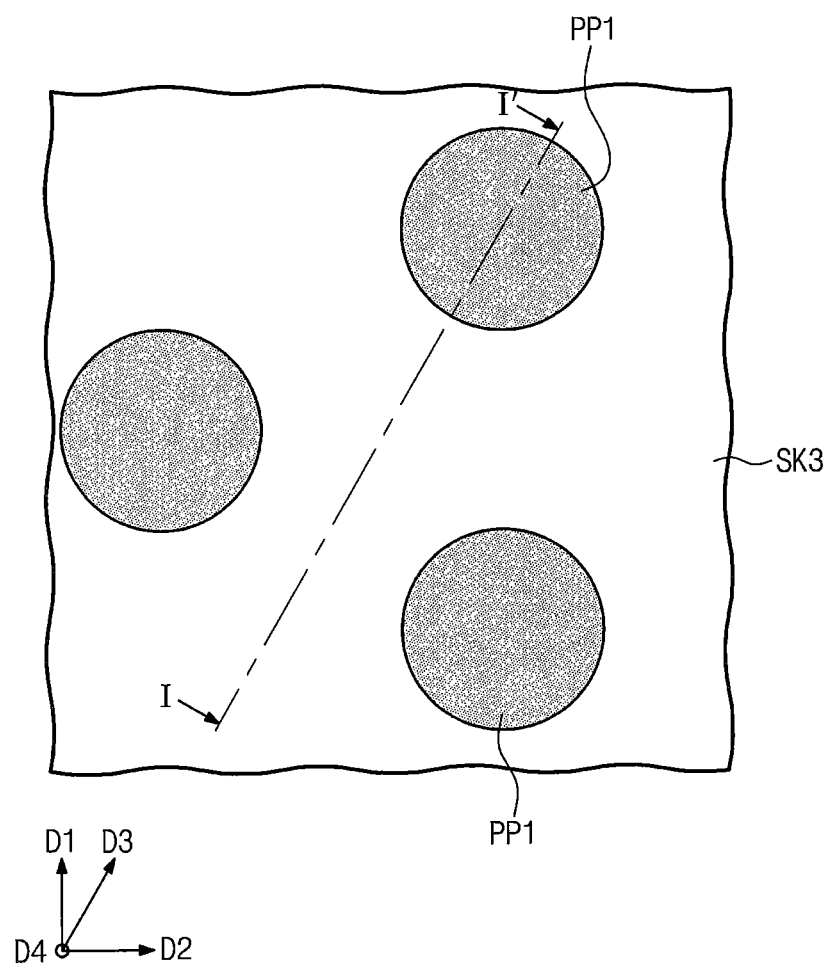

The above-described figures are intended to illustrate the general characteristics of methods, structure and/or materials utilized in certain example embodiments and to supplement the written description provided below. These drawings are not, however, to scale and may not precisely reflect the precise structural characteristics of any given embodiment, and should not be interpreted as defining or limiting the range of values or properties encompassed by example embodiments.

DETAILED DESCRIPTION

Embodiments of the inventive concepts will now be described more fully with reference to the accompanying drawings, in which example embodiments are shown. The inventive concepts may, however, be embodied in many different forms and should not be construed as being limited to the example embodiments set forth herein; rather, these example embodiments are provided so that this disclosure will be thorough and complete, and will fully convey the inventive concepts to those of ordinary skill in the art. In the drawings, the size and/or thicknesses of layers, regions and other structural elements may be exaggerated for clarity. Like reference numerals in the drawings and specification denote like elements, and thus elements that are described with respect to earlier drawings may not be re-described in the description of later drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises", "comprising", "includes" and/or "including" specify the presence of stated features, steps, operations, elements and/or components, but do not preclude the presence or addition of one or more other features, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the exact shapes of regions illustrated herein but are to include deviations in shapes that result, for example, from manufacturing.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 9A are plan views illustrating a method of fabricating a semiconductor device according to example embodiments of the inventive concepts, and FIGS. 1B through 9B are sectional views taken along lines I-I' of FIGS. 1A through 9A, respectively.

Figure 1B:
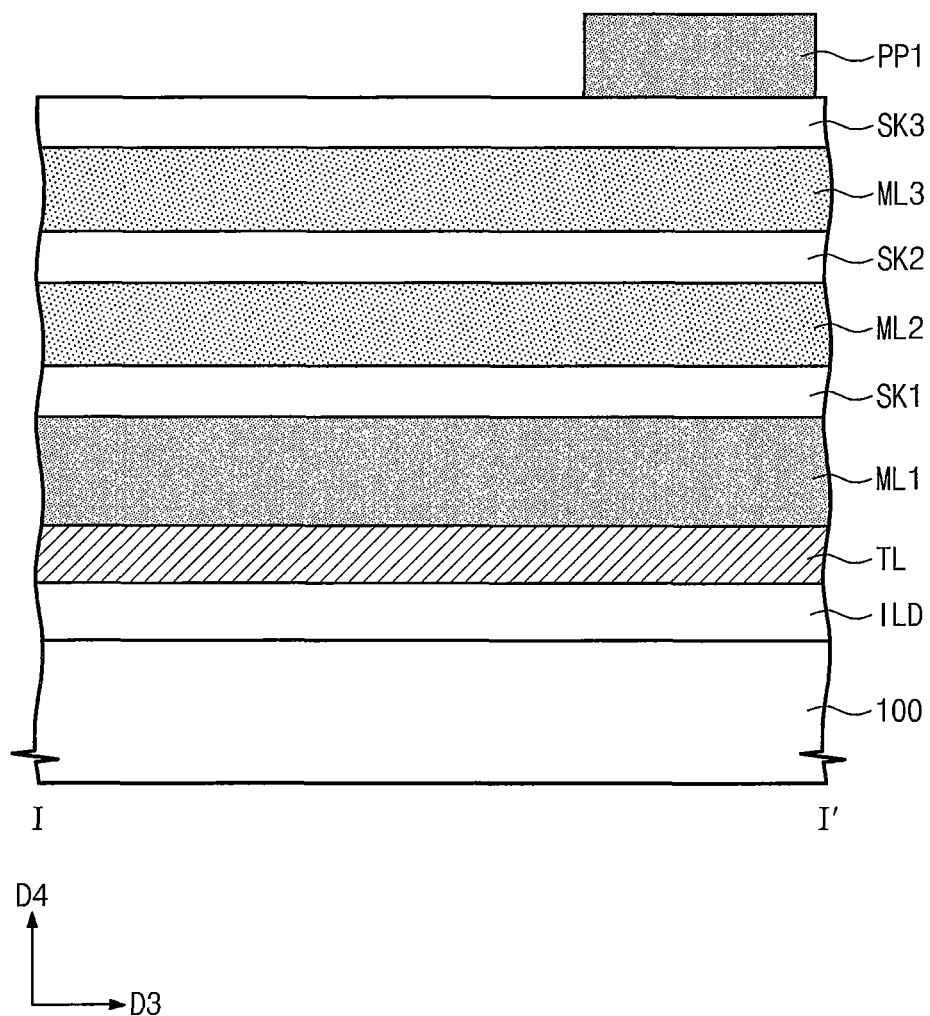

Referring to FIGS. 1A and 1B, an interlayer insulating layer ILD, an etch-target layer TL, a lower mold layer ML1, a first mask layer SK1, a middle mold layer ML2, a second mask layer SK2, an upper mold layer ML3, and a third mask layer SK3 may be sequentially formed on a substrate 100.

The substrate 100 may be a semiconductor substrate (for example, a silicon wafer, a germanium wafer, or a silicon-germanium wafer or a semiconductor layer such as, for example, a silicon layer of a silicon-on-insulator substrate). Although not shown, a plurality of transistors may be formed on the substrate 100. The interlayer insulating layer ILD may cover the transistors and may comprise a silicon oxide layer, a silicon nitride layer, or a silicon oxynitride layer. Although not shown, a plurality of buried contacts may extend through the interlayer insulating layer ILD to connect to the transistors.

As an example, the lower mold layer ML1 may be an amorphous carbon layer. The middle mold layer ML2 and the upper mold layer ML3 may comprise the same material; for example, they may comprise a spin-on-hard mask (SOH) layer or a spin-on carbon (SOC) layer. The first to third mask layers SK1, SK2, and SK3 may comprise the same material; for example, they may comprise a silicon oxide layer or a silicon oxynitride layer.

First photoresist patterns PP1 may be formed on the third mask layer SK3 using a first photolithography process. The first photolithography process may include forming a first photoresist layer on the third mask layer SK3, and exposing and developing the first photoresist layer to form the first photoresist patterns PP1.

The first photoresist patterns PP1 may partially cover a top surface of the third mask layer SK3. In example embodiments, when viewed in plan view, the first photoresist patterns PP1 may extend in a zigzag pattern along a first direction D1 that is parallel to a top surface of the substrate 100. Each of the first photoresist patterns PP1 may have a circular shape, but example embodiments of the inventive concepts are not limited thereto.

Figure 2A:
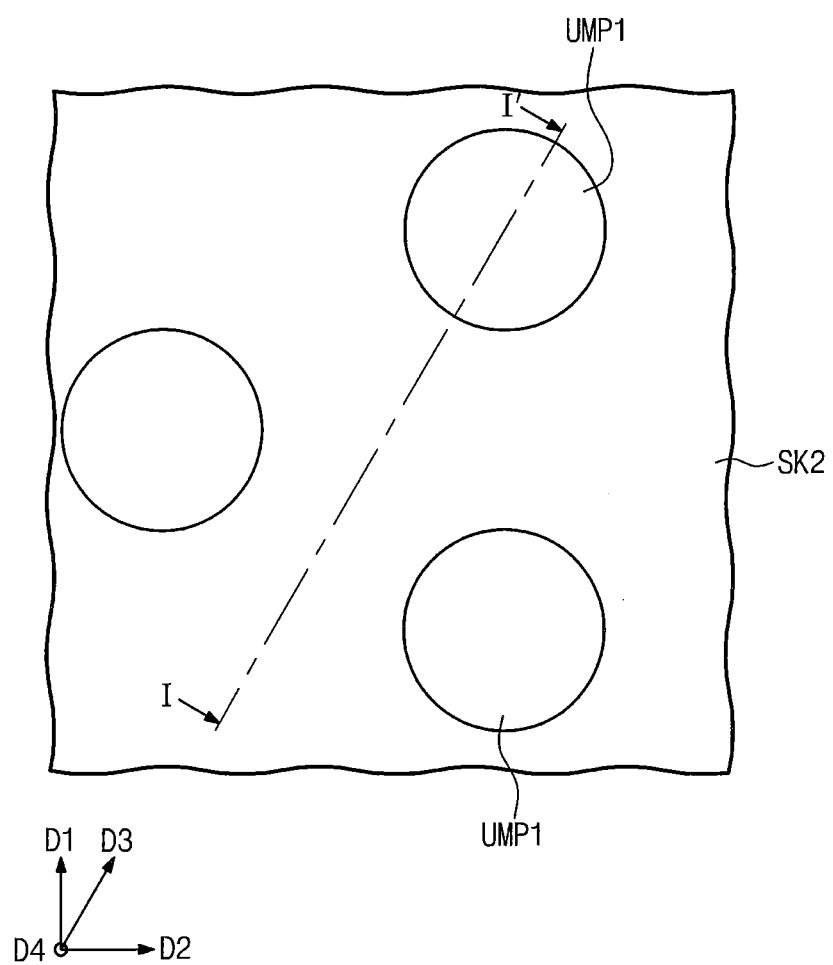
Figure 2B:
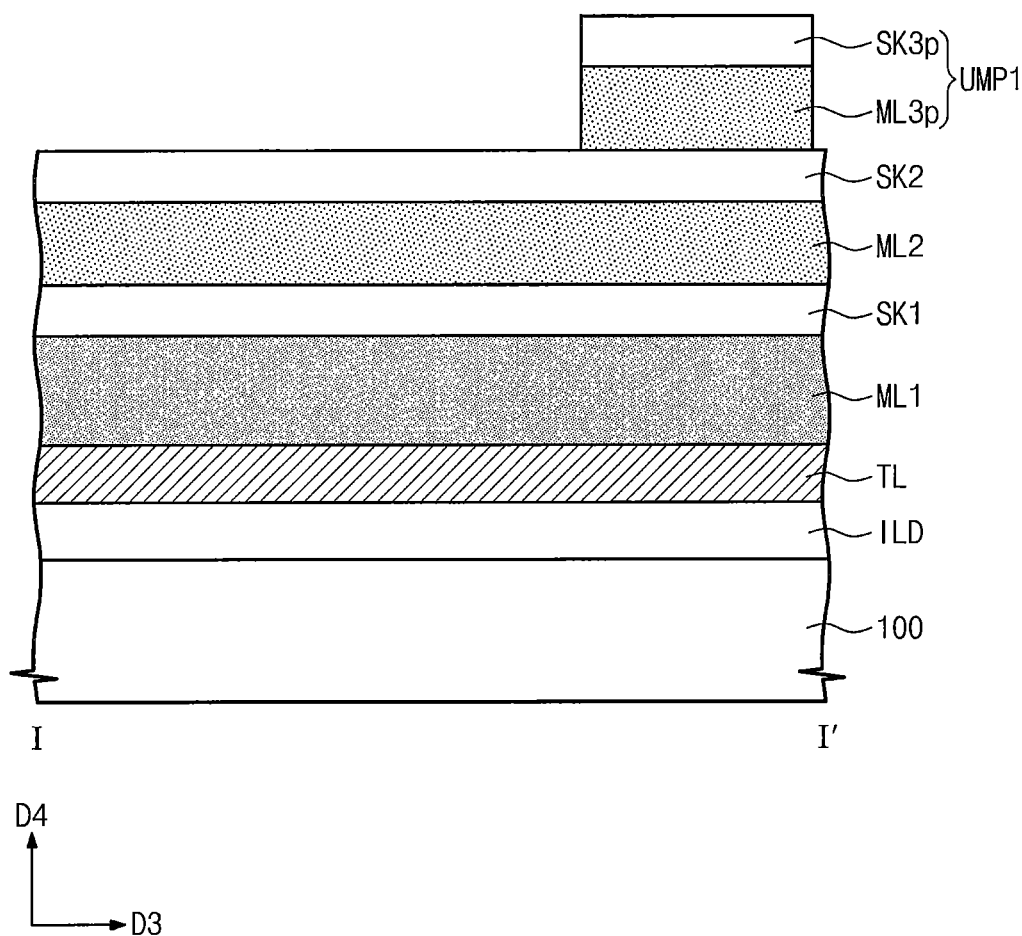

Referring to FIGS. 2A and 2B, the third mask layer SK3 and the upper mold layer ML3 may be sequentially etched using the first photoresist patterns PP1 as an etch mask to form first upper mold patterns UMP1. Each of the first upper mold patterns UMP1 may include a third mold pattern ML3p and a third mask pattern SK3p that are sequentially stacked on the substrate 100.

For example, the third mask layer SK3 may be etched using the first photoresist patterns PP1 as an etch mask to form the third mask patterns SK3p. When viewed in plan view, the third mask patterns SK3p may have a shape corresponding to that of the first photoresist patterns PP1. Next, the upper mold layer ML3 may be etched using the third mask patterns SK3p as an etch mask to form third mold patterns ML3p. When viewed in plan view, the third mold patterns ML3p may have a shape corresponding to that of the third mask patterns SK3p. The third mold patterns ML3p may partially expose a top surface of the second mask layer SK2 therebetween.

The first photoresist patterns PP1 may be removed during the formation of the third mold patterns ML3p to expose the top surfaces of the third mask patterns SK3p. Alternatively, the first photoresist patterns PP1 may be removed before etching the upper mold layer ML3 to form the third mold patterns ML3p. During the formation of the third mold patterns ML3p, the third mask patterns SK3p may be partially etched.

Figure 3A:
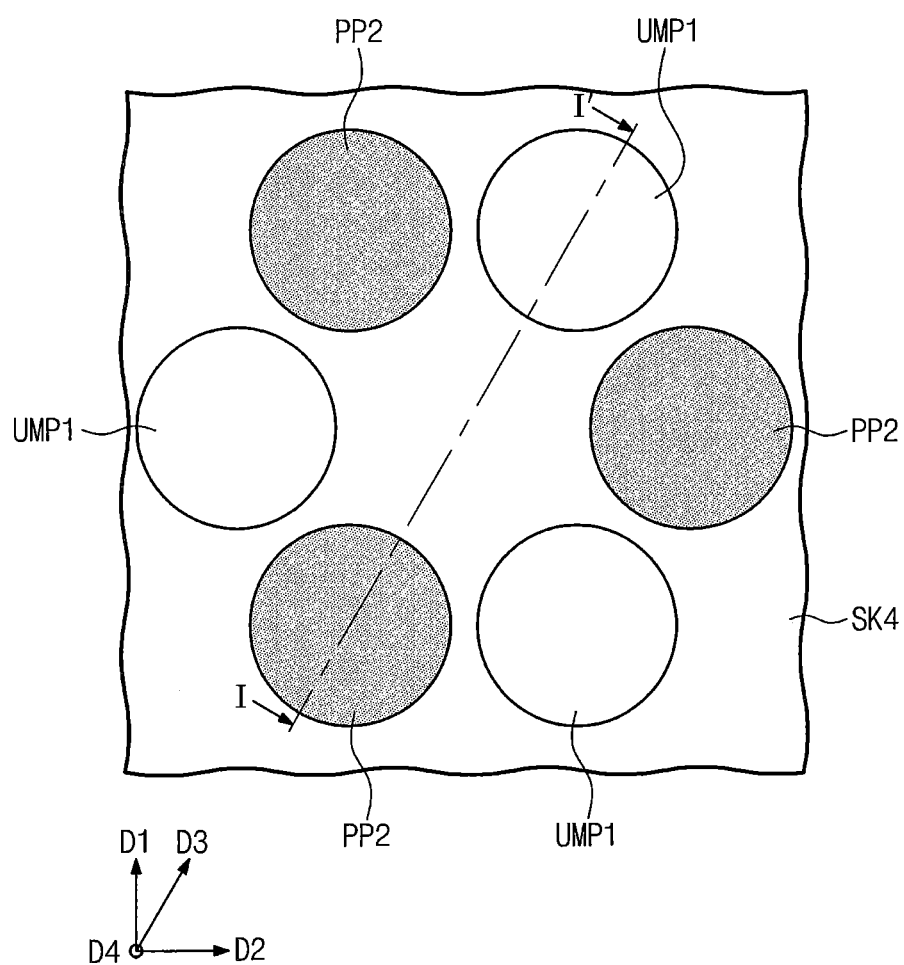
Figure 3B:
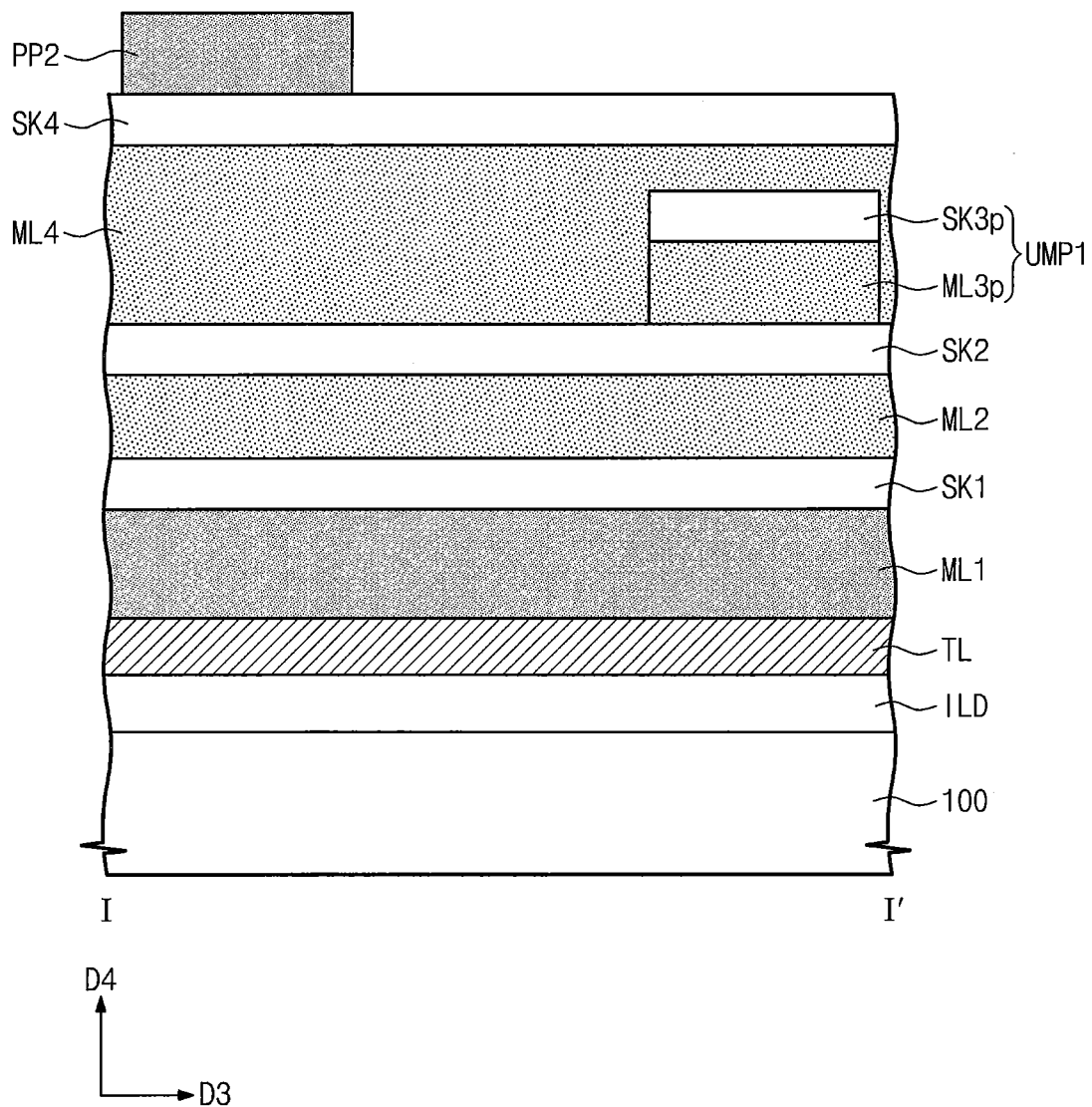

Referring to FIGS. 3A and 3B, an additional mold layer ML4 may be formed on the first upper mold patterns UMP1, and a fourth mask layer SK4 may be formed on the additional mold layer ML4. As an example, the additional mold layer ML4 may be a spin-on-hard mask (SOH) layer or a spin-on carbon (SOC) layer. The fourth mask layer SK4 may be a silicon oxide layer or a silicon oxynitride layer. The fourth mask layer SK4 may have a planar top surface.

Second photoresist patterns PP2 may be formed on the fourth mask layer SK4 using, for example, a second photolithography process. The second photolithography process may include forming a second photoresist layer on the fourth mask layer SK4 and exposing and developing the second photoresist layer to form the second photoresist patterns PP2.

The second photoresist patterns PP2 may partially cover a top surface of the fourth mask layer SK4. In example embodiments, when viewed in plan view, the second photoresist patterns PP2 may extend in a zigzag pattern along the first direction D1. The second photoresist patterns PP2 may not overlap the first upper mold patterns UMP1, when viewed in plan view. Thus, a line parallel to the vertical direction D4 that extends through one of the second photoresist patterns PP2 will not intersect one of the first upper mold patterns UMP1.

Figure 4A:
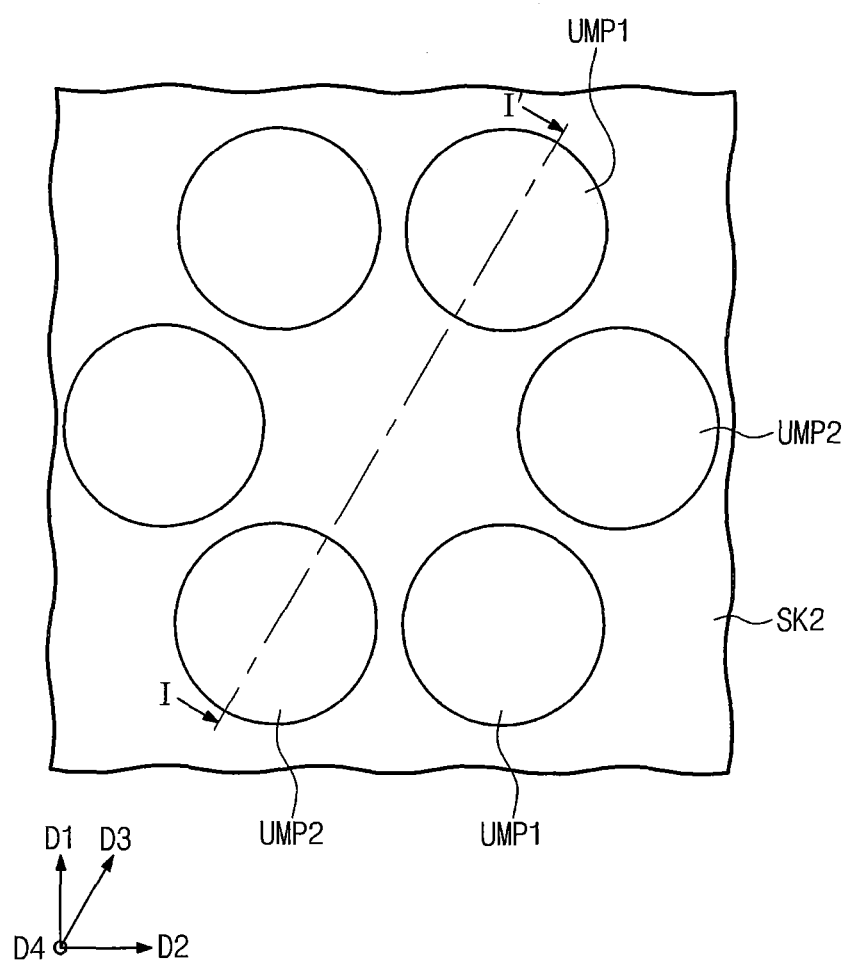
Figure 4B:
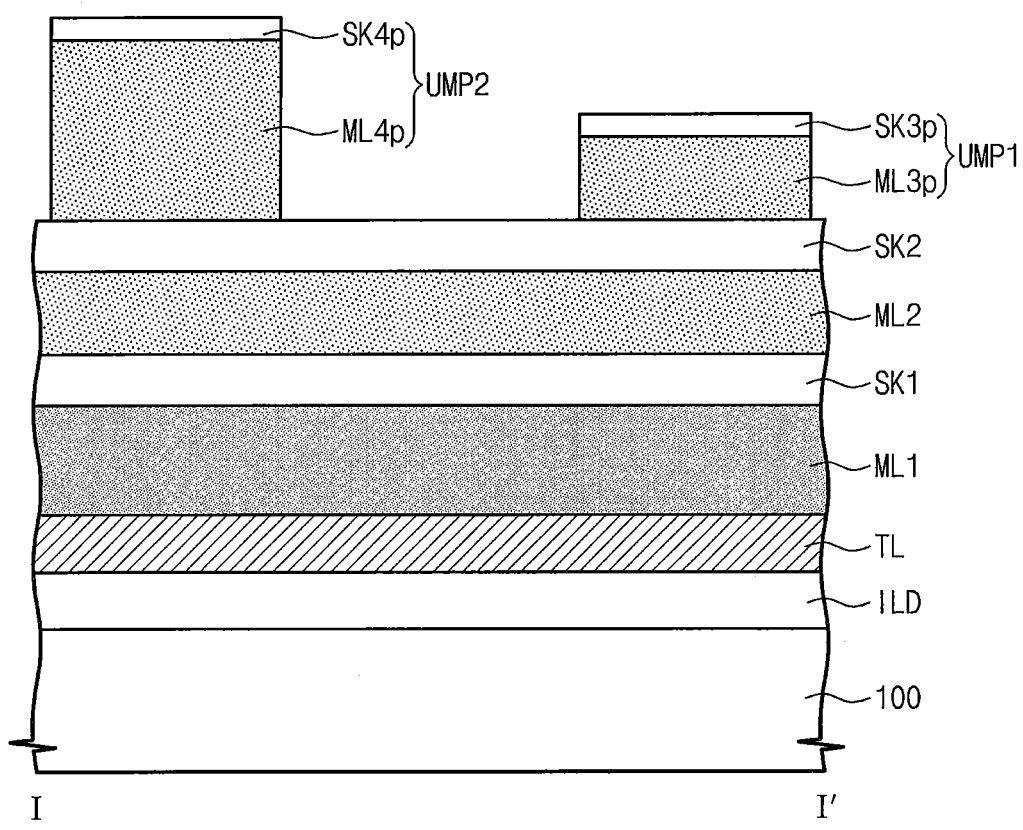

Referring to FIGS. 4A and 4B, the fourth mask layer SK4 and the additional mold layer ML4 may be sequentially etched using the second photoresist patterns PP2 as an etch mask to form second upper mold patterns UMP2. Each second upper mold pattern UMP2 may include a fourth mold pattern ML4p and a fourth mask pattern SK4p that are sequentially stacked on the substrate 100.

For example, the fourth mask layer SK4 may be etched using the second photoresist patterns PP2 as an etch mask to form the fourth mask patterns SK4p. When viewed in plan view, the fourth mask patterns SK4p may have a shape corresponding to that of the second photoresist patterns PP2. Next, the additional mold layer ML4 may be etched using the fourth mask patterns SK4p as an etch mask to form the fourth mold patterns ML4p. When viewed in plan view, the fourth mold patterns ML4p may have a shape corresponding to that of the fourth mask patterns SK4p. The fourth mold patterns ML4p and the third mold patterns ML3p may partially expose the top surface of the second mask layer SK2 therebetween.

The second photoresist patterns PP2 may be removed during the formation of the fourth mold patterns ML4p to expose the top surfaces of the fourth mask patterns SK4p. Alternatively, the second photoresist patterns PP2 may be removed before etching the additional mold layer ML4 to form the fourth mold patterns ML4p. During the formation of the fourth mold patterns ML4p, both the fourth mask patterns SK4p and the third mask patterns SK3p may be partially etched.

In example embodiments, the first and second upper mold patterns UMP1 and UMP2 may be formed by the first and second photolithography processes, which are separately performed. As the integration density of semiconductor devices is increased, a space between the first and second upper mold patterns UMP1 and UMP2 may become smaller than a minimum pattern pitch in a photolithography process. In the case where the first and second upper mold patterns UMP1 and UMP2 are formed by separate photolithography processes, it is possible to overcome the limitation on the minimum pattern pitch in the photolithography process.

The first upper mold patterns UMP1 may have top surfaces positioned at a different vertical height in the device structure than the top surfaces of the second upper mold patterns UMP2. As an example, the top surfaces of the second upper mold patterns UMP2 may be positioned at a higher level in the device structure than the top surfaces of the first upper mold patterns UMP1. This is because the second upper mold patterns UMP2 are patterns which result from the additional mold layer ML4 covering the first upper mold patterns UMP1 and are formed by the additional second photolithography process, independently of the first upper mold patterns UMP1.

Figure 5A:
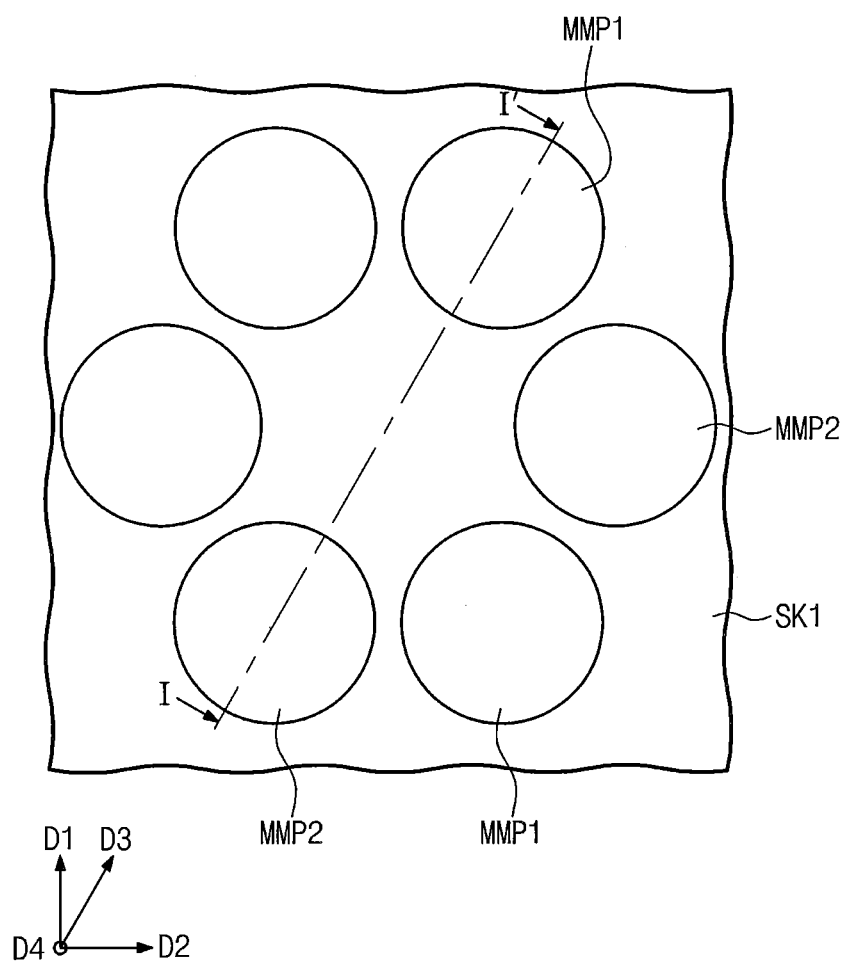
Figure 5B:
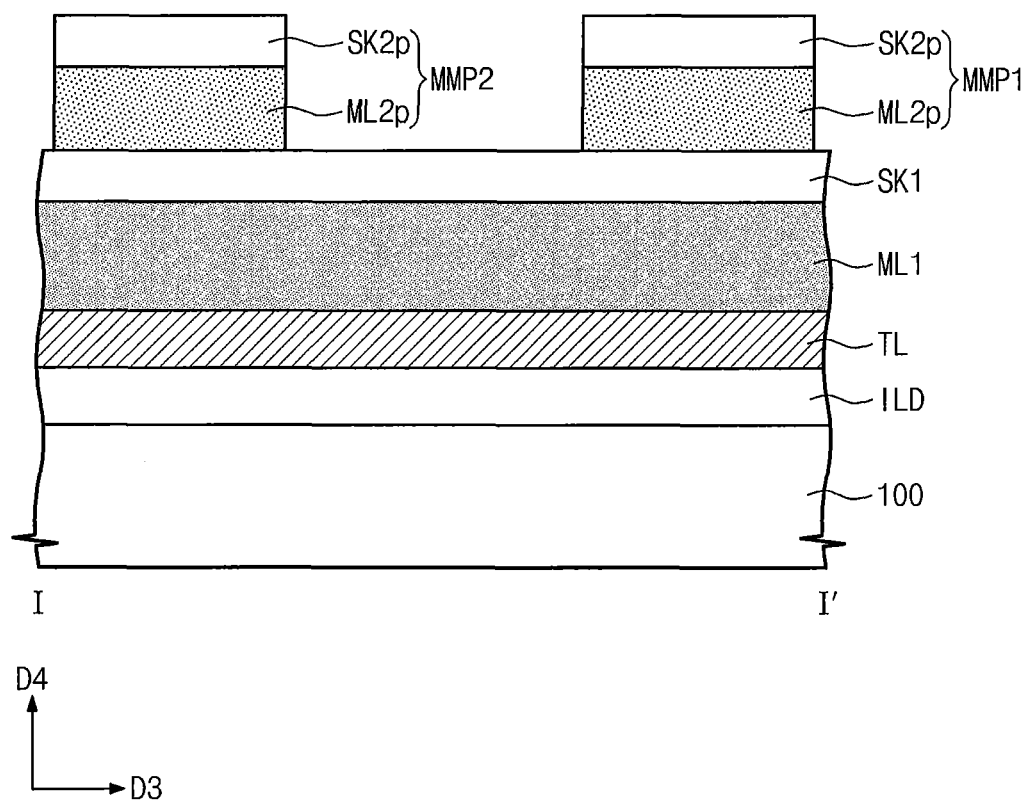

Referring to FIGS. 5A and 5B, the second mask layer SK2 and the middle mold layer ML2 may be sequentially etched using the first and second upper mold patterns UMP1 and UMP2 as an etch mask to respectively form first middle mold patterns MMP1 and second middle mold patterns MMP2. Each of the first and second middle mold patterns MMP1 and MMP2 may include a second mold pattern ML2p and a second mask pattern SK2p that are sequentially stacked on the substrate 100. When viewed in plan view, the first middle mold patterns MMP1 may have a shape corresponding to that of the first upper mold patterns UMP1. The second middle mold patterns MMP2 may have a shape corresponding to that of the second upper mold patterns UMP2.

For example, the second mask layer SK2 may be etched using the first and second upper mold patterns UMP1 and UMP2 as an etch mask to form the second mask patterns SK2p. When viewed in plan view, the second mask patterns SK2p may have a shape corresponding to that of the first and second upper mold patterns UMP1 and UMP2. Next, the middle mold layer ML2 may be etched using the second mask patterns SK2p as an etch mask to form the second mold patterns ML2p. When viewed in plan view, the second mold patterns ML2p may have a shape corresponding to that of the second mask patterns SK2p. The second mold patterns ML2p may partially expose the top surface of the first mask layer SK1 therebetween.

The first and second upper mold patterns UMP1 and UMP2 may be removed during the formation of the second mold patterns ML2p to expose top surfaces of the second mask patterns SK2p. Alternatively, the first and second upper mold patterns UMP1 and UMP2 may be removed before etching the middle mold layer ML2 to form the second mold patterns ML2p. During the formation of the second mold patterns ML2p, the second mask patterns SK2p may be partially etched.

The first and second middle mold patterns MMP1 and MMP2 may have top surfaces that are positioned at substantially the same level. As described above, since the first and second upper mold patterns UMP1 and UMP2 are formed by the separate photolithography processes, they have the top surfaces positioned at the different levels. However, according to example embodiments of the inventive concepts, since the second mask layer SK2 and the middle mold layer ML2 are additionally provided below the first and second upper mold patterns UMP1 and UMP2, the first and second middle mold patterns MMP1 and MMP2 can be formed to have the substantially coplanar top surfaces.

Figure 6A:
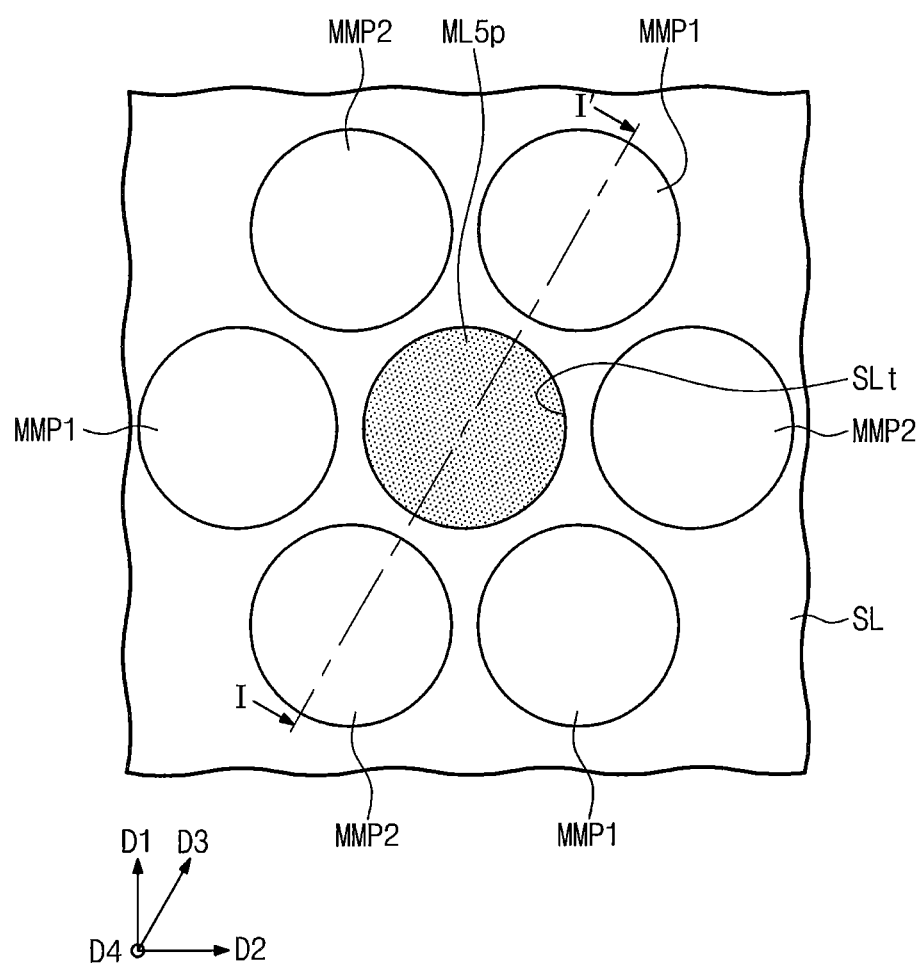
Figure 6B:
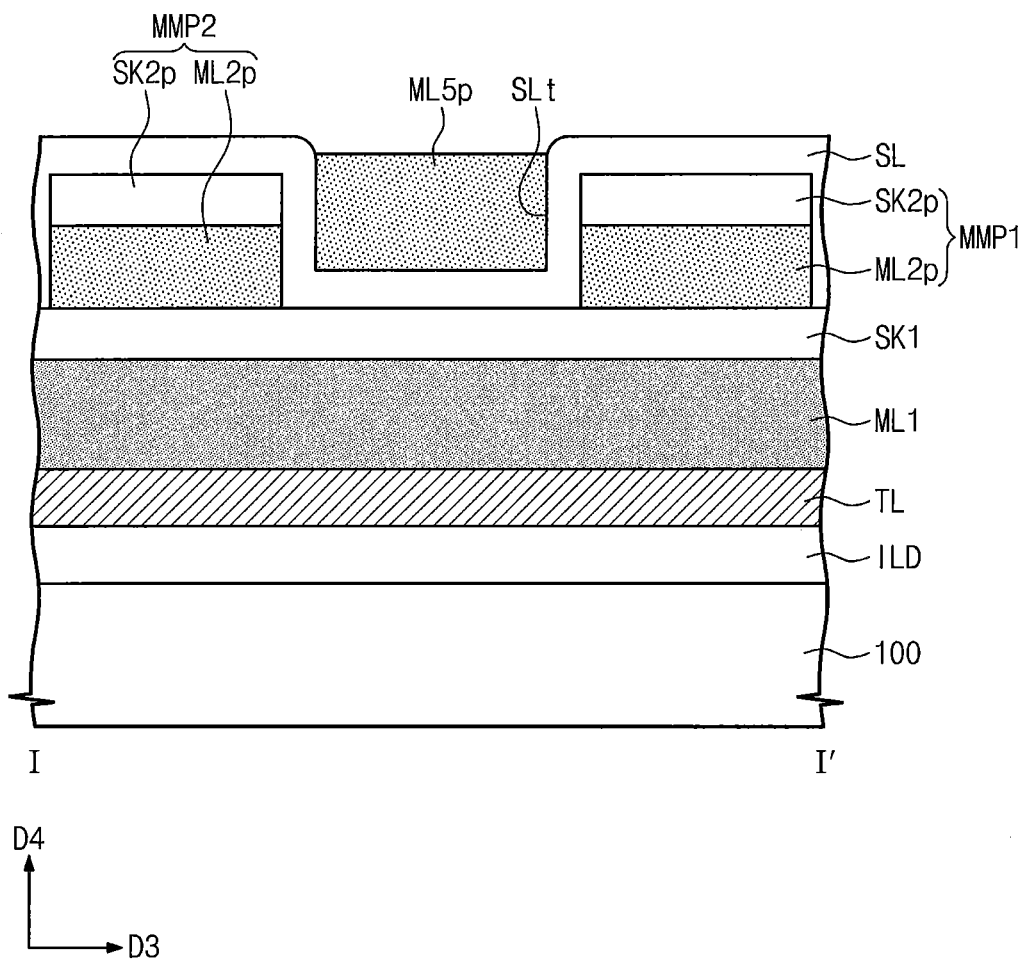

Referring to FIGS. 6A and 6B, a spacer layer SL may be formed to conformally cover the first and second middle mold patterns MMP1 and MMP2. The spacer layer SL may be formed by an atomic layer deposition (ALD) process. The spacer layer SL may comprise, for example, a silicon oxide layer or a silicon oxynitride layer.

The spacer layer SL may define a recess region SLt between the first and second middle mold patterns MMP1 and MMP2. When viewed in plan view, the first middle mold patterns MMP1 may extend in a zigzag pattern along the first direction D1, and the second middle mold patterns MMP2 may also extend in a zigzag pattern along the first direction D1, and may be interposed with respect to the first middle mold patterns MMP1. In example embodiments, when viewed in plan view, the first and second middle mold patterns MMP1 and MMP2 may be arranged in such a way that centers thereof are respectively positioned at vertices of polygon (e.g., a honeycomb structure). The recess region SLt may be positioned at the center of the polygon.

A fifth mold pattern ML5p may be formed to fill the recess region SLt. For example, the fifth mold pattern ML5p may be formed by forming a mold layer (not shown) to fill the recess region SLt and performing a planarization or etch-back process to remove an upper portion of the mold layer. As an example, the mold layer may be a spin-on-hard mask (SOH) layer or a spin-on carbon (SOC) layer.

Figure 7A:
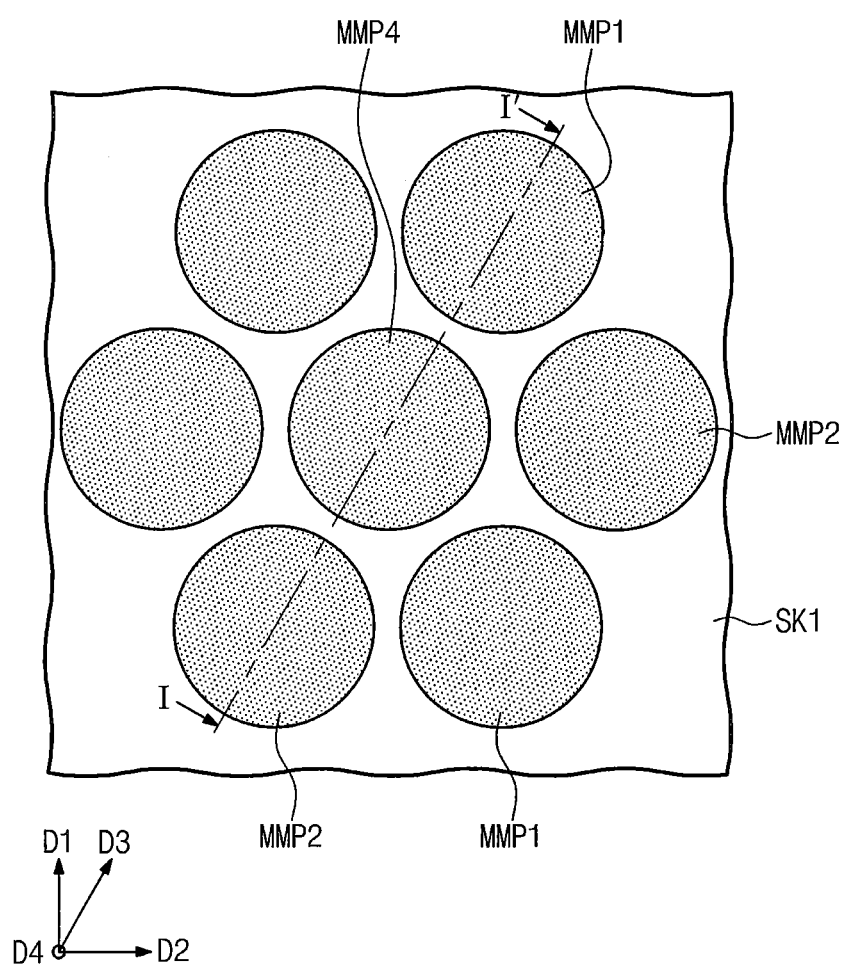
Figure 7B:
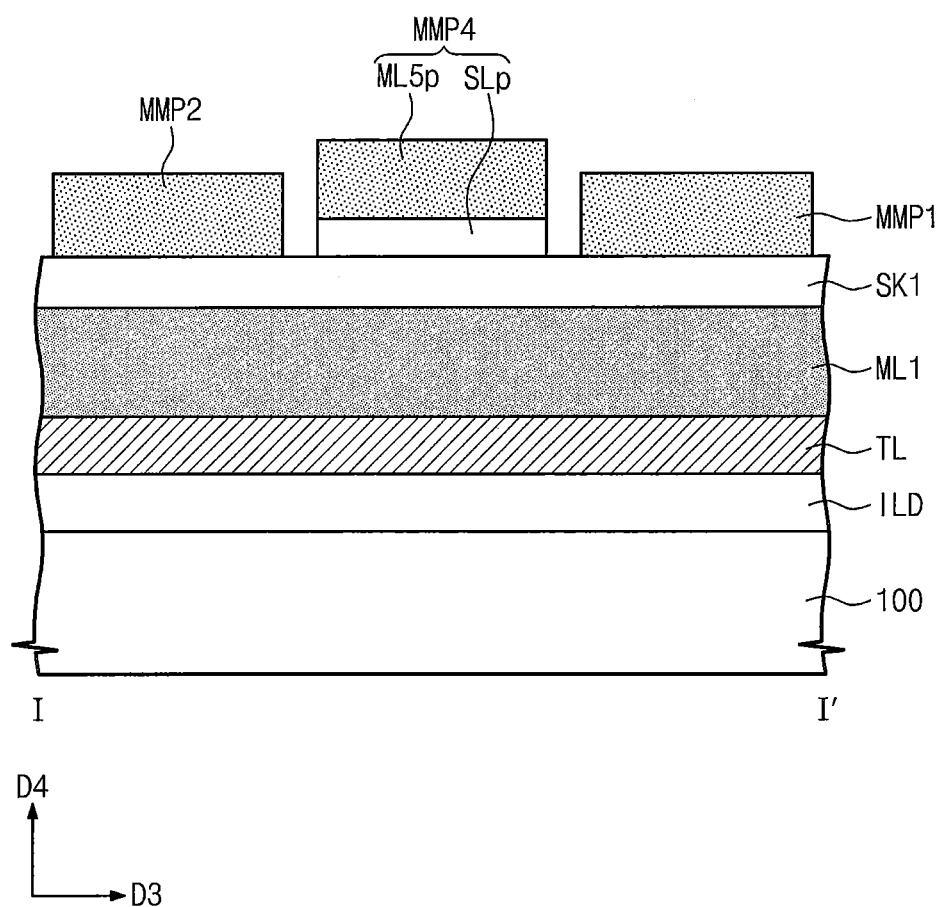

Referring to FIGS. 7A and 7B, the spacer layer SL may be anisotropically etched to form a third middle mold pattern MMP4. The third middle mold pattern MMP4 may include a spacer pattern SLp and a fifth mold pattern ML5p that are sequentially stacked on the first mask layer SK1.

In detail, the spacer layer SL may be anisotropically etched to expose a portion of the top surface of the first mask layer SK1. The fifth mold pattern ML5p may prevent a portion of the spacer layer SL positioned thereunder from being etched, and thus, the spacer pattern SLp may be formed under the fifth mold pattern ML5p. As a result of the anisotropic etching, the first to third middle mold patterns MMP1, MMP2, and MMP4 may be horizontally separated from each other.

During the anisotropic etching process on the spacer layer SL, the second mask patterns SK2p are exposed, and in this case, may be etched and removed. Thus, each of the first and second middle mold patterns MMP1 and MMP2 may comprise only the second mold pattern ML2p. During the anisotropic etching of the spacer layer SL, an exposed upper portion of the fifth mold pattern ML5p may be partially etched.

Due to the limitation on the minimum pitch in the photolithography process, it may be difficult to form all of the first to third middle mold patterns MMP1, MMP2, and MMP4 using a single photolithography process. However, by using the first and second middle mold patterns MMP1 and MMP2 enclosing the recess region SLt and having substantially coplanar top surfaces, it is possible to form the third middle mold pattern MMP4 in a self-aligned manner. In other words, it is possible to overcome the limitation on the minimum pitch in the photolithography process.

Figure 8A:
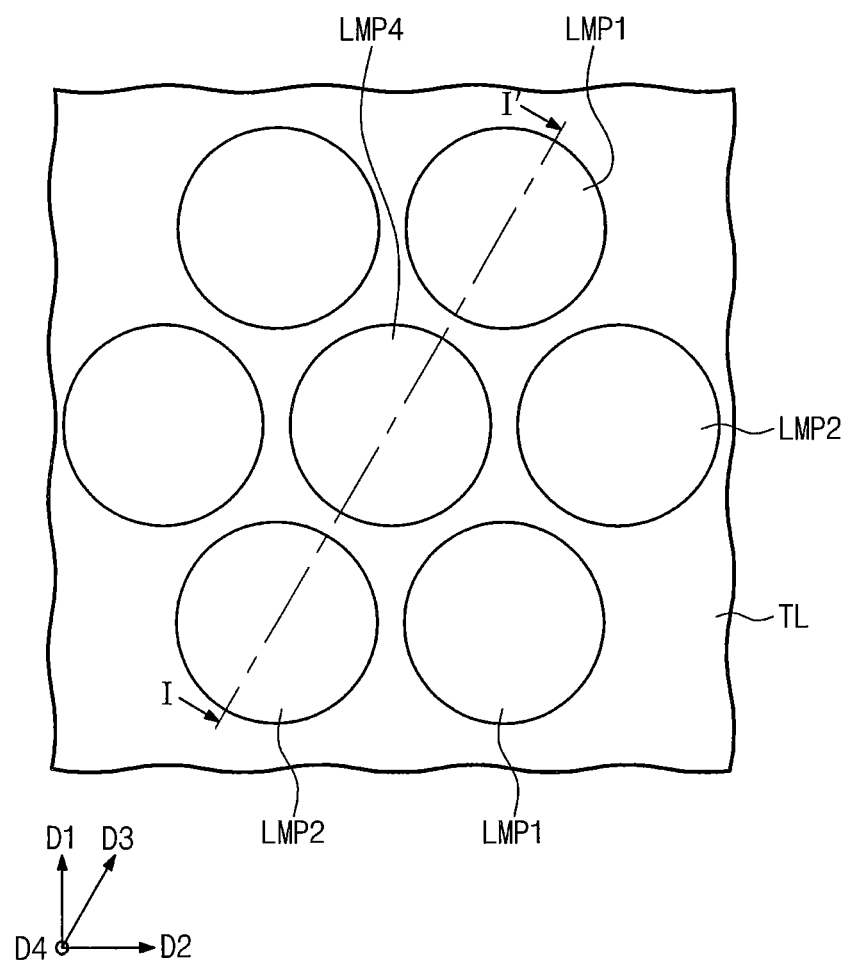
Figure 8B:
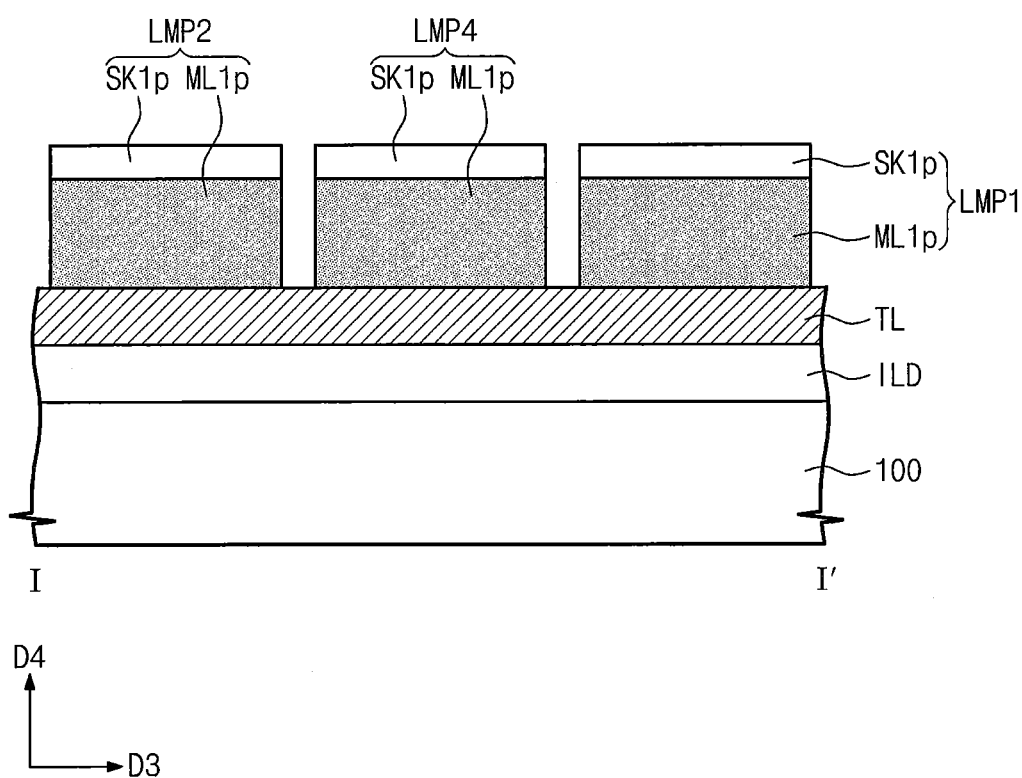

Referring to FIGS. 8A and 8B, the first mask layer SK1 and the lower mold layer ML1 may be sequentially etched using the first to third middle mold patterns MMP1, MMP2, and MMP4 as an etch mask to form first to third lower mold patterns LMP1, LMP2, and LMP4, respectively. Each of the first to third lower mold patterns LMP1, LMP2, and LMP4 may include a first mold pattern ML1p and a first mask pattern SK1p that are sequentially stacked on the etch-target layer TL.

For example, the first mask layer SK1 may be etched using the first to third middle mold patterns MMP1, MMP2, and MMP4 as an etch mask to form the first mask patterns SK1p. When viewed in plan view, the first mask patterns SK1p may have a shape corresponding to that of the first to third middle mold patterns MMP1, MMP2, and MMP4. Next, the lower mold layer ML1 may be etched using the first mask patterns SK1p as an etch mask to form the first mold patterns ML1p. When viewed in plan view, the first mold patterns ML1p may have a shape corresponding to that of the first mask patterns SK1p. The first mold patterns ML1p may partially expose the top surface of the etch-target layer TL therebetween.

During the formation of the first mold patterns ML1p, the first to third middle mold patterns MMP1, MMP2, and MMP4 may be completely removed, and thus top surfaces of the first mask patterns SK1p may be exposed. Alternatively, the first to third middle mold patterns MMP1, MMP2, and MMP4 may be removed before etching the first mold patterns ML1p. During the formation of the first mold patterns ML1p, the first mask patterns SK1p may be partially etched.

Figure 9A:
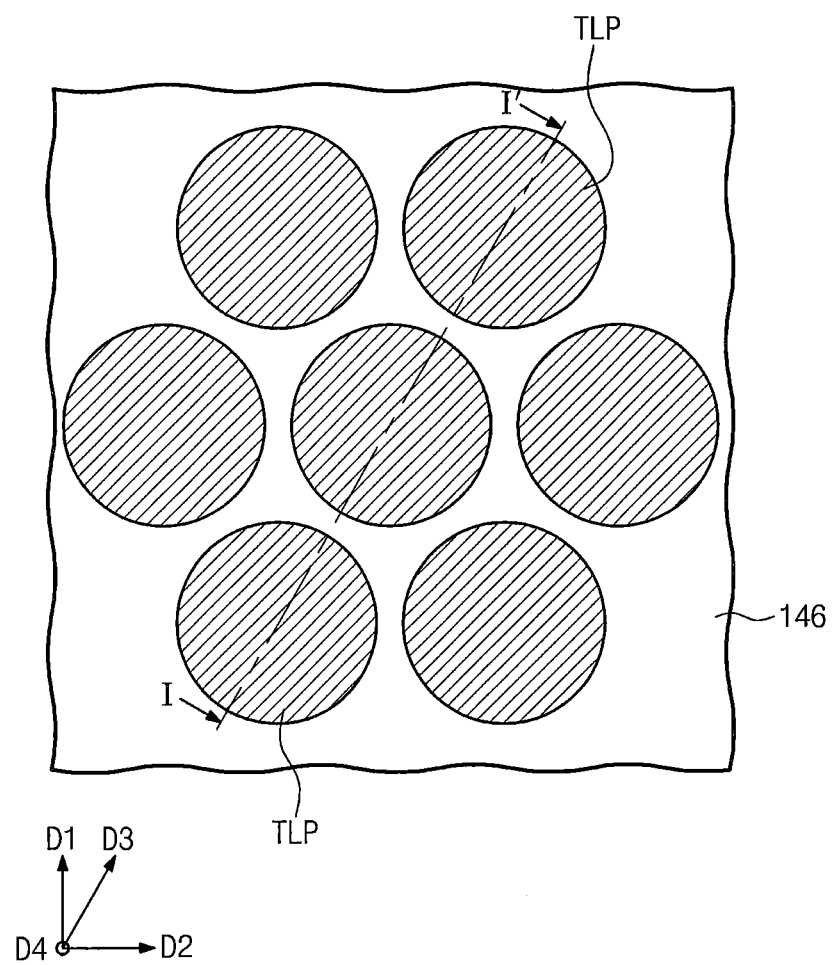
Figure 9B:
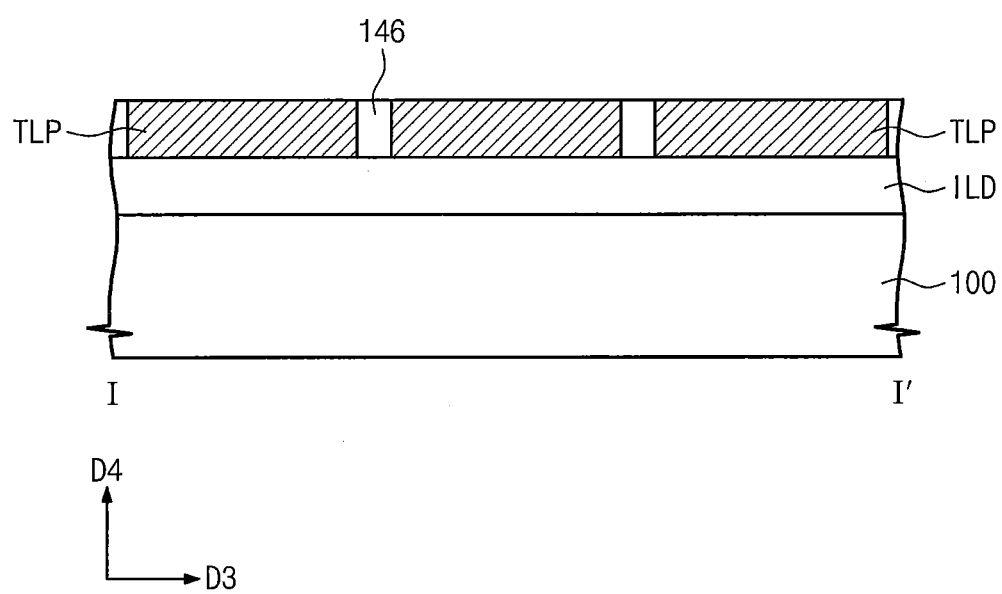

Referring to FIGS. 9A and 9B, the etch-target layer TL may be etched using the first to third lower mold patterns LMP1, LMP2, and LMP4 as an etch mask to form conductive patterns TLP. When viewed in plan view, the conductive patterns TLP may have a shape corresponding to that of the first to third lower mold patterns LMP1, LMP2, and LMP4. Next, an insulating pattern 146 may be formed to fill a gap region between the conductive patterns TLP. The insulating pattern 146 may be formed by forming an insulating layer (not shown) to cover the conductive pattern TLP, and then planarizing the insulating layer.

The formation of the conductive patterns TLP may not completely remove the first to third lower mold patterns LMP1, LMP2, and LMP4. After the formation of the conductive patterns TLP, remaining portions of the first to third lower mold patterns LMP1, LMP2, and LMP4 may be removed by an additional process. Alternatively, after the formation of the conductive patterns TLP, a planarization process may be performed on the insulating layer, and the remaining portions of the first to third lower mold patterns LMP1, LMP2, and LMP4 may be removed during the planarization process.

The conductive patterns TLP may be respectively connected to a plurality of buried contacts (not shown) that penetrate the interlayer insulating layer ILD. In example embodiments, the conductive patterns TLP may be used as pads that are connected to the buried contacts. In other embodiments, the conductive patterns TLP may serve as lower capacitor electrodes of for example, a DRAM device, that are connected to the buried contacts.

According to example embodiments of the inventive concepts, although the middle mold patterns MMP1, MMP2, and MMP4 are formed by at least two photolithography processes, they are formed to have substantially the same or similar height, and this makes it possible to form the conductive patterns TLP with high size uniformity. For example, if the second mask layer SK2 and the middle mold layer ML2 are not provided, the conductive patterns TLP may be formed using the upper mold patterns UMP1 and UMP2 as an etch mask. In this case, due to the difference in heights between the upper mold patterns UMP1 and UMP2, it is difficult to control etching uniformity in the etching process, and consequently, it may be difficult to realize desired sizes for the conductive patterns TLP. Further, the difference in heights between the upper mold patterns UMP1 and UMP2 may lead to a difficulty in precisely forming the fifth mold pattern ML5p at a desired position. However, according to example embodiments of the inventive concepts, it is possible to overcome the limitation on the minimum pitch in the photolithography process and to precisely form the conductive patterns TLP at the desired positions and with good height uniformity, without these technical issues.

Figure 10A:
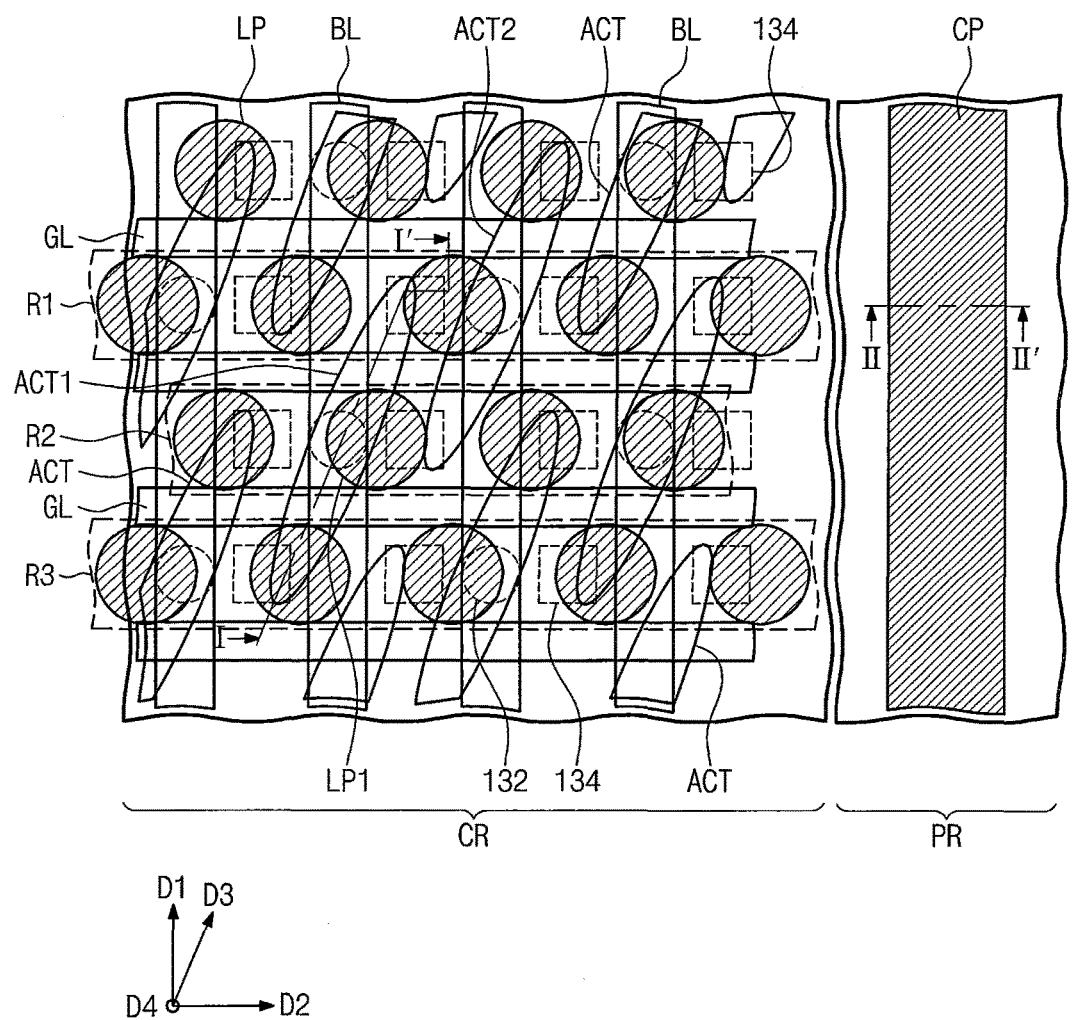
FIG. 10A is a plan view illustrating a semiconductor device according to another example embodiment of the inventive concepts.
Figure 10B:
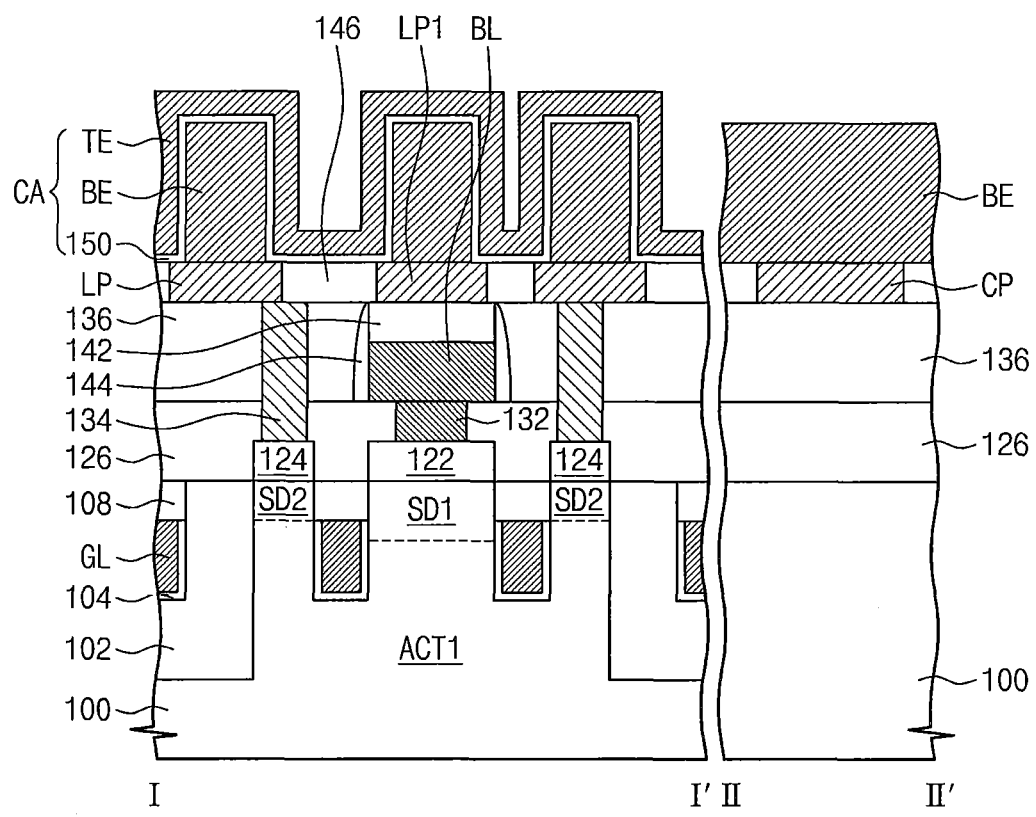
FIG. 10B is a sectional view taken along line I-I' of FIG. 10A.
Figure 10B:
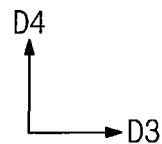
Figure 10B:
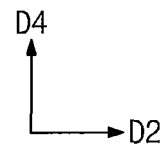

FIG. 10A is a plan view illustrating a semiconductor device according to further example embodiments of the inventive concepts, and FIG. 10B is a sectional view taken along line I-I' of FIG. 10A.

Referring to FIGS. 10A and 10B, a substrate 100 with a cell region CR and a peripheral circuit region PR may be provided. The cell region CR of the substrate 100 will be described first below.

A device isolation layer 102 may be provided on the substrate 100 to define active regions ACT. The substrate 100 may be a semiconductor substrate (for example, a silicon wafer, a germanium wafer, or a silicon-germanium wafer). The device isolation layer 102 may comprise, for example, a silicon oxide layer, a silicon nitride layer, and/or a silicon oxynitride layer. When viewed in a plan view, each of the active regions ACT may be shaped like a bar that has a longitudinal axis that is parallel to a third direction D3 or is at an angle to first and second directions D1 and D2. All of the first to third directions D1, D2, and D3 may be parallel to a top surface of the substrate 100, and the second direction D2 may cross the first direction D1.

Gate lines GL may be provided in the substrate 100 to cross the active regions ACT. The gate lines GL may extend parallel to the second direction D2 and may be spaced apart from each other in the first direction D1. The gate lines GL may be buried in the substrate 100. The gate lines GL may include a conductive material. For example, the conductive material may be one of doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), and metal-semiconductor compounds (tungsten silicide, cobalt silicide, titanium silicide, and so forth).

Gate insulating patterns 104 may be interposed between the gate lines GL and the active regions ACT and between the gate lines GL and the device isolation layer 102. The gate insulating patterns 104 may comprise, for example, a silicon oxide layer, a silicon nitride layer, and/or a silicon oxynitride layer.

First capping patterns 108 may be provided on top surfaces of the respective gate lines GL. Each of the first capping patterns 108 may have a top surface that is substantially coplanar with a top surface of the substrate 100. The first capping patterns 108 may be formed of or include, for example, a silicon oxide layer, a silicon nitride layer, and/or a silicon oxynitride layer. In example embodiments, each of the first capping patterns 108 may have a bottom surface that is in contact with the top surface of a corresponding one of the gate insulating patterns 104 and both side surfaces in contact with the active region ACT and/or the device isolation layer 102. In other embodiments, the gate insulating patterns 104 may include portions that extend between the first capping patterns 108 and the active region ACT and/or between the first capping patterns 108 and the device isolation layer 102. In this case, the first capping patterns 108 may include a silicon nitride layer, and the gate insulating patterns 104 may include a silicon oxide layer. The gate insulating patterns 104 interposed between the first capping patterns 108 and the active region ACT may serve as a buffer layer relieving stress between the active region ACT and the first capping patterns.

A first doped region SD1 and second doped regions SD2 may be provided in each of the active regions ACT. The second doped regions SD2 may be spaced apart from each other by the first doped region SD1. The first doped region SD1 may be provided in a portion of the active region ACT that is positioned between an adjacent pair of the gate lines GL. The second doped regions SD2 may be provided in end portions of the active region ACT that are spaced apart from each other by the pair of gate lines GL. In other words, the second doped regions SD2 may be spaced apart from each other with the pair of gate lines GL interposed therebetween. The first doped region SD1 may have a depth greater than that of the second doped regions SD2, when measured from the top surface of the substrate 100. The first doped region SD1 may be doped to have the same conductivity type as the second doped regions SD2.

A first pad 122 and second pads 124 may be provided on the substrate 100. The first pad 122 may be connected to the first doped region SD1, and the second pads 124 may be connected to the respective second doped regions SD2. The first pad 122 and the second pads 124 may include a conductive layer (e.g., a doped poly-silicon layer and/or a doped single crystalline silicon layer). A first interlayer insulating layer 126 may be provided on the substrate 100 to cover the first pad 122 and the second pads 124. The first interlayer insulating layer 126 may comprise a silicon oxide layer, a silicon nitride layer, and/or a silicon oxynitride layer.

Bit lines BL may be provided on the first interlayer insulating layer 126. The bit lines BL may extend parallel to the first direction D1 and may be spaced apart from each other in the second direction D2. Each of the bit lines BL may be formed on the first interlayer insulating layer 126 and may be electrically connected to the first pad 122 and the first doped region SD1 through a bit line contact 132. The bit lines BL may be formed of or include, at least one of doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), or metal-semiconductor compounds (e.g., tungsten silicide, cobalt silicide, titanium silicide, and so forth). The bit line contact 132 may include the same material as that for the bit lines BL. The bit line contact 132 may penetrate the first interlayer insulating layer 126.

Second capping patterns 142 may be provided on top surfaces of the respective bit lines BL. The second capping patterns 142 may be formed of or include, for example, a silicon nitride layer, a silicon oxide layer, and/or a silicon oxynitride layer. Bit line spacers 144 may be provided on opposed side surfaces of each of the bit lines BL. The bit line spacers 144 may be formed of or include, for example, a silicon nitride layer, a silicon oxide layer, and/or a silicon oxynitride layer. A second interlayer insulating layer 136 may be provided on the first interlayer insulating layer 126 to cover the bit lines BL, the second capping patterns 142, and the bit line spacers 144. The second interlayer insulating layer 136 may include, for example, a silicon oxide layer. Buried contacts 134 may penetrate the first and second interlayer insulating layers 126 and 136 to contact the respective second pads 124. The buried contacts 134 may include a conductive material (e.g., doped silicon or a metal).

Landing pads LP may be provided on the second interlayer insulating layer 136 and may be connected to the respective buried contacts 134. The landing pads LP may be two-dimensionally arranged on the substrate 100. In example embodiments, the landing pads LP may be arranged in first to third rows R1, R2, and R3. The first to third rows R1, R2, and R3 may be spaced apart from each other in the first direction D1, As shown in FIG. 10A, the landing pads LP of the first and third rows R1 and R3 may be disposed to be symmetric to each other about the landing pads of the second row R2, which are interposed therebetween. In other words, each of the landing pads LP in the first row R1 may be aligned in the first direction D1 with a respective one of the landing pads LP in the third row R3, and a plurality of lines that are parallel to the first direction D1 that run through the center of the respective landing pads LP in the second row R2 may pass between two adjacent ones of the landing pads LP in the first row R1.

When viewed in plan view, each landing pad LP may have a size larger than that of the buried contact 134 and may partially overlap a respective one of the buried contacts 134. In other words, the landing pads LP may have a planar arrangement that is different from the planar arrangement of the buried contacts 134. For example, if one of the landing pad LP is electrically connected to a specific one of the second doped region SD2 through a buried contact 134, the landing pad LP may partially overlap another active region ACT that is adjacent the second doped region SD2, when viewed in plan view (i.e., when viewed from above the top surface of the substrate 100). Accordingly, as shown in FIGS. 10A and 10B, the first landing pad LP1 may vertically overlap the first doped region SD1 of the first active region ACT1. As described above, the first landing pad LP1 is electrically connected to the second doped region SD2 of the second active region ACT2 as opposed to being electrically connected to the first doped region SD1 of the first active region ACT1.

The landing pads LP may comprise a conductive material. For example, the conductive material may be one of doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), and metal-semiconductor compounds (tungsten silicide, cobalt silicide, titanium silicide, and so forth).

An insulating pattern 146 may fill a gap region between the landing pads LP. The insulating pattern 146 may comprise, for example, a silicon oxide layer, a silicon nitride layer, and/or a silicon oxynitride layer.

Capacitors CA may be provided on the landing pads LP. The capacitors CA may be electrically connected to the second doped regions SD2 via the landing pads LP and the buried contacts 134. The capacitors CA may include bottom electrodes BE that are respectively provided on the landing pads LP and connected to the buried contacts 134. The bottom electrodes BE may be electrically connected to the respective second doped regions SD2 via the respective landing pads LP and buried contacts 134. Each of the bottom electrodes BE may have a solid pillar shape, as shown in FIG. 10B. In other embodiments, each of the bottom electrodes BE may have the shape of a hollow-cylinder with a closed bottom. When viewed in a plan view, the bottom electrodes BE may be two-dimensionally arranged on the substrate 100. The bottom electrodes BE may have an arrangement corresponding to that of the landing pads LP.

The capacitors CA may further include a common top electrode TE, which is provided on the insulating pattern 146 to cover the bottom electrodes BE, and a dielectric layer 150 that is interposed between the bottom electrodes BE and the top electrode TE. The top electrode TE may cover a plurality of the bottom electrodes BE and hence may serve as a common electrode of a DRAM device. In the case where the bottom electrodes BE have a hollow cylindrical shape, the top electrode TE may be provided to face an inner side surface of each of the bottom electrodes BE. The dielectric layer 150 may conformally cover top and side surfaces of each of the bottom electrodes BE and may include a portion extending between the top electrode TE and the insulating pattern 146.

The bottom electrodes BE and the top electrode TE may include at least one of doped silicon, metals, or metal compounds. The dielectric layer 150 may be formed of or include at least one of metal oxides (e.g., $HfO_2$, $ZrO_2$, $Al_2O_3$, $La_2O_3$, $Ta_2O_3$, and $TiO_2$) or perovskite dielectric materials (e.g., $SrTiO_3$ (STO), $(Ba,Sr)TiO_3$ (BST), $BaTiO_3$, PZT, and PLZT) and may be provided in a single- or multi-layered structure.

The following is the description for the peripheral circuit region PR of the substrate 100. The first interlayer insulating layer 126 and the second interlayer insulating layer 136 may be sequentially stacked on the substrate 100 in the peripheral circuit region PR. The first and second interlayer insulating layers 126 and 136 in the peripheral circuit region PR may be extensions of the first and second interlayer insulating layers 126 and 136 that are provided in the cell region CR. A conductive pad CP and a bottom electrode BE may be provided on the second interlayer insulating layer 136. Although not shown, the bottom electrode BE that is provided in the peripheral circuit region PR may be electrically connected to the bit lines BL through the conductive pad CP and additional contacts (not shown).

FIGS. 11A through 20A are plan views illustrating a method of fabricating a semiconductor device according to other example embodiments of the inventive concepts, and FIGS. 11B through 20B are sectional views taken along lines I-I' of FIGS. 11A through 20A, respectively. In the following description of FIGS. 11A-20A and 11B-20B, elements previously described with reference to FIGS. 1A-9A and 1B-9B may be identified by a similar or identical reference number without repeating an overlapping description thereof, for the sake of brevity.

Figure 11A:
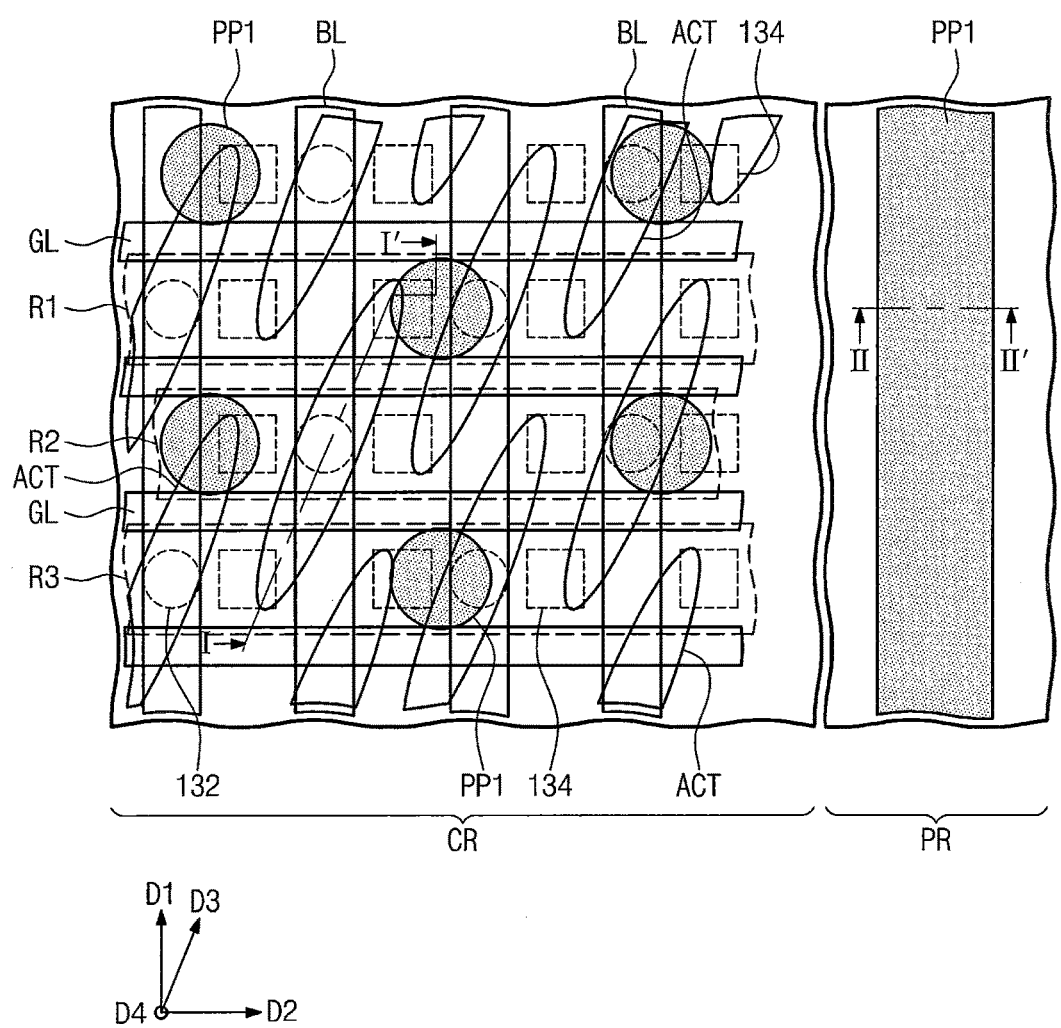
Figure 11B:
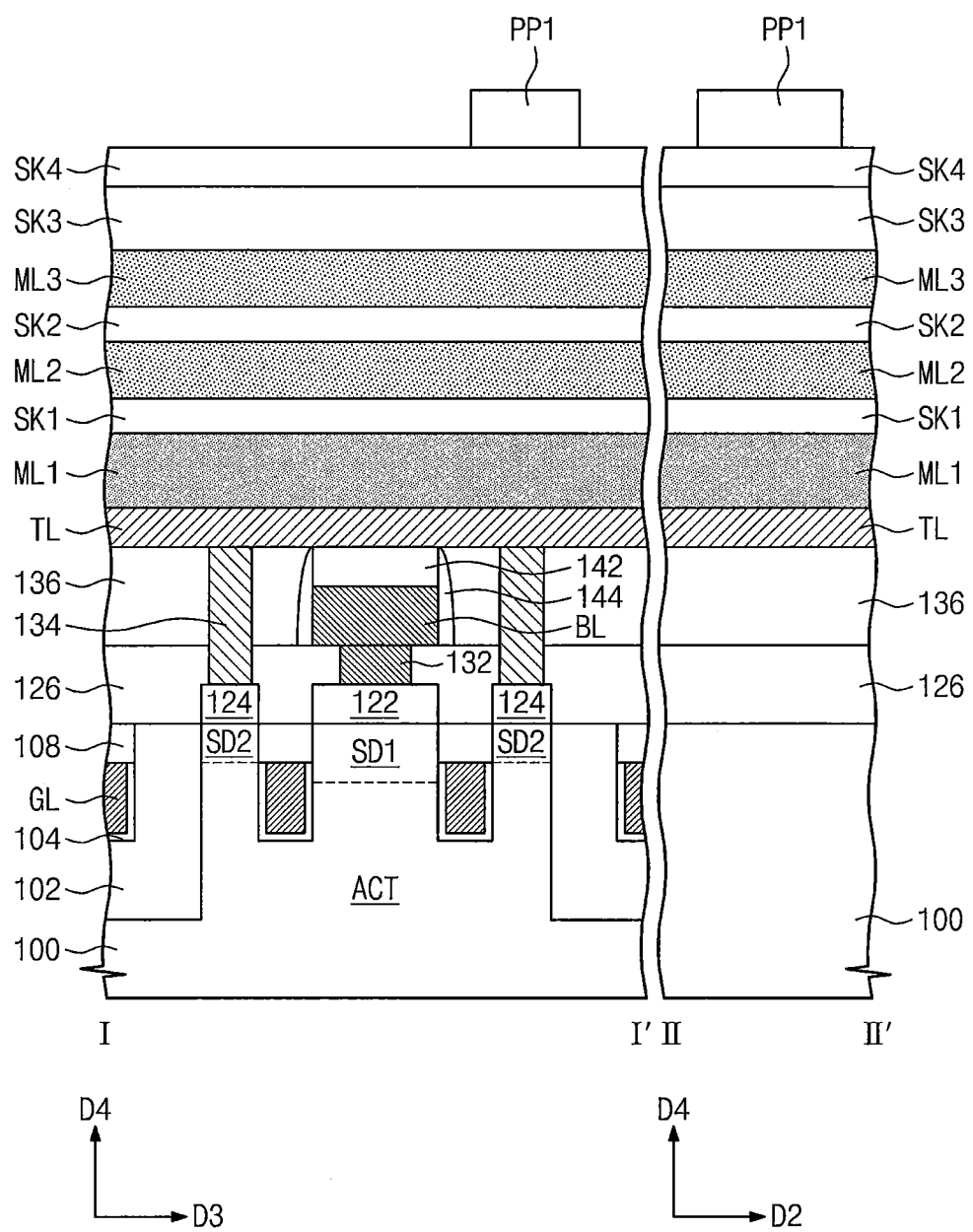

Referring to FIGS. 11A and 11B, a substrate 100 with a cell region CR and a peripheral circuit region PR is provided. Steps for forming the cell region CR of the substrate 100 will be described first below.

A device isolation layer 102 may be formed on the cell region CR of the substrate 100 to define the active regions ACT. The substrate 100 may be a semiconductor substrate (for example, a silicon wafer, a germanium wafer, or a silicon-germanium wafer). The device isolation layer 102 may be formed using, for example, a shallow trench isolation (STI) process. The device isolation layer 102 may comprise, for example, a silicon oxide layer, a silicon nitride layer, and/or a silicon oxynitride layer. When viewed in a plan view, each of the active regions ACT may have a bar shape, and a longitudinal axis of each active region ACT may be parallel to a third direction D3 that is at an angle to first and second directions D1 and D2. All of the first to third directions D1, D2, and D3 may be parallel to a top surface of the substrate 100, and the second direction D2 may cross the first direction D1. As shown in FIG. 11A, the second direction D2 may be perpendicular to the first direction D1.

Gate lines GL may be formed in the substrate 100 to cross the active regions ACT. The gate lines GL may extend parallel to the second direction D2 and may be spaced apart from each other in the first direction D1. Gate insulating patterns 104 may be formed between the gate lines GL and the active regions ACT and between the gate lines GL and the device isolation layer 102. First capping patterns 108 may be formed on top surfaces of the gate lines GL, respectively. The gate lines GL and the gate insulating patterns 104 may be formed by etching the substrate 100 and the device isolation layer 102 to form line-shaped trenches that extend parallel to the second direction D2, forming a gate insulating layer on the substrate 100 to partially fill each of the trenches, forming a first conductive layer on the substrate 100 to fill the remaining spaces of the trenches, and etching the first conductive layer to form a first conductive pattern with a desired thickness in each of the trenches. The etching process may be performed to remove an exposed portion of the insulating layer, which is not covered with the conductive layer, and to thereby form the gate insulating patterns 104 in the respective trenches. The first capping patterns 108 may be formed by forming a first capping layer on the substrate 100 and gate lines GL and then planarizing the first capping layer to expose the top surface of the substrate 100.

An ion implantation process may be performed on the active regions ACT to form a first doped region SD1 and second doped regions SD2 that are spaced apart from each other by the first doped region SD1. For example, the ion implantation process may be performed to form the first doped region SD1 in a portion of each active region ACT that is between an adjacent pair of the gate lines GL. A pair of second doped regions SD2 may be provided in end portions of the active region ACT that are spaced apart from each other by the pair of gate lines GL. The first and second doped regions SD1 and SD2 may be doped to have the same conductivity type (e.g., n-type). The first doped region SD1 may extend to a greater depth in the substrate 100 than the second doped regions SD2, when measured from the top surface of the substrate 100.

A doped poly-silicon layer, a doped single crystalline silicon layer, or a conductive layer may be formed on the substrate 100 and then may be patterned to form a first pad 122 and second pads 124. The first pad 122 may be connected to the first doped region SD1, and the second pads 124 may be connected to the respective second doped regions SD2. In the case where the first pad 122 and the second pads 124 comprise a doped semiconductor layer, the first pad 122 and the second pads 124 may be doped to have the same conductivity type as the first and second doped regions SD1 and SD2.

A first interlayer insulating layer 126 may be formed on the first and second pads 122 and 124. The first interlayer insulating layer 126 may be formed by a chemical vapor deposition process. The first interlayer insulating layer 126 may comprise a silicon oxide layer, a silicon nitride layer, or a silicon oxynitride layer.

A bit line contact hole (not shown) may penetrate the first interlayer insulating layer 126 and to expose the first pad 122. A second conductive layer may be formed on the first interlayer insulating layer 126. The second conductive layer may fill the bit line contact hole. For example, the second conductive layer may include a conductive material (e.g., metals and doped semiconductor materials). A second capping layer may be formed on the second conductive layer. As an example, the second capping layer may include at least one of a silicon nitride layer, a silicon oxide layer, and a silicon oxynitride layer. The second capping layer and the second conductive layer may be patterned to form a bit line BL and a second capping pattern 142 on the bit line BL. A bit line contact 132 may be formed in the bit line contact hole. The bit line BL and the bit line contact 132 may both be formed by patterning the second conductive layer and may be integral with each other. A spacer layer may be conformally deposited on the first interlayer insulating layer 126 and then may be anisotropically etched to form bit line spacers 144 covering opposed side surfaces of the bit lines BL. The bit line spacers 144 may comprise at least one of a silicon nitride layer, a silicon oxide layer, or a silicon oxynitride layer.

A second interlayer insulating layer 136 may be formed on the first interlayer insulating layer 126. The second interlayer insulating layer 136 may be formed by a chemical vapor deposition process. The second interlayer insulating layer 136 may comprise, for example, a silicon oxide layer, a silicon nitride layer, or a silicon oxynitride layer. Buried contact holes (not shown) may penetrate the second interlayer insulating layer 136 and the first interlayer insulating layer 126 to expose the respective second pads 124. A third conductive layer may be formed on the second interlayer insulating layer 136 to fill the buried contact holes and may be planarized to expose a top surface of the second interlayer insulating layer 136 in order to form buried contacts 134 in the respective buried contact holes.

The peripheral circuit region PR of the substrate 100 may be formed as follows. The first interlayer insulating layer 126 and the second interlayer insulating layer 136 may be sequentially formed on the substrate 100. The first and second interlayer insulating layers 126 and 136 may be formed during the formation of the first and second interlayer insulating layers 126 and 136 in the cell region CR using the same processing steps.

As shown in FIG. 11B, an etch-target layer TL, a lower mold layer ML1, a first mask layer SK1, a middle mold layer ML2, a second mask layer SK2, an upper mold layer ML3, a third mask layer SK3, and a fourth mask layer SK4 may be sequentially formed on the second interlayer insulating layer 136 in both the cell region CR and the peripheral region PR. As an example, the lower mold layer ML1 may be an amorphous carbon layer. The middle mold layer ML2 and the upper mold layer ML3 may comprise the same material; for example, they may be a spin-on-hard mask (SOH) layer or a spin-on carbon (SOC) layer. The first to third mask layers SK1, SK2, and SK3 may comprise the same material; for example, they may be a silicon oxide layer or a silicon oxynitride layer. The fourth mask layer SK4 may comprise a material different from those of the first to third mask layers SK1, SK2, and SK3; for example, it may be a silicon oxide layer or a silicon oxynitride layer.

First photoresist patterns PP1 may be formed on the fourth mask layer SK4. The first photoresist patterns PP1 may be formed by a first photolithography process. The first photoresist patterns PP1 may be formed on both the cell region CR and the peripheral circuit region PR.

In the cell region CR, when viewed in plan view, the first photoresist patterns PP1 may be arranged in the first and second directions D1 and D2 to form a plurality of rows and a plurality of columns. For example, referring to FIG. 11A, the first photoresist patterns PP1 may be disposed in first, second, and third rows R1, R2, and R3. The first to third rows R1, R2, and R3 may be spaced apart from each other in the first direction D1. The first photoresist patterns PP1 of the first and third rows R1 and R3 may be symmetric to each other and the second row R2 may be interposed therebetween, and the first photoresist patterns PP1 in the second row R2 may be offset from the first photoresist patterns PP1 in the first and third rows R1 and R3. In other words, each of the first photoresist patterns PP1 in the first row R1 may be aligned in the first direction D1 with a respective one of the first photoresist patterns PP1 in the third row R3, and lines that are parallel to the first direction D1 that run through the center of each of the first photoresist patterns PP1 in the second row R2 may pass between two adjacent ones of the first photoresist patterns PP1 in the first row R1. The first photoresist patterns PP1 may be formed to partially overlap respective ones of the buried contacts 134, when viewed in a plan view.

In the peripheral circuit region PR, when viewed in plan view, the first photoresist pattern PP1 may have a bar shape extending parallel to the first direction D1.

Figure 12A:
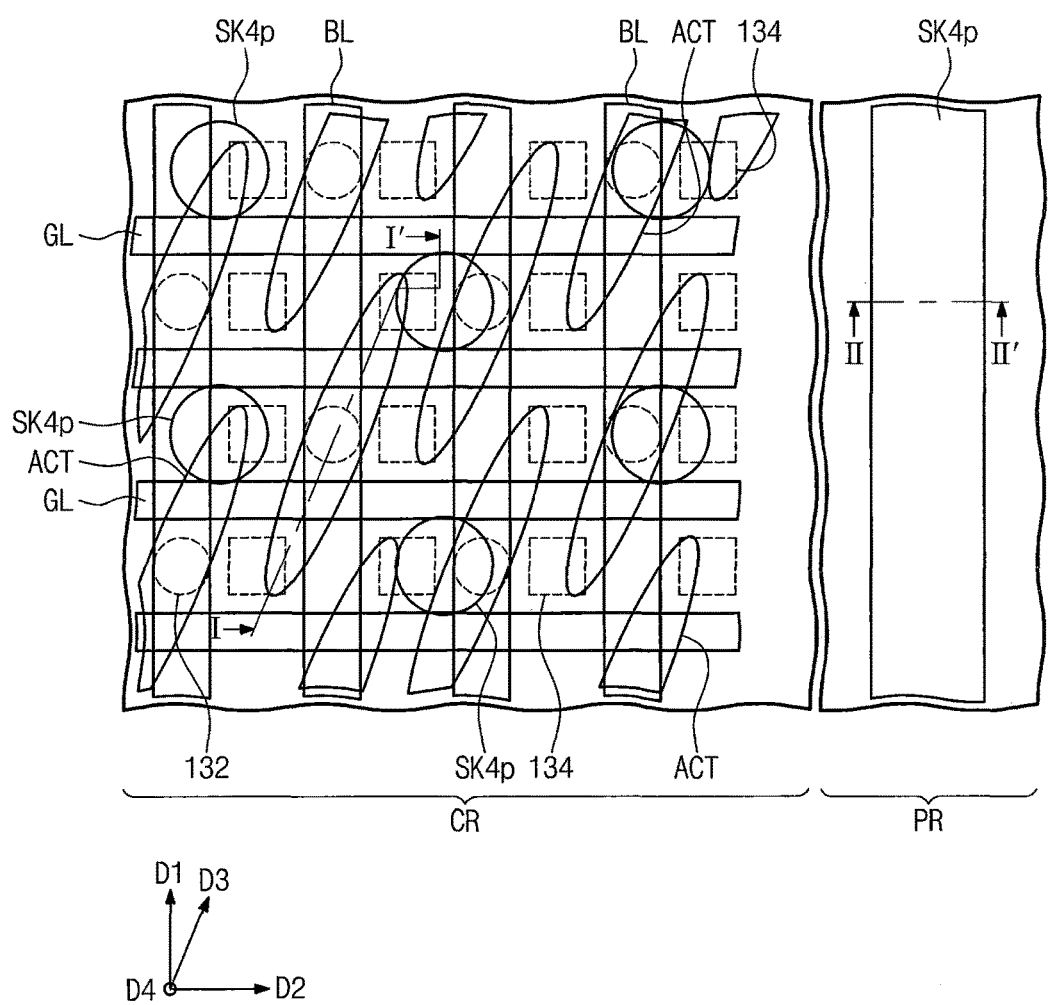
Figure 12B:
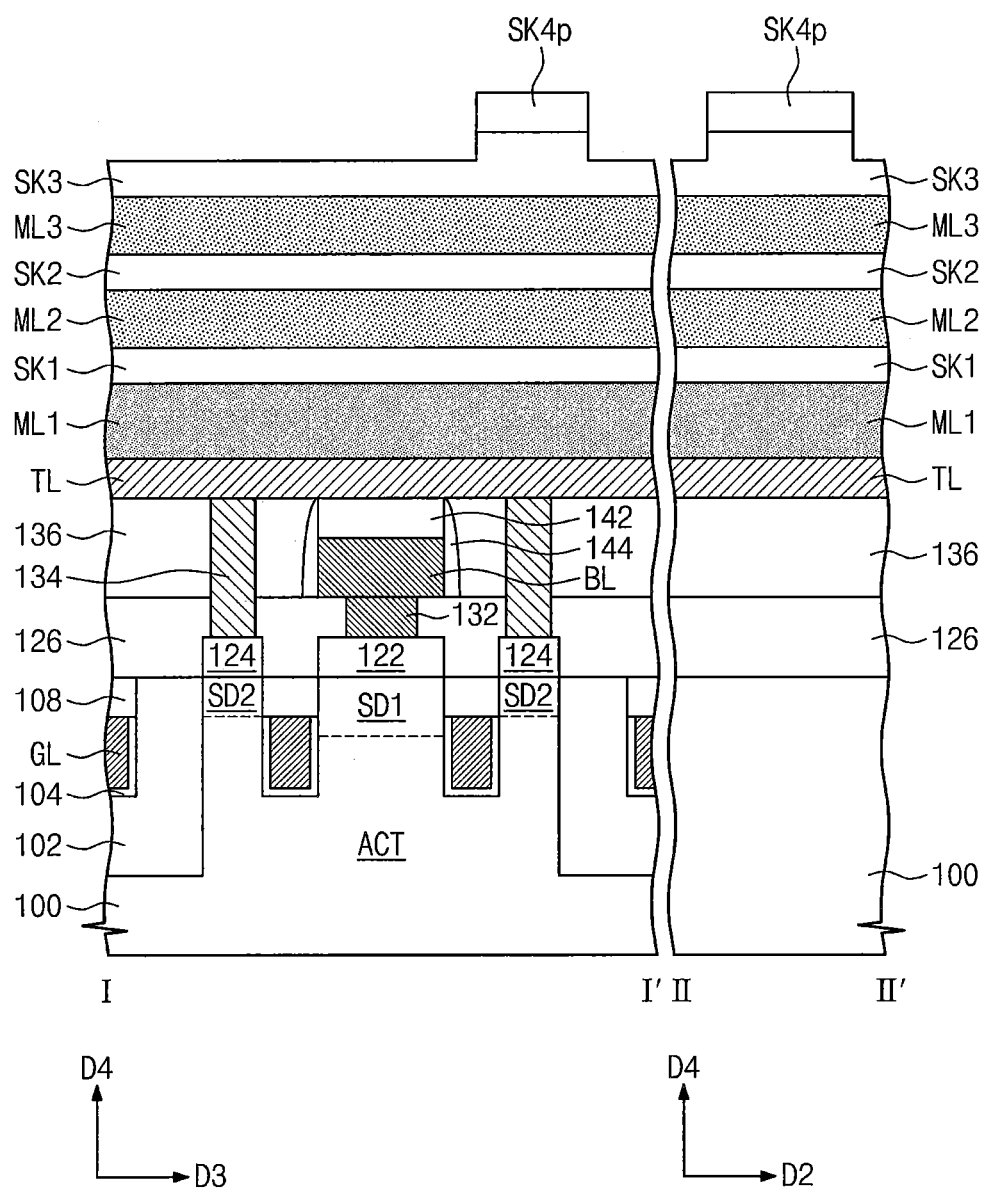

Referring to FIGS. 12A and 12B, the fourth mask layer SK4 may be etched using the first photoresist patterns PP1 as an etch mask to form fourth mask patterns SK4p. When viewed in plan view, the fourth mask patterns SK4p may have a shape corresponding to that of the first photoresist patterns PP1. Thereafter, the third mask layer SK3 may be partially etched using the fourth mask patterns SK4p as an etch mask. In example embodiments, the etching of the third mask layer SK3 may be performed in such a way that the top surface of the upper mold layer ML3 is not exposed.

Figure 13A:
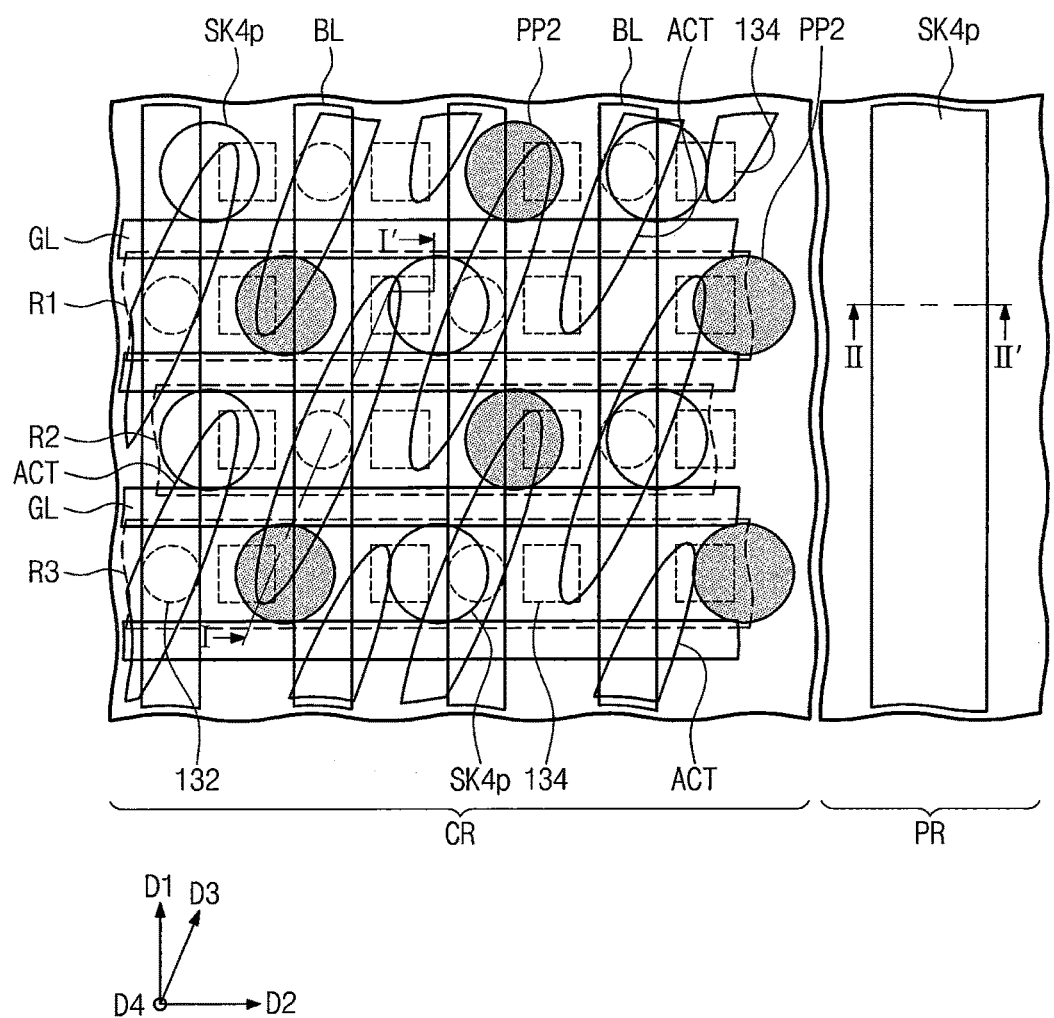
Figure 13B:
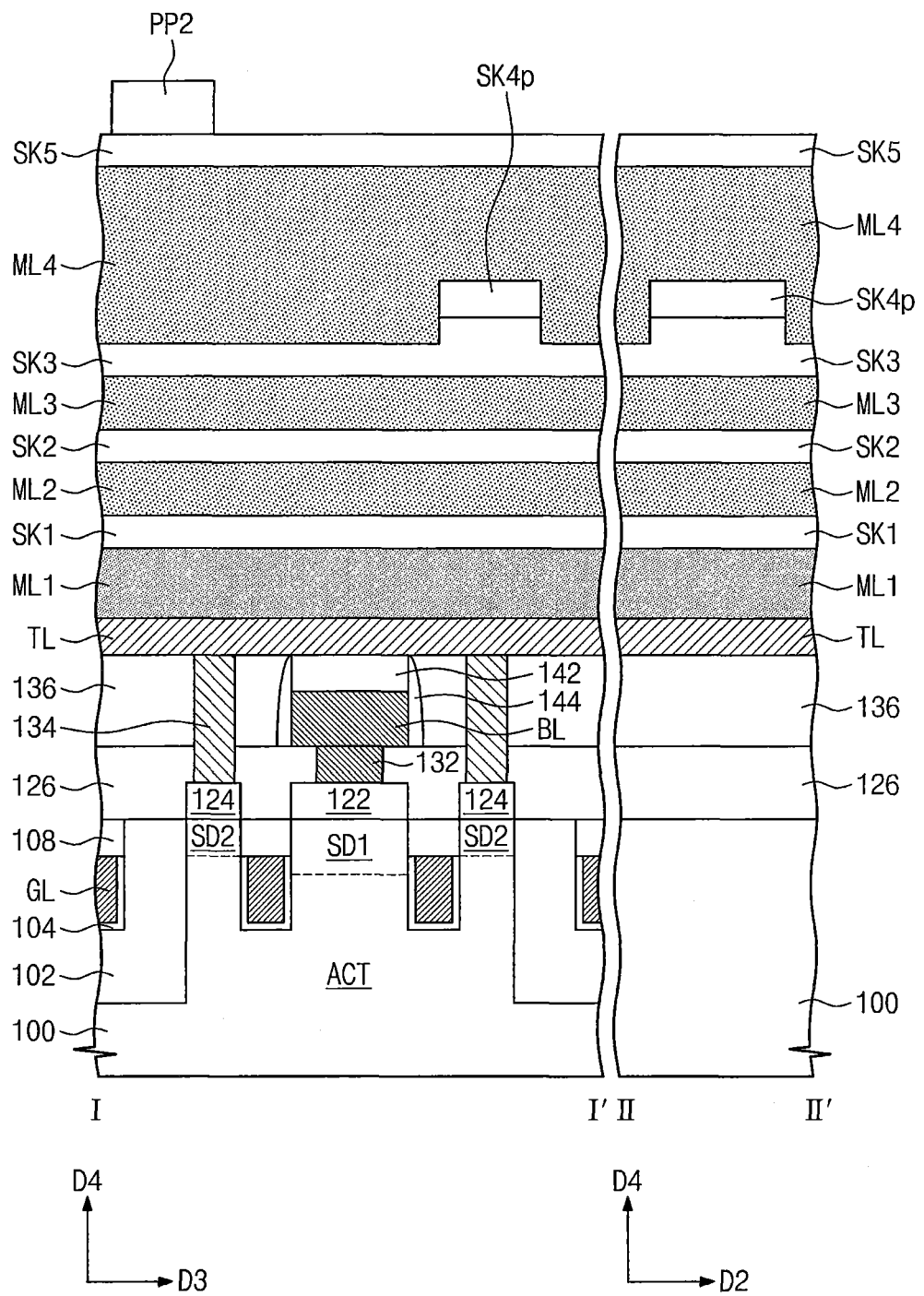

Referring to FIGS. 13A and 13B, an additional mold layer ML4 may be formed on the third mask layer SK3 to cover the fourth mask patterns SK4p, and a fifth mask layer SK5 may be formed on the additional mold layer ML4. As an example, the additional mold layer ML4 may be a spin-on-hard mask (SOH) layer or a spin-on carbon (SOC) layer. The fifth mask layer SK5 may be a silicon oxide layer or a silicon oxynitride layer. Second photoresist patterns PP2 may be formed on the fifth mask layer SK5. The second photoresist patterns PP2 may be formed by a second photolithography process.

As shown in FIG. 13A, when viewed in plan view, the second photoresist patterns PP2 may be arranged in the first and second directions D1 and D2 to form a plurality of rows and a plurality of columns. As an example, the second photoresist patterns PP2 may constitute first, second, and third rows R1, R2, and R3, similar to the fourth mask patterns SK4p. The first to third rows R1, R2, and R3 may be spaced apart from each other in the first direction D1. Here, the second photoresist patterns PP2 of the first and third rows R1 and R3 may be disposed to be symmetric to each other about the second row R2 that is interposed therebetween.

The second photoresist patterns PP2 may not overlap the fourth mask patterns SK4p, when viewed in a plan view. As an example, when viewed in plan view, one of the second photoresist patterns PP2 that is part of the third row R3 may be formed adjacent one of the fourth mask patterns SK4p that is part of the third row R3. The second photoresist pattern PP2 and the fourth mask pattern SK4p may be spaced part from each other in the second direction D2. The second photoresist patterns PP2 may partially overlap respective buried contacts 134, when viewed in a plan view.

In example embodiments, the second photoresist patterns PP2 may not be formed in the peripheral circuit region PR. However, example embodiments of the inventive concepts may not be limited thereto. For example, in other example embodiments, the second photoresist patterns PP2 may be formed in the peripheral circuit region PR but spaced apart from the fourth mask pattern SK4p, when viewed in a plan view.

Figure 14A:
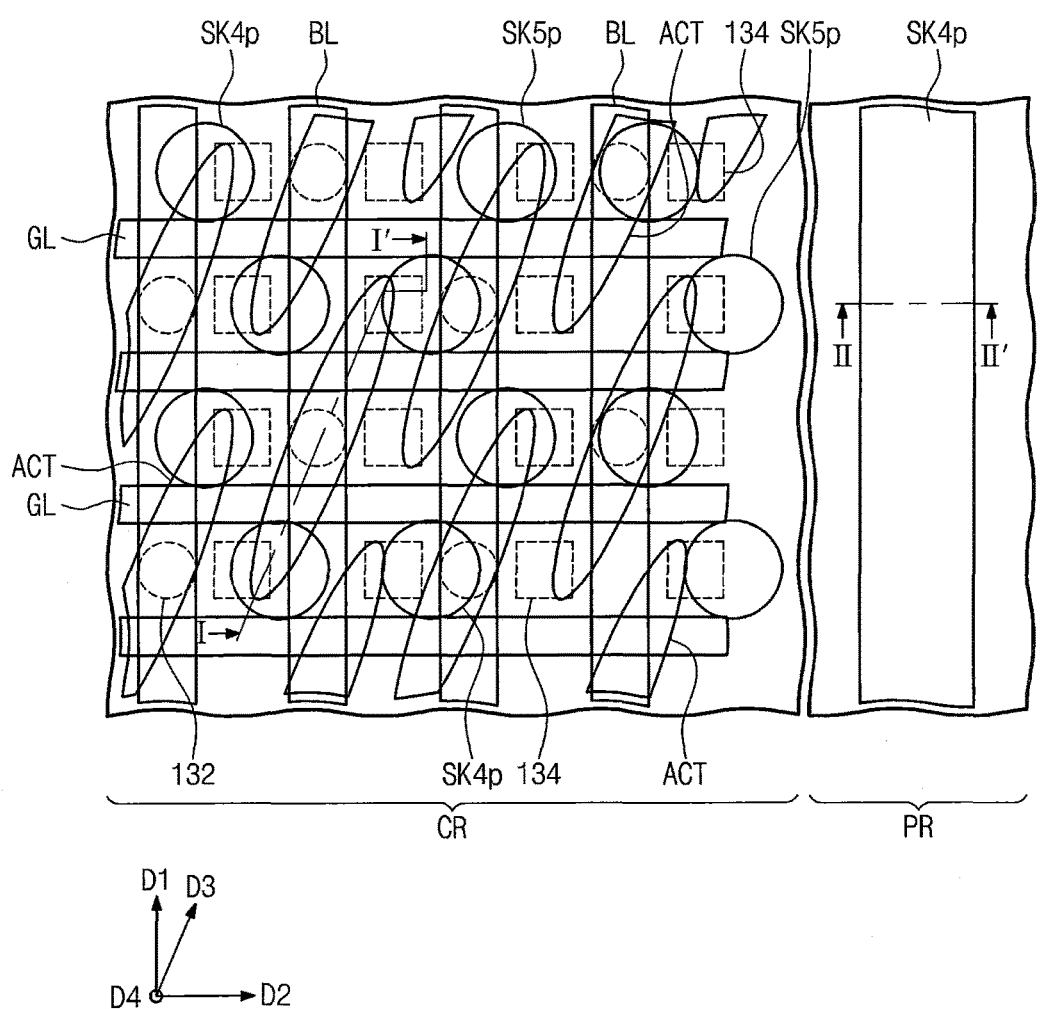
Figure 14B:
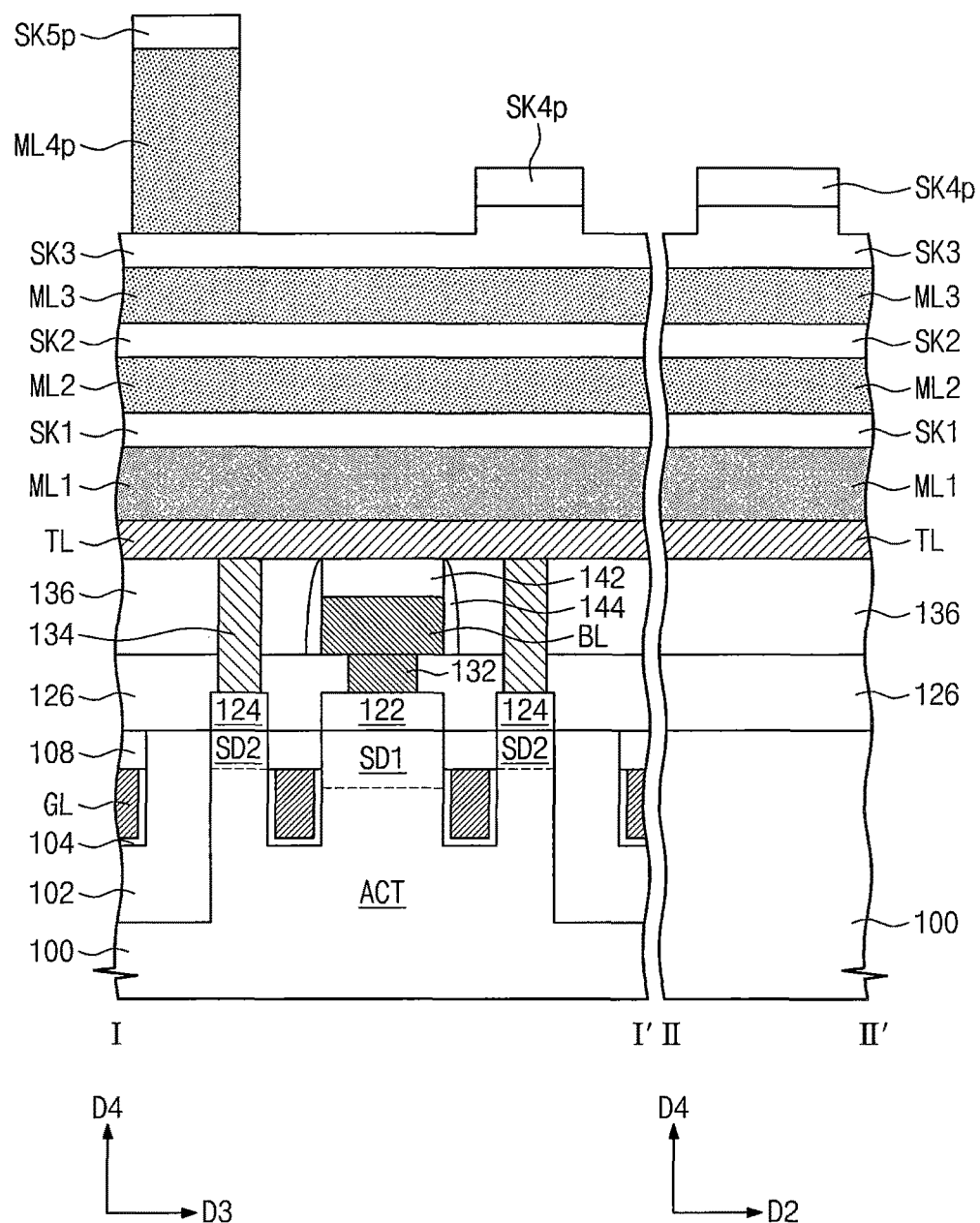

Referring to FIGS. 14A and 14B, the fifth mask layer SK5 may be etched using the second photoresist patterns PP2 as an etch mask to form fifth mask patterns SK5p. When viewed in plan view, the fifth mask patterns SK5p may have a shape corresponding to that of the second photoresist patterns PP2. Next, the additional mold layer ML4 may be etched using the fifth mask patterns SK5p as an etch mask to form fourth mold patterns ML4p. When viewed in plan view, the fourth mold patterns ML4p may have a shape corresponding to that of the fifth mask patterns SK5p. The fourth mask patterns SK4p and the third mask layer SK3 may be formed of materials having an etch selectivity with respect to the additional mold layer ML4, and thus, they may remain after the formation of the fourth mold patterns ML4p.

Figure 15A:
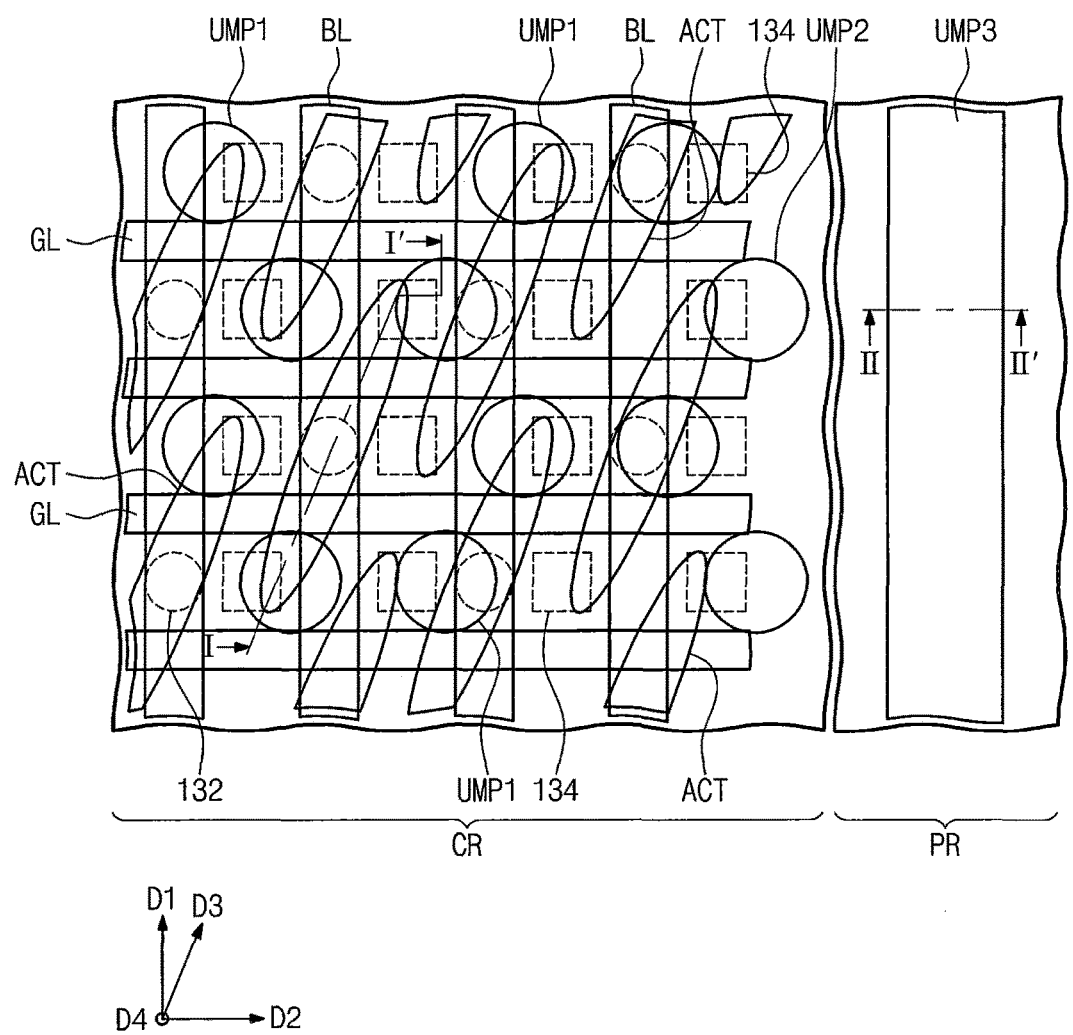
Figure 15B:
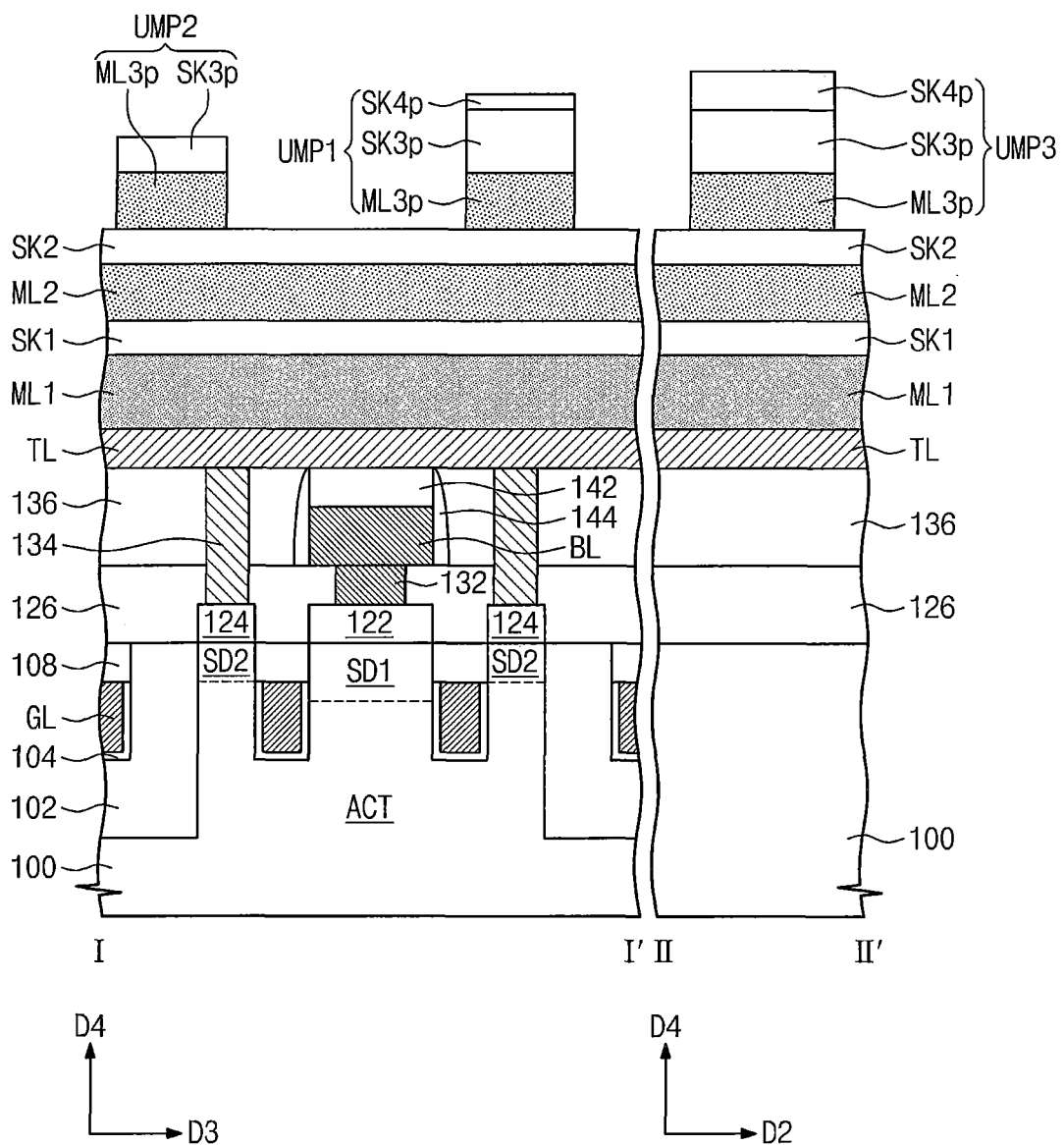

Referring to FIGS. 15A and 15B, the third mask layer SK3 and the upper mold layer ML3 may be sequentially etched using the fifth mask patterns SK5p, the fourth mold patterns ML4p, and the fourth mask patterns SK4p as an etch mask to form first upper mold patterns UMP1, second upper mold patterns UMP2, and a peripheral upper mold pattern UMP3. Each of the first upper mold patterns UMP1 and the peripheral upper mold pattern UMP3 may include a third mold pattern ML3p, a third mask pattern SK3p, and the fourth mask pattern SK4p that are sequentially stacked on the substrate 100. Each of the second upper mold patterns UMP2 may include the third mold pattern ML3p and the third mask pattern SK3p that are sequentially stacked on the substrate 100. The first and second upper mold patterns UMP1 and UMP2 may be formed in the cell region CR, and the peripheral upper mold pattern UMP3 may be formed in the peripheral circuit region PR.

In detail, the third mask layer SK3 may be etched using the fifth mask patterns SK5p, the fourth mold patterns ML4p and the fourth mask patterns SK4p as an etch mask to form the third mask patterns SK3p. During the formation of the third mask patterns SK3p, the fifth mask patterns SK5p may be wholly removed. However, since the fourth mask patterns SK4p has an etch selectivity with respect to the third mask pattern SK3p, they may be partially etched in the etching process for forming the third mask patterns SK3p and hence the fourth mask patterns SK4p may remain on the third mask patterns SK3p.

Next, the upper mold layer ML3 may be etched using the third mask patterns SK3p as an etch mask to form third mold patterns ML3p. The fourth mold patterns ML4p may be completely removed during the formation of the third mold patterns ML3p. The third mask patterns SK3p of the second upper mold patterns UMP2 may be partially etched.

Here, a ratio of an etched volume to a total volume may be smaller for the fourth mask pattern SK4p of the peripheral upper mold pattern UMP3 than for the fourth mask patterns SK4p of the first upper mold patterns UMP1. This is because a size (e.g., width) of the peripheral upper mold pattern UMP3 is greater than those of the first upper mold patterns UMP1.

In the present embodiments, the first and second upper mold patterns UMP1 and UMP2 may be formed using mask patterns which are formed by different photolithography processes. Accordingly, there may be a difference in a vertical level between top surfaces of the first and second upper mold patterns UMP1 and UMP2 and the peripheral upper mold pattern UMP3. For example, the top surface of the peripheral upper mold pattern UMP3 may be positioned at a higher level above the substrate 100 than those of the first upper mold patterns UMP1. Further, the top surfaces of the first upper mold patterns UMP1 may be positioned at a higher level above the substrate 100 than those of the second upper mold patterns UMP2.

Figure 16A:
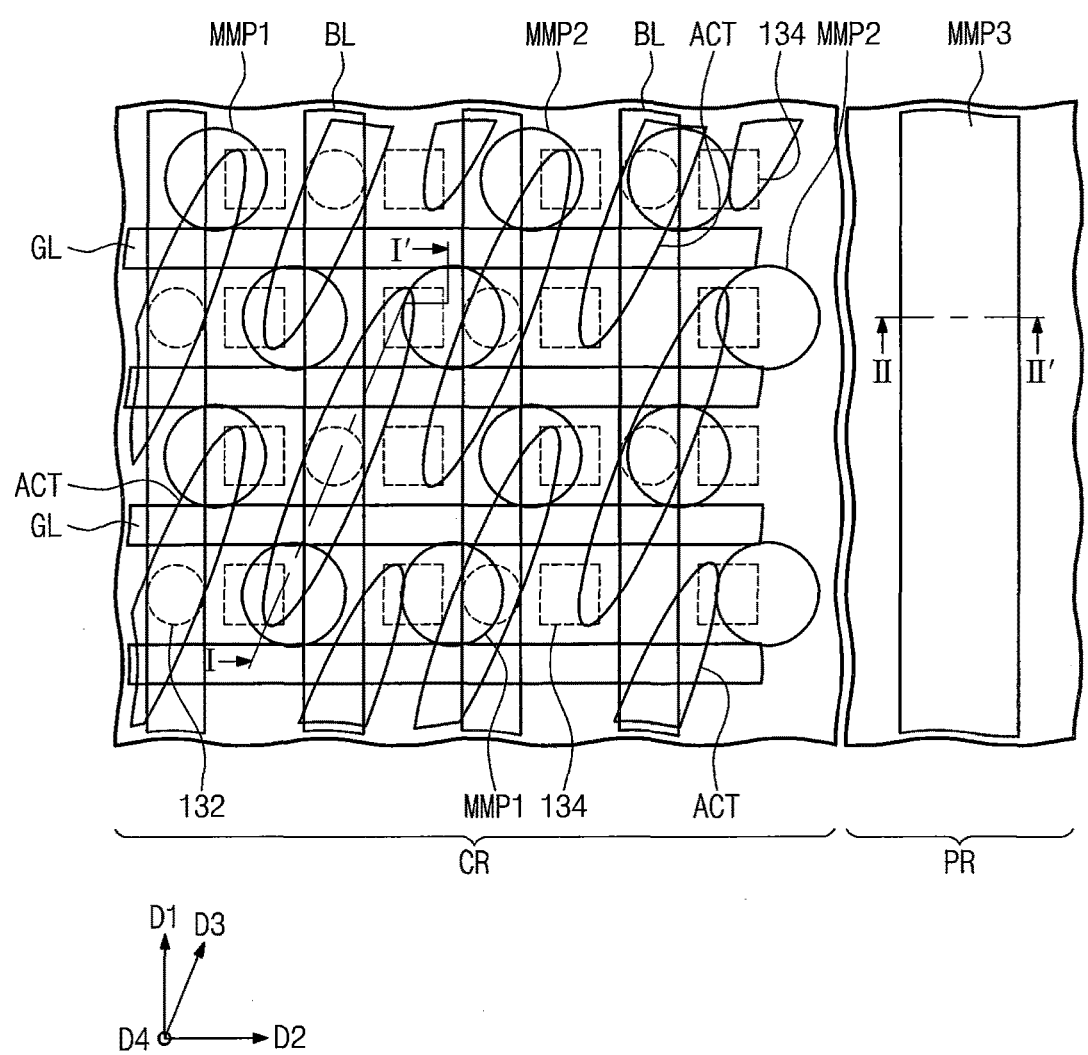
Figure 16B:
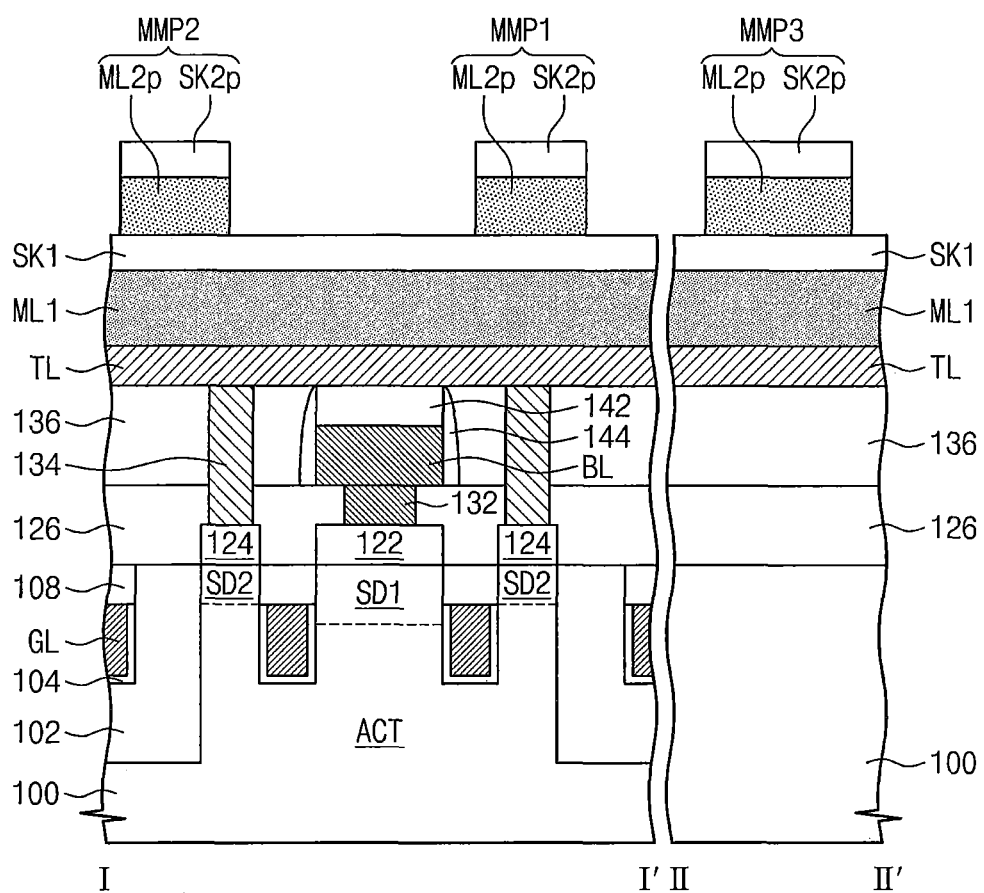

Referring to FIGS. 16A and 16B, the second mask layer SK2 and the middle mold layer ML2 may be sequentially etched using the first and second upper mold patterns UMP1 and UMP2 and the peripheral upper mold pattern UMP3 as an etch mask to form first middle mold patterns MMP1, second middle mold patterns MMP2, and peripheral middle mold pattern MMP3. Each of the first, second, and peripheral middle mold patterns MMP1, MMP2, and MMP3 may include a second mold pattern ML2p and a second mask pattern SK2p that are sequentially stacked on the substrate 100. When viewed in plan view, the first middle mold patterns MMP1 may have a shape corresponding to that of the first upper mold patterns UMP1. The second middle mold patterns MMP2 may have a shape corresponding to that of the second upper mold patterns UMP2. The peripheral middle mold pattern MMP3 may have a shape corresponding to that of the peripheral upper mold pattern UMP3.

In detail, the second mask layer SK2 may be etched using the first and second upper mold patterns UMP1 and UMP2 and the peripheral upper mold pattern UMP3 as an etch mask to form the second mask patterns SK2p. Next, the middle mold layer ML2 may be etched using the second mask patterns SK2p as an etch mask to form the second mold patterns ML2p.

The first, second, and peripheral middle mold patterns MMP1, MMP2, and MMP3 may have the top surfaces positioned at substantially the same level (i.e., at the same height in direction D4 above the substrate 100). In other words, the second mask layer SK2 and the middle mold layer ML2 may be formed below the first and second upper mold patterns UMP1 and UMP2 and the peripheral upper mold pattern UMP3, and thus, the first, second, and peripheral middle mold patterns MMP1, MMP2, and MMP3 may have top surfaces positioned at substantially the same level.

Figure 17A:
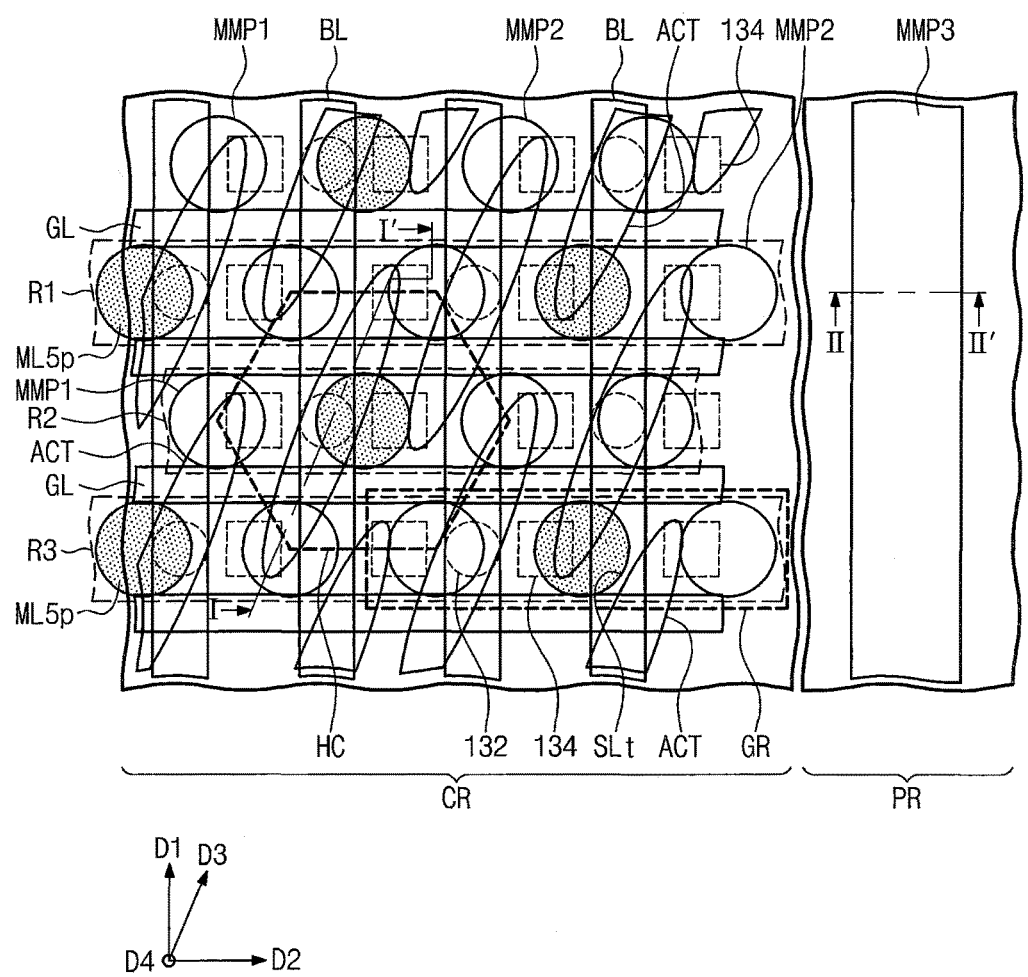
Figure 17B:
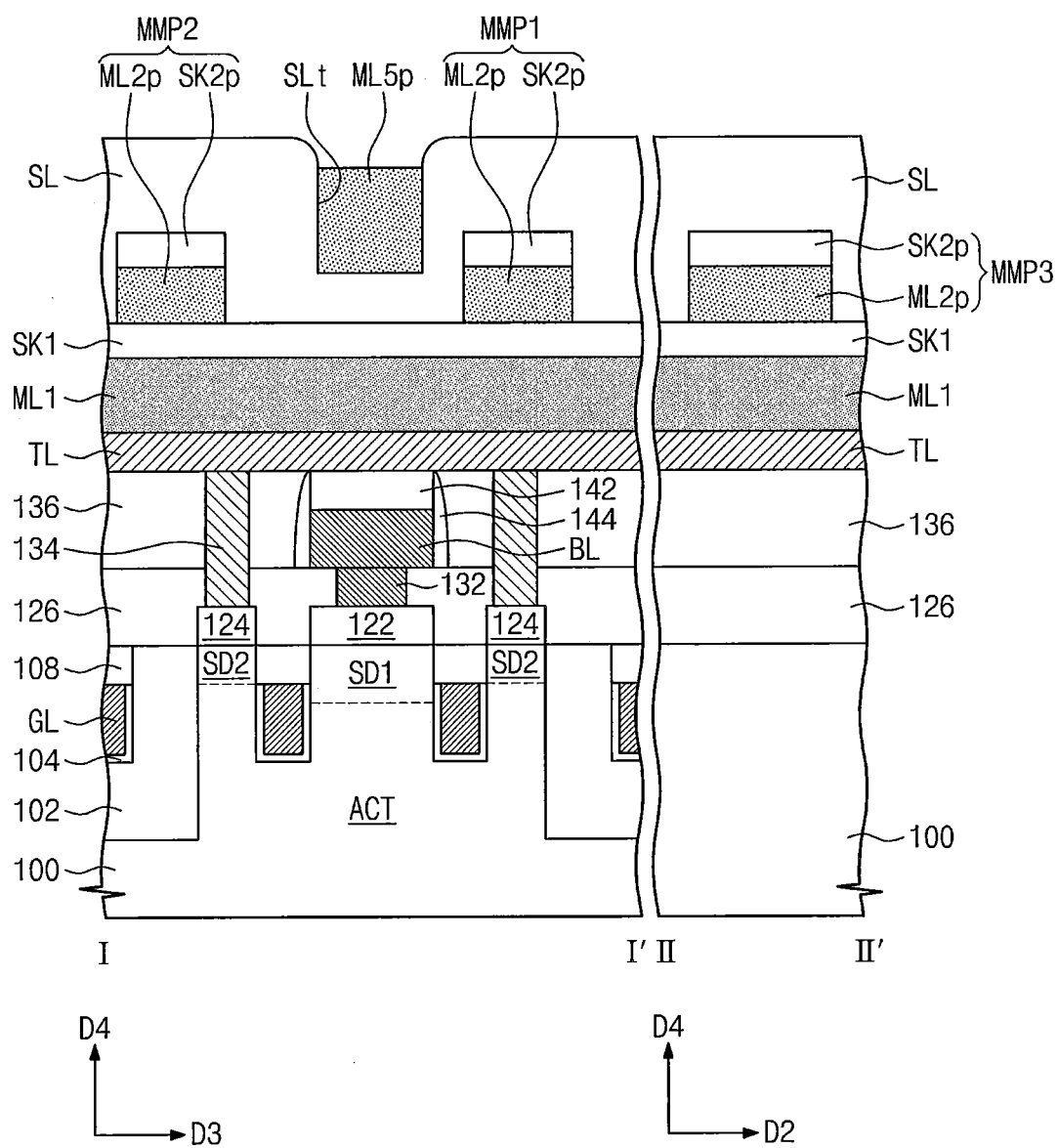

Referring to FIGS. 17A and 17B, a spacer layer SL may be formed to conformally cover the first, second, and peripheral middle mold patterns MMP1, MMP2, and MMP3. The spacer layer SL may define recess regions SLt between the first and second middle mold patterns MMP1 and MMP2.

As an example, when viewed in plan view, one of the first middle mold patterns MMP1 of the second row R2 may be spaced apart from one of the second middle mold patterns MMP2 of the second row R2 with the buried contact 134 interposed therebetween. In this example, the recess region SLt may be defined by the first and second middle mold patterns MMP1 and MMP2 of the second row R2. The recess region SLt may partially overlap the buried contact 134, when viewed in a plan view.

Fifth mold patterns ML5p may be formed to fill the recess regions SLt. When viewed in plan view, the fifth mold patterns ML5p may be arranged in the first and second directions D1 and D2 to form a plurality of rows and a plurality of columns. As an example, the fifth mold patterns ML5p may constitute first, second, and third rows R1, R2, and R3, similar to the first and second middle mold patterns MMP1 and MMP2. The fifth mold patterns ML5p of the first row R1 and the third row R3 may be disposed to be symmetric to each other about the second row R2 interposed therebetween.

In example embodiments, when viewed in plan view, the first and second middle mold patterns MMP1 and MMP2 of the first to third rows R1, R2, and R3 may be arranged in such a way that centers thereof are respectively positioned at vertices of a polygonal honeycomb configuration HC. The fifth mold pattern ML5p may be formed at a center of the honeycomb configuration HC.

When viewed in plan view, the first and second middle mold patterns MMP1 and MMP2 and the fifth mold patterns ML5p may be alternatingly provided in each row. For example, the first middle mold pattern MMP1, the fifth mold pattern ML5p, and the second middle mold pattern MMP2 may be sequentially arranged in the second direction D2 to constitute a first group GR. The first group GR may be repeatedly disposed in the second direction D2 in each row (e.g., the third row R3).

Figure 18A:
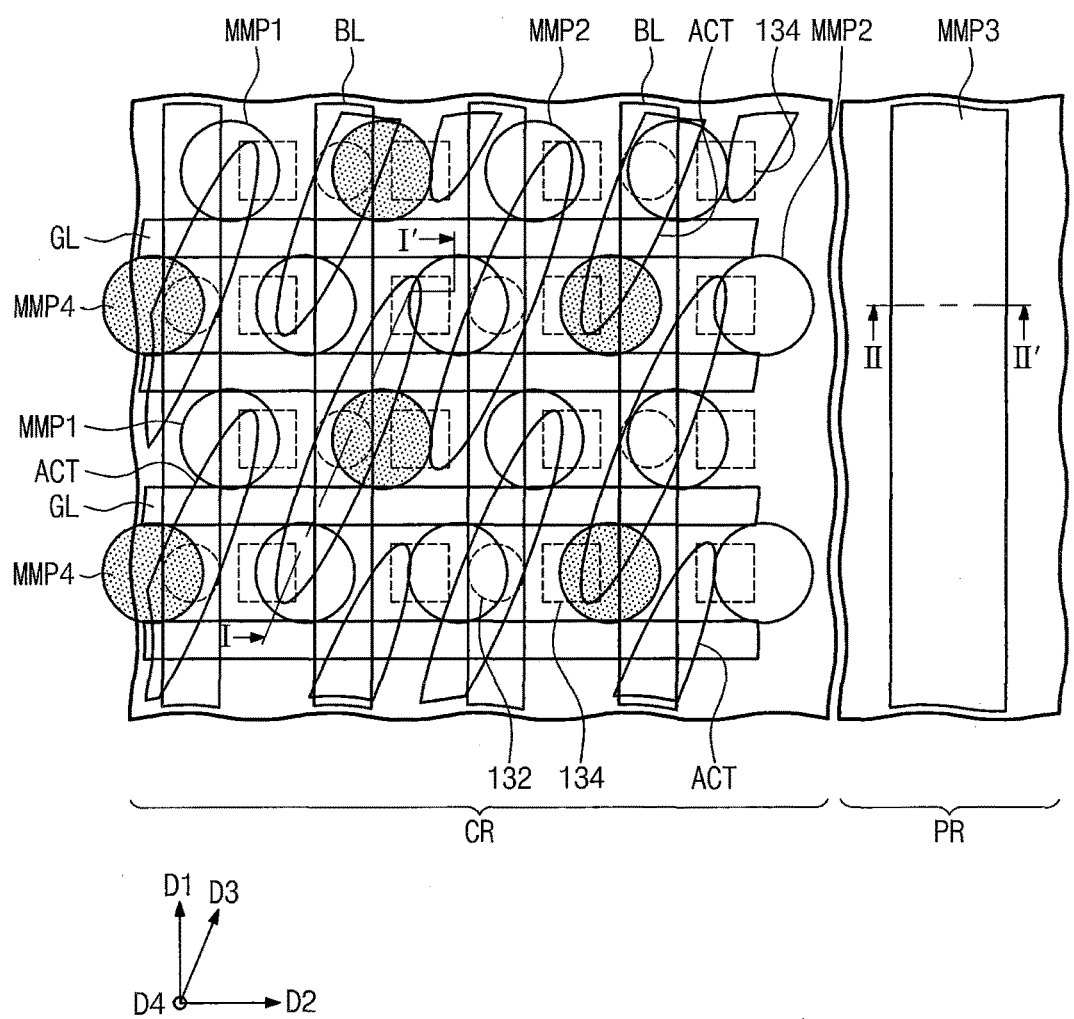
Figure 18B:
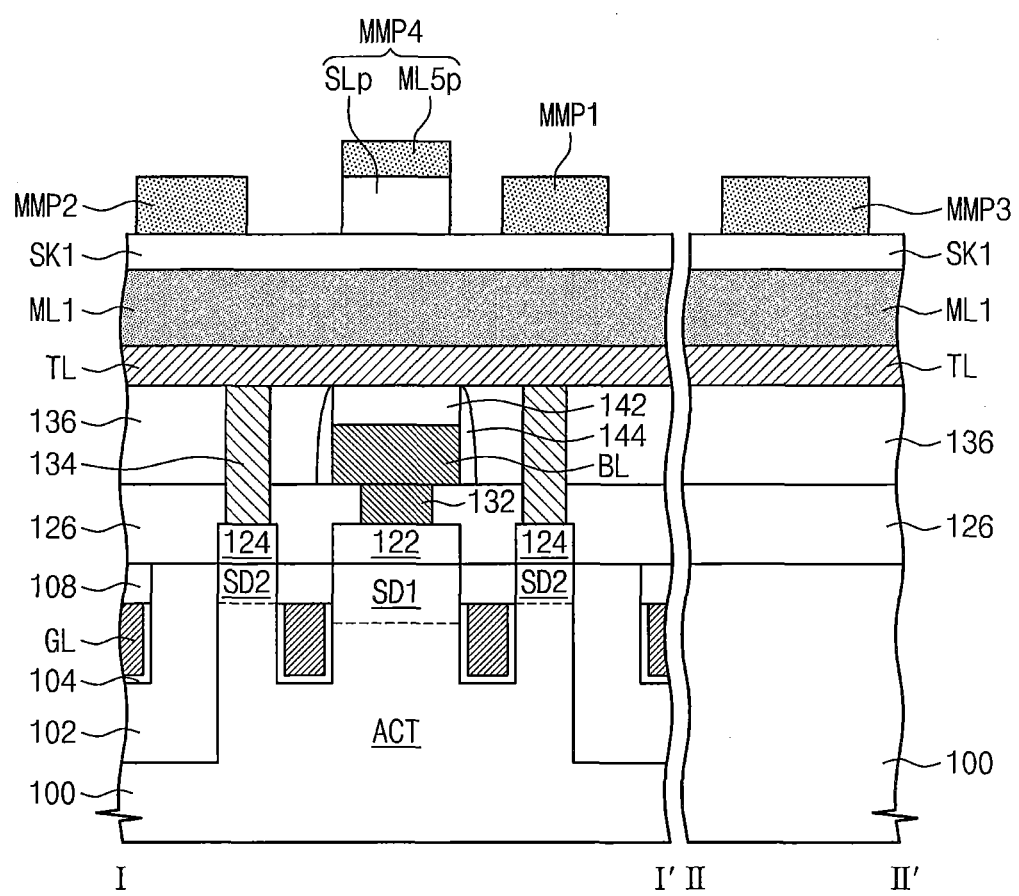

Referring to FIGS. 18A and 18B, the spacer layer SL may be anisotropically etched to form third middle mold patterns MMP4. The third middle mold pattern MMP4 may include a spacer pattern SLp and a fifth mold pattern ML5p that are sequentially stacked on the substrate 100. During the anisotropic etching of the spacer layer SL, the second mask patterns SK2p may be exposed and in this case, the second mask patterns SK2p may be etched and removed in the anisotropic etching process that is performed on the spacer layer SL. Each of the first, second, and peripheral middle mold patterns MMP1, MMP2, and MMP3 may include only the second mold pattern ML2p. Further, during the anisotropic etching process on the spacer layer SL, an exposed upper portion of the fifth mold pattern ML5p may be partially etched.

Figure 19A:
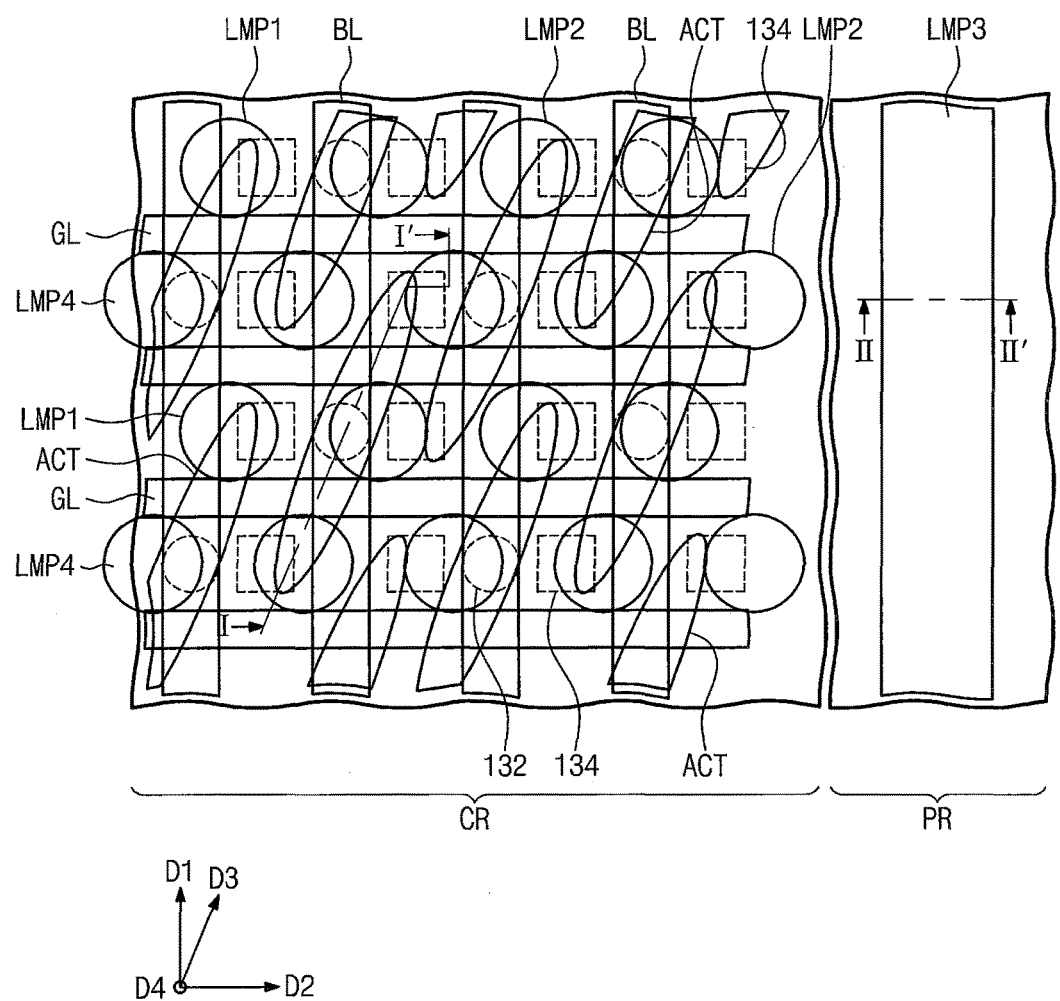
Figure 19B:
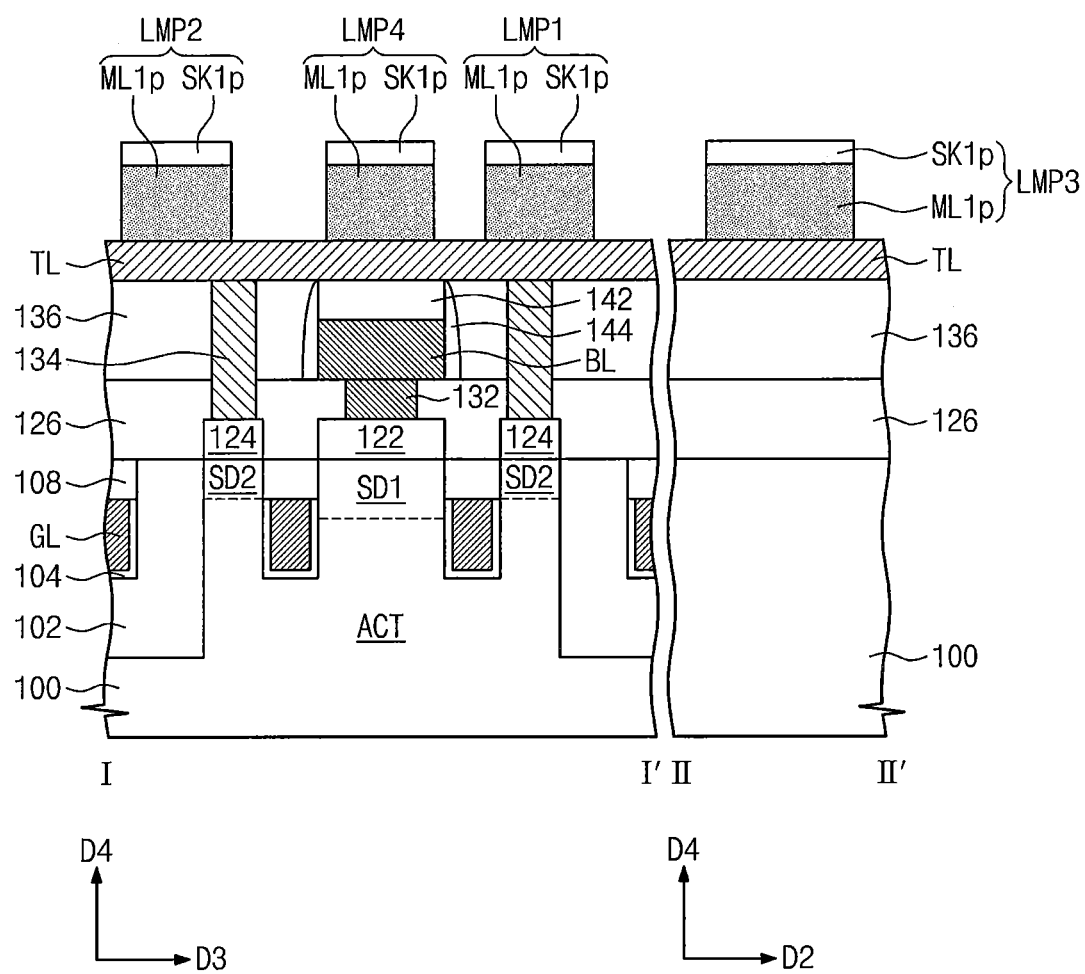

Referring to FIGS. 19A and 19B, the first mask layer SK1 and the lower mold layer ML1 may be sequentially etched using the first, second, peripheral, and third middle mold patterns MMP1, MMP2, MMP3, and MMP4 as an etch mask to form first, second, peripheral, and third lower mold patterns LMP1, LMP2, LMP3, and LMP4, respectively. Each of the first, second, peripheral, and third lower mold patterns LMP1, LMP2, LMP3, and LMP4 may include a first mold pattern ML1p and a first mask pattern SK1p that are sequentially stacked on the substrate 100.

Figure 20A:
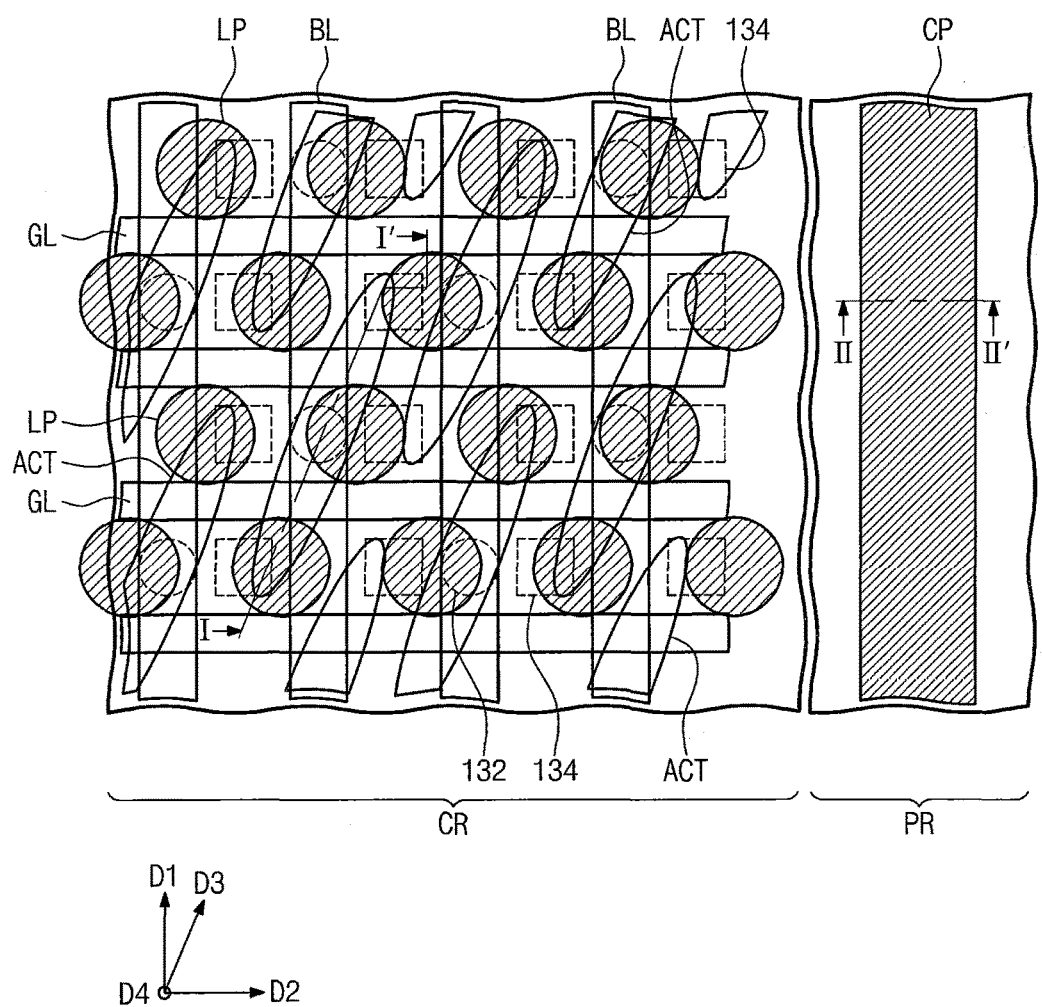
Figure 20B:
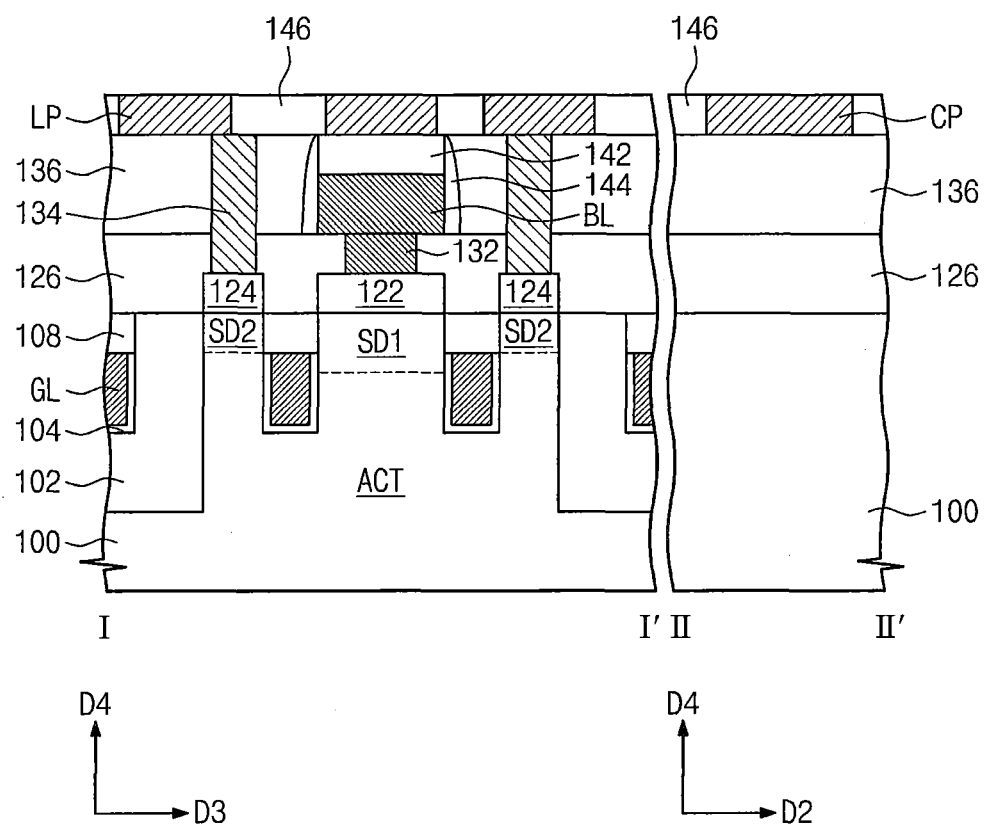

Referring to FIGS. 20A and 20B, the etch-target layer TL may be etched using the first to third lower mold patterns LMP1, LMP2, and LMP4 as an etch mask to form landing pads LP. In certain embodiments, the etch-target layer TL may be etched using the peripheral lower mold pattern LMP3 as an etch mask to form a conductive pad CP on the peripheral circuit region PR. When viewed in plan view, the landing pads LP may have a shape corresponding to that of the first to third lower mold patterns LMP1, LMP2, and LMP4. The conductive pad CP may have a shape corresponding to that of the peripheral lower mold pattern LMP3.

The landing pads LP may partially overlap the buried contacts 134, when viewed in a plan view. The landing pads LP may be electrically connected to the respective second doped regions SD2 through respective ones of the buried contacts 134. The conductive pad CP may be electrically connected to the bit line BL through an additional contact (not shown). An insulating pattern 146 may be formed to fill a gap region between the conductive patterns TLP and the conductive pad CP.

Referring back to FIGS. 10A and 10B, bottom electrodes BE may be formed on the landing pads LP, respectively, of the cell region CR. The bottom electrodes BE may be connected to the buried contacts 134, respectively, through the landing pads LP. In certain embodiments, a bottom electrode BE may be formed on the conductive pad CP of the peripheral circuit region PR.

The bottom electrodes BE may be formed by forming a fourth conductive layer on the insulating pattern 146, the landing pads LP and the conductive pad CP and then patterning the fourth conductive layer. In other example embodiments, the bottom electrodes BE may be formed using the same method as that for the landing pads LP and the conductive pad CP described with reference to FIGS. 11A through 20A and FIGS. 11B through 20B. In other words, the fourth conductive layer may be used as the etch-target layer, and in this case, mold layers and mask layers may be deposited on the fourth conductive layer, and then, photolithography processes may be performed to pattern the fourth conductive layer.

Next, a dielectric layer 150 and a top electrode TE may be sequentially formed on the cell region CR to cover the bottom electrodes BE. The dielectric layer 150 and the top electrode TE may be formed using a layer-forming technique (e.g., chemical vapor deposition (CVD) or atomic layer deposition (ALD)) with a good step coverage property or a physical vapor deposition (PVD).

FIGS. 21 and 22A through 24A are plan views illustrating a method of fabricating a semiconductor device according to still further example embodiments of the inventive concepts, and FIGS. 22B through 24B are sectional views taken along line I-I' of FIGS. 22A through 24A, respectively. In the following description of FIGS. 21, 22A-24A and 22B-24B, an element or step previously described with reference to FIGS. 11A-20A and 11B-20B may be identified by a similar or identical reference number without repeating an overlapping description thereof, for the sake of brevity.

Figure 21:
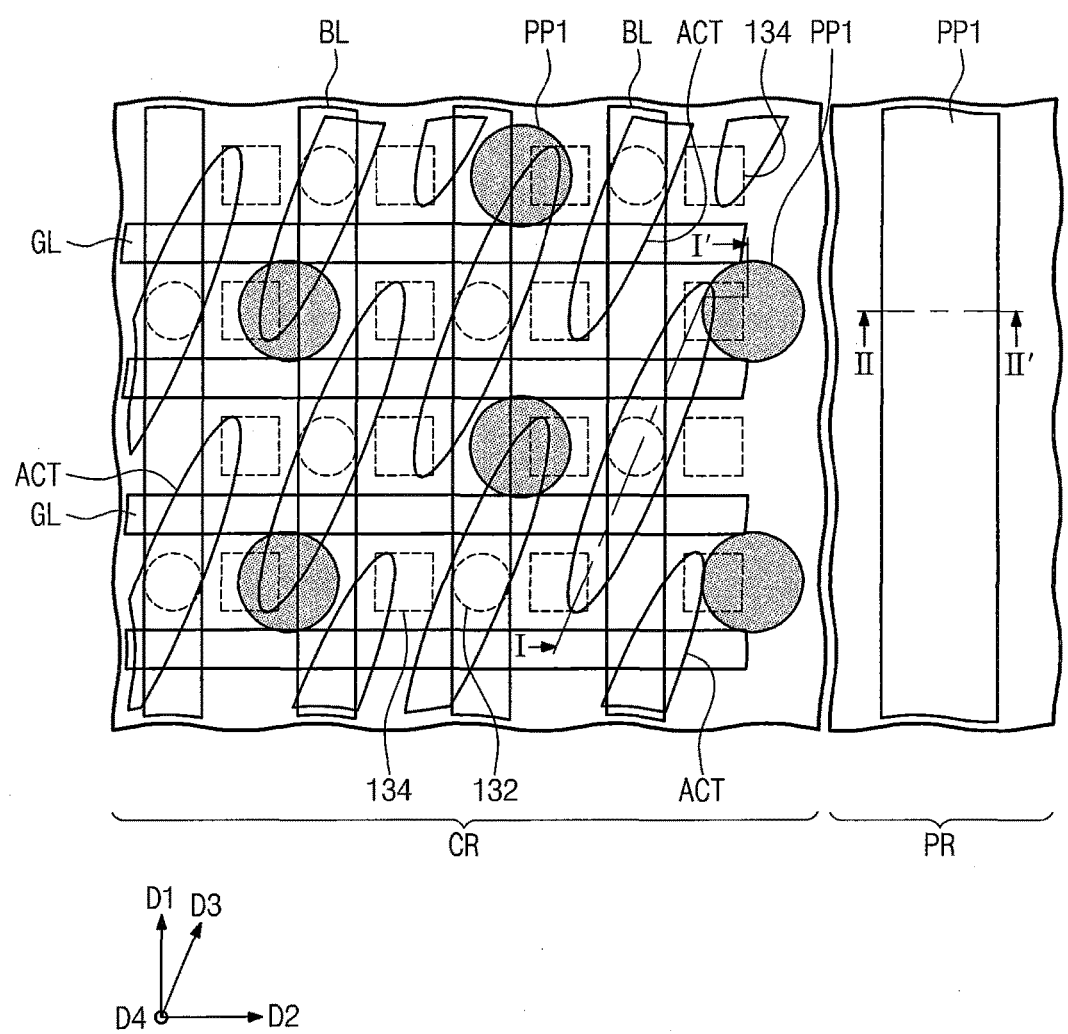

Referring to FIGS. 21 and 11B, a structure similar to that described with reference to FIGS. 11A and 11B is provided. In particular, the first photoresist patterns PP1 may be formed on the resulting structure described with reference to FIGS. 11A and 11B. Here, some of the first photoresist patterns PP1 on the cell region CR may be formed adjacent to the peripheral circuit region PR. For concise description, one of the active regions ACT in FIG. 21 that is adjacent the peripheral circuit region PR will be mainly described below.

Figure 22A:
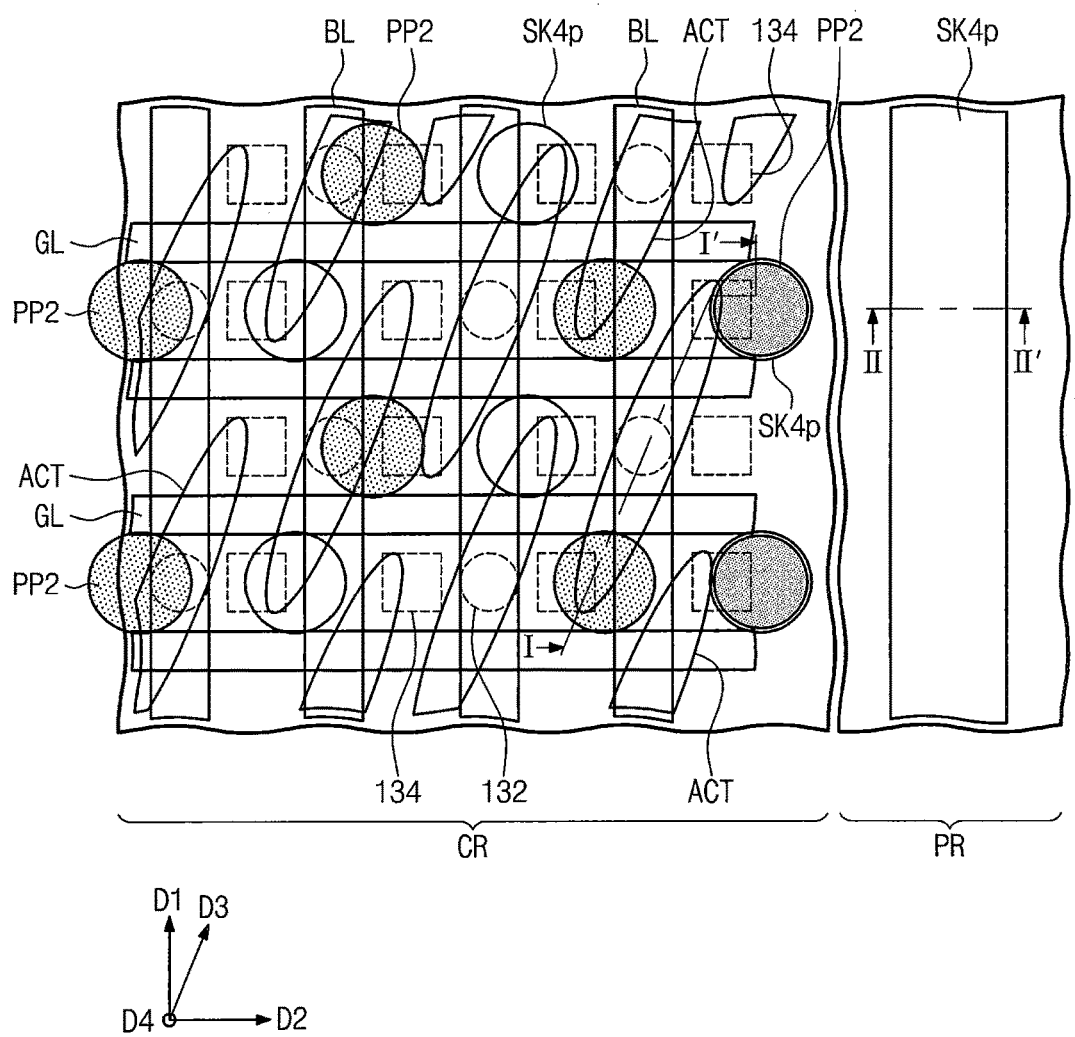
Figure 22B:
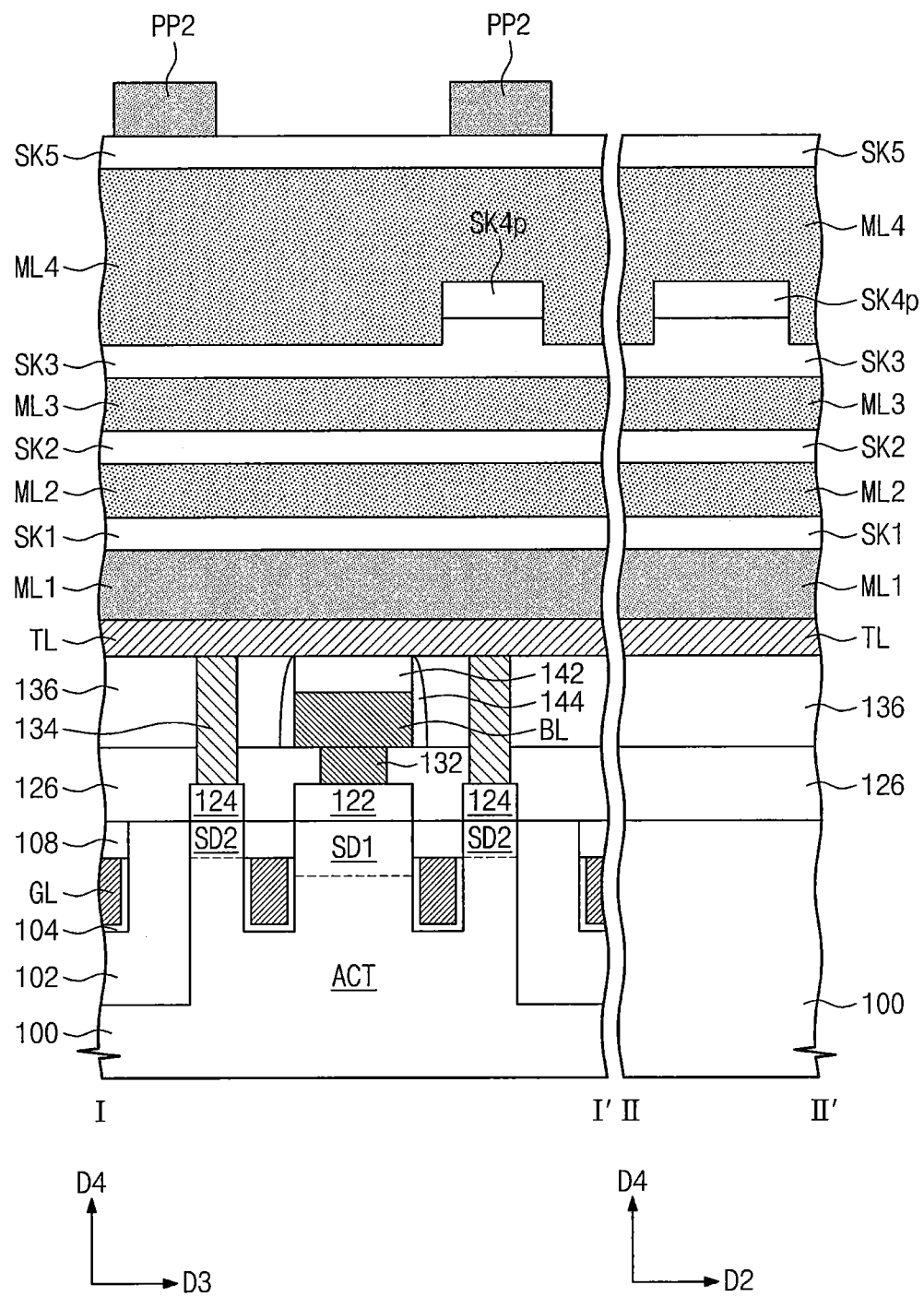

Referring to FIGS. 22A and 22B, the fourth mask layer SK4 may be etched using the first photoresist patterns PP1 as an etch mask to form fourth mask patterns SK4p. An additional mold layer ML4 may be formed to cover the fourth mask patterns SK4p, and a fifth mask layer SK5 may be formed on the additional mold layer ML4. A second photoresist patterns PP2 may be formed on the fifth mask layer SK5.

Here, unlike the previous embodiments described with reference to FIGS. 13A and 13B, one or more second photoresist patterns PP2 may be formed adjacent the peripheral circuit region PR on the fourth mask patterns SK4p. In other words, the second photoresist patterns PP2 adjacent the peripheral circuit region PR may overlap the fourth mask patterns SK4p, when viewed in a plan view. Although not shown, a second photolithography process may be performed to form second photoresist patterns PP2 on the peripheral circuit region PR. In a portion of the cell region CR that is adjacent the peripheral circuit region PR the second photoresist patterns PP2 may overlap the fourth mask patterns SK4p in a plan view, due to the limitation on the minimum pitch in the photolithography process.

Figure 23A:
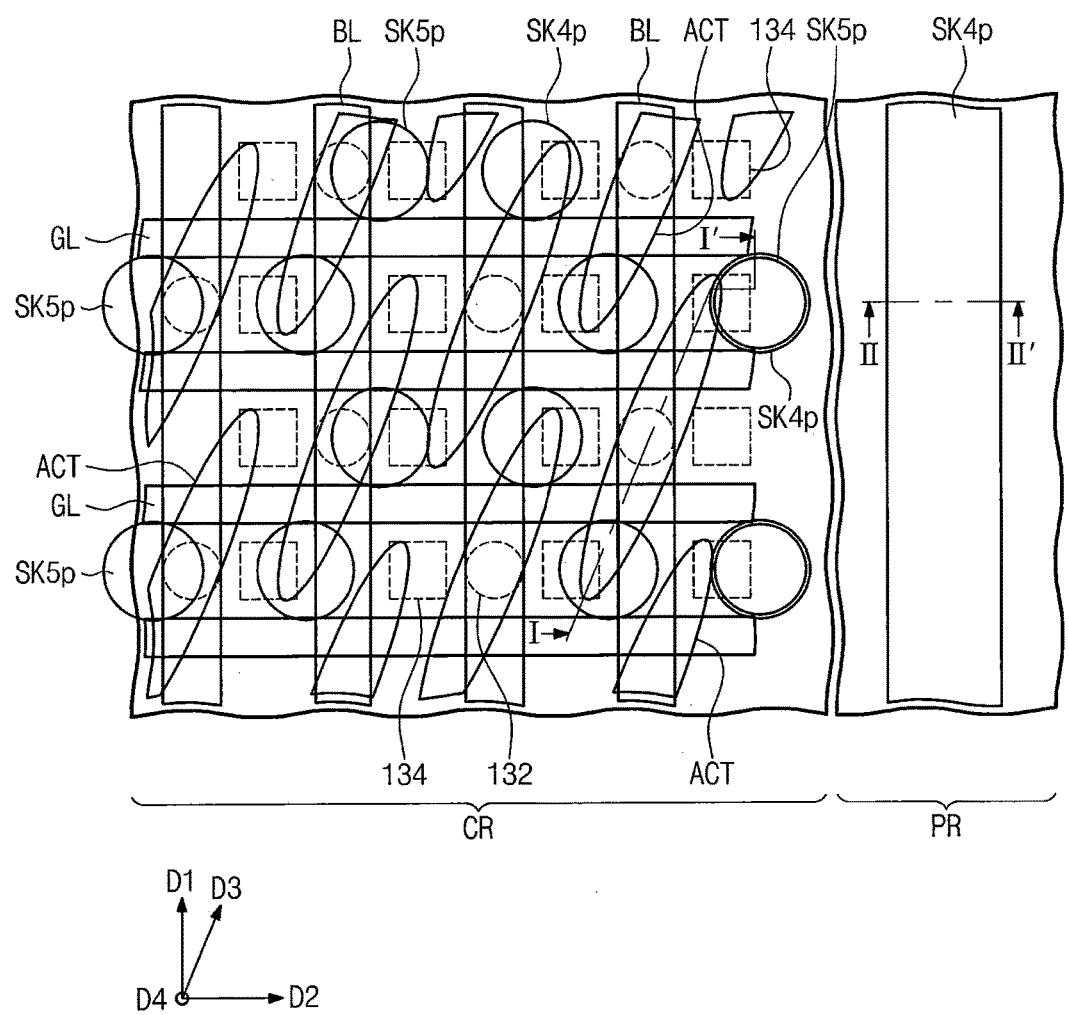
Figure 23B:
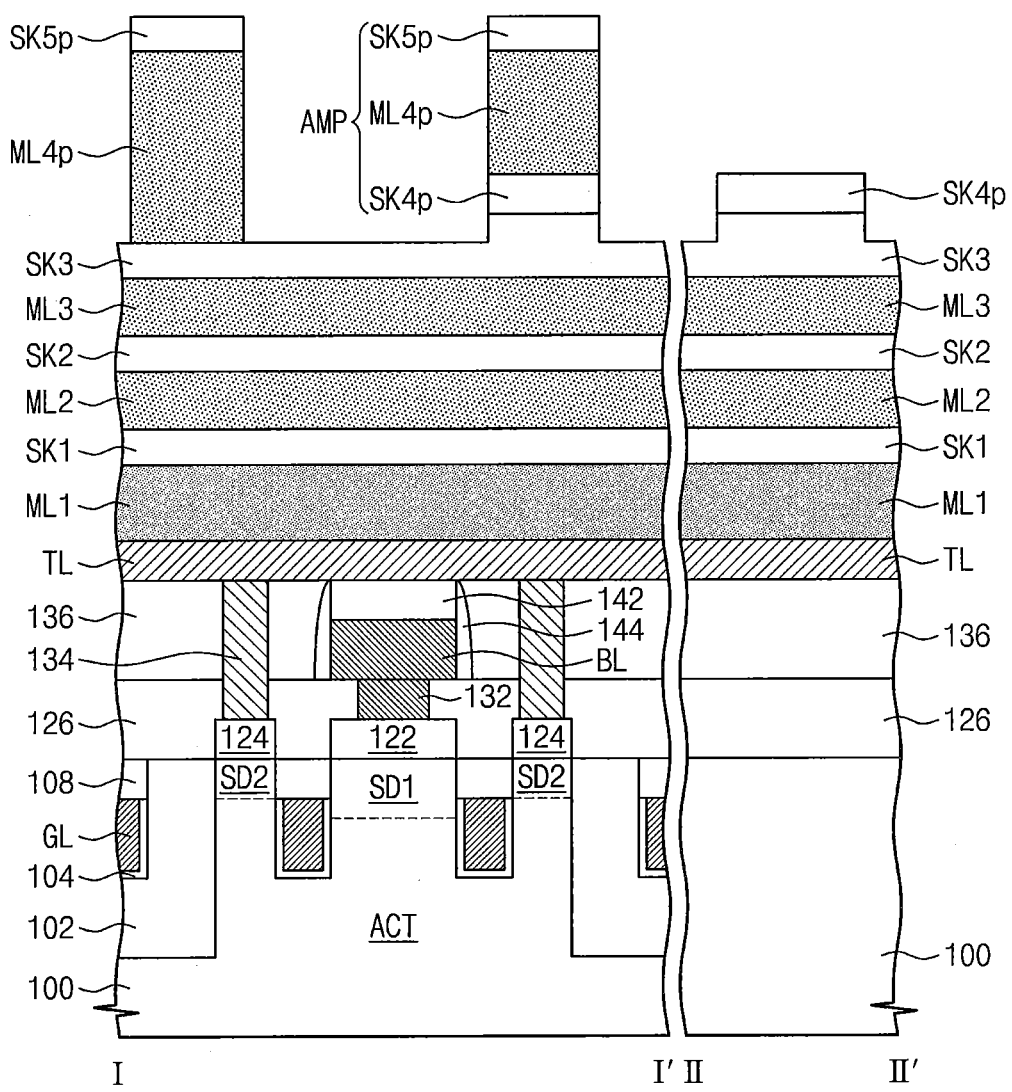

Referring to FIGS. 23A and 23B, the fifth mask layer SK5 may be etched using the second photoresist patterns PP2 as an etch mask to form fifth mask patterns SK5p. Here, additional mold patterns AMP may be formed on the fourth mask patterns SK4p adjacent the peripheral circuit region PR. Each of the additional mold patterns AMP may include a fourth mold pattern ML4p and the fifth mask pattern SK5p that are sequentially stacked on the substrate 100.

Figure 24A:
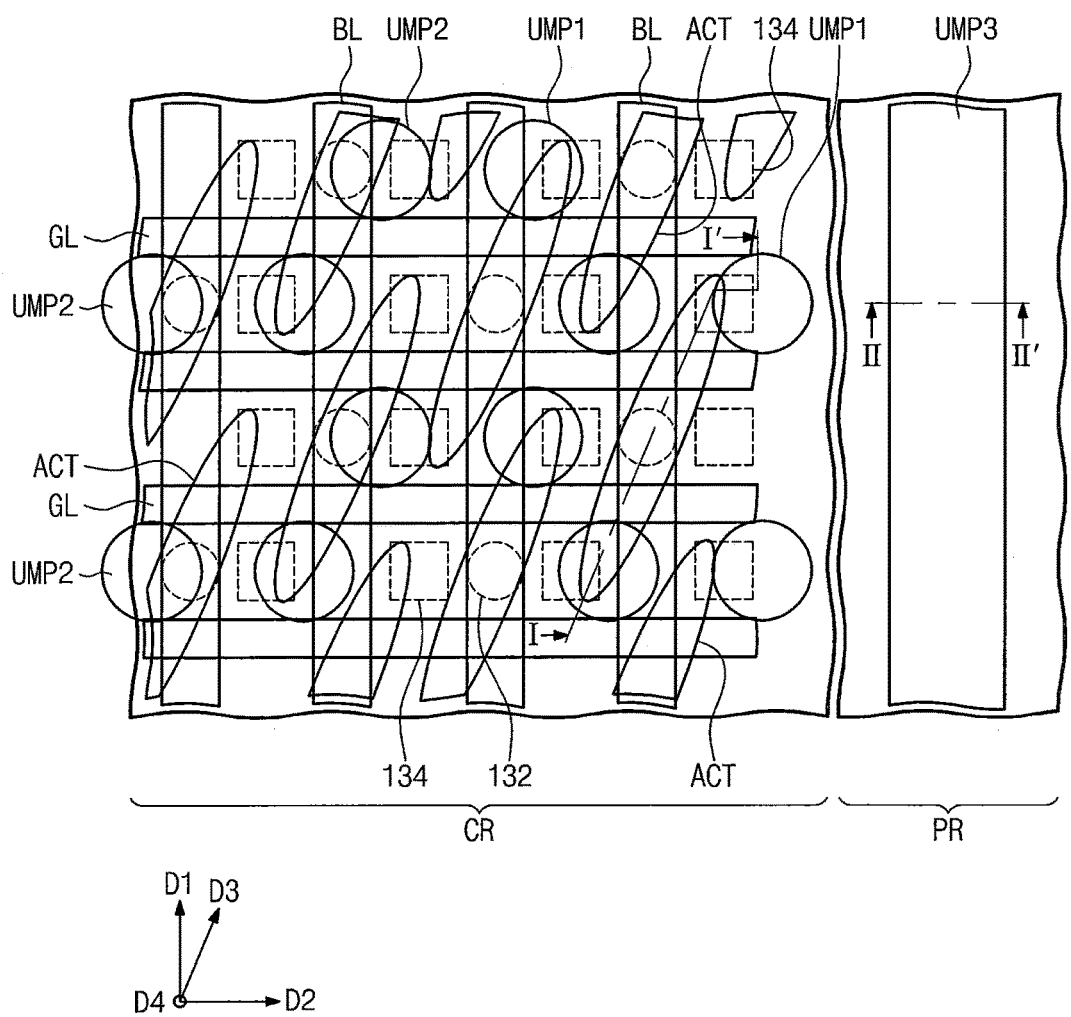
Figure 24B:
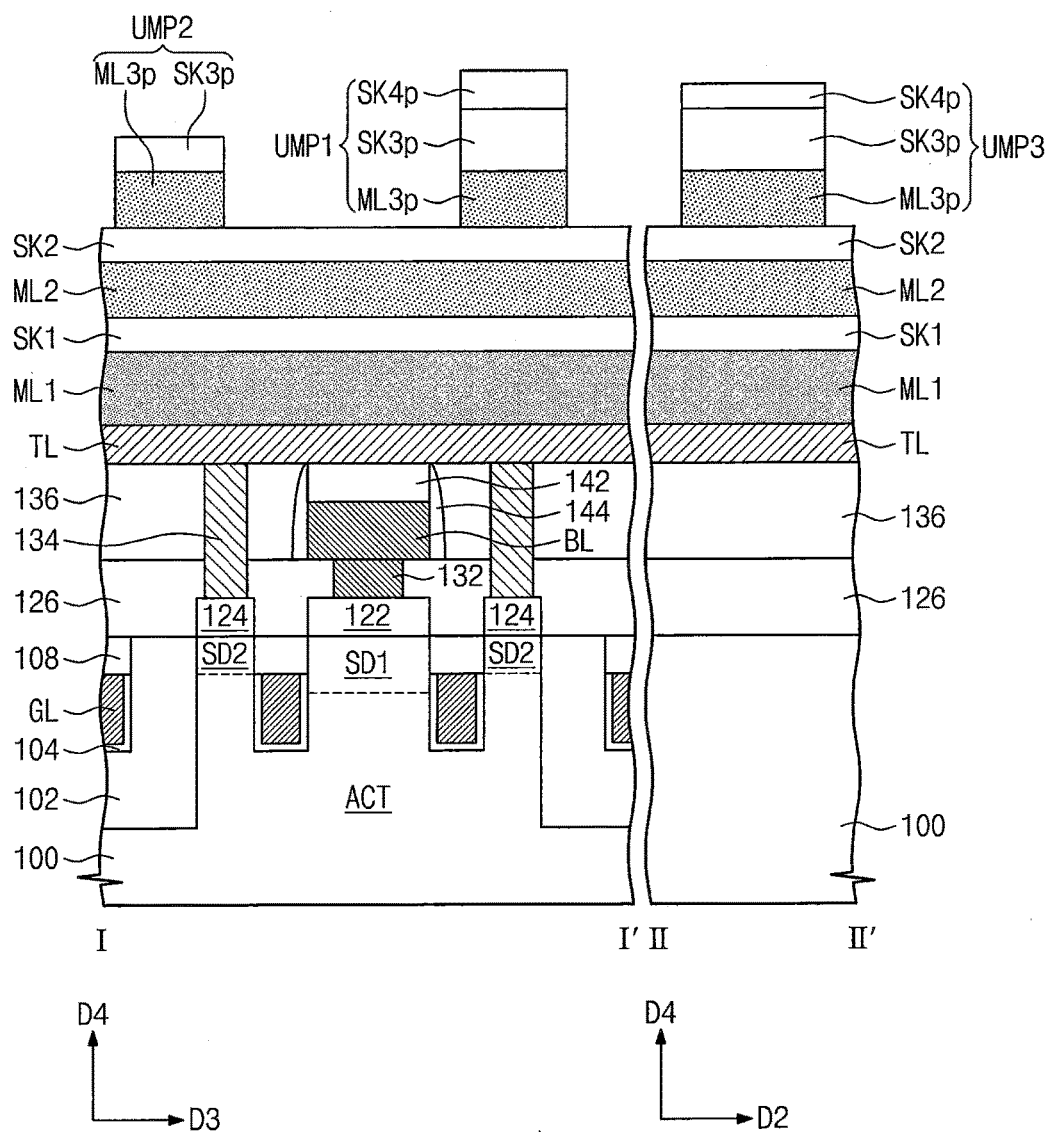

Referring to FIGS. 24A and 24B, the third mask layer SK3 and the upper mold layer ML3 may be sequentially etched using the fifth mask patterns SK5p, the fourth mold patterns ML4p, and the fourth mask patterns SK4p as an etch mask to form first upper mold patterns UMP1, second upper mold patterns UMP2, and a peripheral upper mold pattern UMP3. In certain embodiments, the third mask layer SK3 and the upper mold layer ML3 may be sequentially etched using the additional mold patterns AMP as an etch mask to form the first upper mold patterns UMP1 in the cell region CR adjacent the peripheral circuit region PR.

Unlike the previous embodiments described with reference to FIGS. 15A and 15B, the first upper mold patterns UMP1 that are adjacent the peripheral circuit region PR may have top surfaces positioned at a higher level than that of the peripheral upper mold pattern UMP3. This is because the additional mold patterns AMP on the fourth mask patterns SK4p may prevent the fourth mask patterns SK4p from being etched. Further, the first upper mold patterns UMP1 that are adjacent the peripheral circuit region PR may have top surfaces positioned at a higher level than top surfaces of others of the first upper mold patterns UMP1 and top surfaces of the second upper mold patterns UMP2.

The subsequent processes described with reference to FIGS. 16A through 20A and 16B through 20B may then be performed to complete fabrication of the device.

In certain embodiments, since both of the first and second photolithography processes may be applied to form the first upper mold patterns UMP1 adjacent the peripheral circuit region PR, the first upper mold patterns UMP1 adjacent the peripheral circuit region PR may have an increased top surface areas. Nevertheless, the first, second, and peripheral middle mold patterns MMP1, MMP2, and MMP3 may be formed to have the top surfaces positioned at substantially the same level, by virtue of the presence of the second mask layer SK2 and the middle mold layer ML2 that are additionally provided below the first, second, and peripheral mold patterns UMP1, UMP2, and UMP3.

Figure 25:
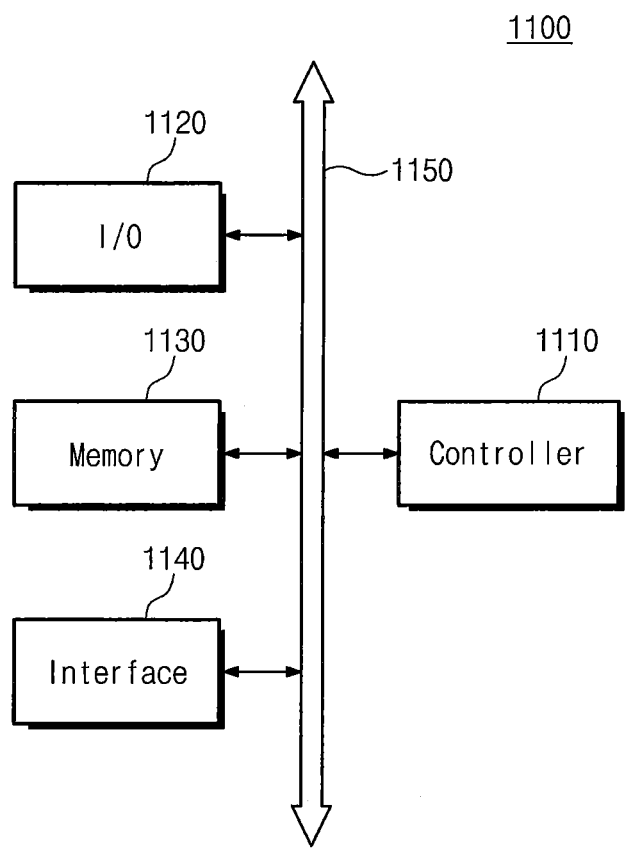
FIG. 25 is a schematic block diagram illustrating an example electronic systems including a semiconductor device according to example embodiments of the inventive concepts.

FIG. 25 is a schematic block diagram illustrating an example electronic system including a semiconductor device according to example embodiments of the inventive concepts.

Referring to FIG. 25, an electronic system 1100 according to example embodiments of the inventive concepts may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices. The I/O unit 1120 may include, e.g., a keypad, a keyboard, and/or a display unit. The memory device 1130 may store data and/or commands. The memory device 1130 may include at least one of the semiconductor devices according to the embodiments described above. Further, the memory device 1130 may further include other types of semiconductor devices, which are different from the semiconductor devices described above. The interface unit 1140 may transmit data to a communication network or may receive data from a communication network.

The electronic system 1100 may be applied to, e.g., a personal digital assistant (PDA), a portable computer, a web tablet, a wireless phone, a mobile phone, a digital music player, a memory card, or other electronic products.

Figure 26:
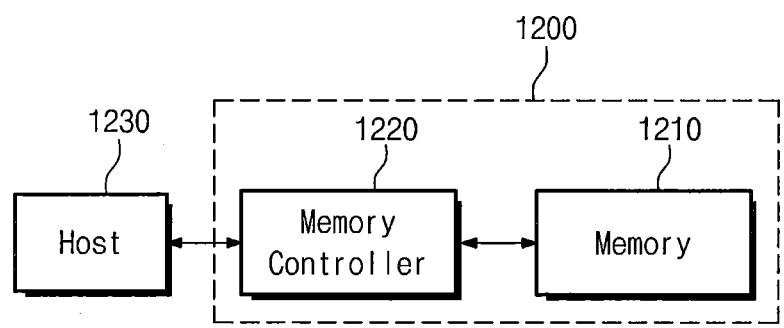
FIG. 26 is a block diagram illustrating an example of a memory card including a semiconductor device according to example embodiments of the inventive concepts.

FIG. 26 is a block diagram illustrating an example of a memory card including a semiconductor device according to example embodiments of the inventive concepts.

Referring to FIG. 26, a memory card 1200 according to example embodiments of the inventive concepts may include a memory device 1210. The memory device 1210 may include at least one of the semiconductor devices according to the embodiments mentioned above. In other embodiments, the memory device 1210 may further include other types of semiconductor devices, which are different from the semiconductor devices according to the embodiments described above. The memory card 1200 may include a memory controller 1220 that controls data communication between a host 1230 and the memory device 1210.

According to example embodiments of the inventive concepts, mold patterns formed by an additional photolithography process may be used to form conductive patterns of a semiconductor device, and this may make it possible to overcome a limitation on the minimum pattern pitch in the photolithography process. Even though the additional photolithography process is used, mold patterns can be formed to have top surfaces that are coplanar with each other. Accordingly, it is possible to form the additional mold patterns in a self-aligned manner and moreover to improve uniformity in size of the conductive patterns.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
sequentially forming an etch-target layer and a middle mold layer on a substrate;
forming a first upper mold pattern on the middle mold layer that has a top surface that is a first height above a bottom surface of the substrate;
forming a second upper mold pattern on the middle mold layer that has a top surface at a second height above the bottom surface of the substrate that is different from the first height;

etching the middle mold layer using the first and second upper mold patterns as an etch mask to form respective first and second middle mold patterns;

forming a third middle mold pattern between the first and second middle mold patterns; and etching the etch-target layer using the first to third middle mold patterns as an etch mask to form conductive patterns.

2. The method of claim 1, wherein the first and second middle mold patterns have respective top surfaces that are at substantially the same height above the bottom surface of the substrate.

3. The method of claim 1, wherein forming the first upper mold pattern and the second upper mold pattern comprises:

forming an upper mold layer on the middle mold layer;

forming a first photoresist pattern on the upper mold layer;

etching the upper mold layer using the first photoresist pattern as an etch mask to form the first upper mold pattern;

forming an additional mold layer to cover the first upper mold pattern;

forming a second photoresist pattern on the additional mold layer; and etching the additional mold layer using the second photoresist pattern as an etch mask to form the second upper mold pattern.

4. The method of claim 3, wherein:

the first photoresist pattern comprises a plurality of first photoresist patterns, the first upper mold pattern comprises a plurality of first upper mold patterns, the second photoresist pattern comprises a plurality of second photoresist patterns, the second upper mold pattern comprises a plurality of second upper mold patterns, and when viewed in plan view, the plurality of first upper mold patterns are spaced apart from the plurality of second upper mold patterns.

5. The method of claim 1, wherein the first upper mold pattern comprises a plurality of first upper mold patterns, wherein the second upper mold pattern comprises a plurality of second upper mold patterns, wherein the first and second upper mold patterns are arranged in a first direction in first, second, and third rows so that the first and second upper mold patterns are alternatingly arranged in each of the first to third rows, wherein the first to third rows of the first and second upper mold patterns are spaced apart from each other in a second direction that crosses the first direction, and wherein the first upper mold patterns in the first and third rows define first columns that extend in the first direction and the second upper mold patterns in the first and third rows define second columns that extend in the first direction, and the first and second upper mold patterns in the second row are positioned between the first columns and the second columns.

6. The method of claim 1, wherein the first middle mold patterns comprises a plurality of first middle mold patterns and the second middle mold patterns comprises a plurality of second middle mold patterns, and when viewed in plan view, the first and second middle mold patterns are arranged to form a polygonal honeycomb structure, and wherein the third middle mold pattern is positioned at a center of the polygonal honeycomb structure, when viewed in plan view.

7. The method of claim 1, wherein forming the third middle mold pattern comprises:

conformally forming a spacer layer on the first and second middle mold patterns that defines a recess region between the first and second middle mold patterns; and forming the third middle mold pattern in the recess region.

8. The method of claim 1, before forming the etch-target layer, further comprising:

forming a device isolation layer on the substrate to define an active region;

forming a gate line on the substrate that crosses the active region; and forming a first doped region and a second doped region in the active region on opposite sides of the gate line.

9. The method of claim 1, before forming the etch-target layer, further comprising:

forming a device isolation layer on the substrate to define an active region;

forming a pair of the gate lines that cross the active region;

forming a first doped region in the active region between the pair of gate lines; and forming a pair of second doped regions in the active region on opposite sides of the pair of gate lines, wherein the first and second upper mold patterns overlap respective ones of the second doped regions when viewed in a plan view.

10. The method of claim 8, wherein the second doped region comprises a pair of second doped regions, the method further comprising, before forming the etch-target layer:

forming an interlayer insulating layer on the active region; and forming first and second buried contacts that are electrically connected to respective ones of the pair of second doped regions through the interlayer insulating layer;

wherein the conductive patterns comprise first and second conductive patterns that are in contact with the first and second buried contacts, respectively.

11. The method of claim 8, before forming the etch-target layer, further comprising:

forming an interlayer insulating layer on the active region; and forming a buried contact that is electrically connected to the second doped region through the interlayer insulating layer, and after forming the conductive patterns, further comprising:

forming a dielectric layer on the conductive patterns; and forming a top electrode on the dielectric layer, wherein at least one of the conductive patterns is electrically connected to the buried contact.

12. A method of fabricating a semiconductor device, comprising:

forming a middle mold layer on a substrate;

forming a plurality of first upper mold patterns on the middle mold layer, the first upper mold patterns each having a top surface that is a first height above a bottom surface of the substrate, and the first upper mold patterns extending in a zigzag pattern in a first direction that is parallel to the bottom surface of the substrate;

forming a plurality of second upper mold patterns on the middle mold layer, the second upper mold patterns each having a top surface that is a second height above the bottom surface of the substrate, the second height being different from the first height, and the second upper mold patterns extending in a zigzag pattern in the first direction; and etching the middle mold layer using the first and second upper mold patterns as an etch mask to form respective first and second middle mold patterns.

13. The method of claim 12, further comprising
forming a third middle mold pattern between the first and second middle mold patterns; and
etching an etch-target layer using the first to third middle mold patterns as an etch mask to form conductive patterns.

14. The method of claim 13, wherein the three of the first upper mold patterns and three of the second upper mold patterns together form a polygonal honeycomb structure when viewed in plan view.

15. The method of claim 14, wherein the third middle mold pattern is positioned at a center of the polygonal honeycomb structure, when viewed in plan view.

16. The method of claim 13, wherein the first and second middle mold patterns have top surfaces positioned at substantially the same height above the bottom surface of the substrate.

17. The method of claim 16, wherein forming the plurality of first upper mold patterns and the plurality of second upper mold patterns comprises:

forming an upper mold layer on the middle mold layer;

forming a plurality of first photoresist patterns on the upper mold layer;

etching the upper mold layer using the first photoresist patterns as an etch mask to form the first upper mold patterns;

forming an additional mold layer to cover the first upper mold patterns;

forming a plurality of second photoresist patterns on the additional mold layer; and etching the additional mold layer using the second photoresist patterns as an etch mask to form the second upper mold patterns.

* * * * *